(12) United States Patent
Chen et al.

(10) Patent No.: US 12,272,600 B2
(45) Date of Patent: Apr. 8, 2025

(54) CONTACT FEATURES OF SEMICONDUCTOR DEVICE AND METHOD OF FORMING SAME

(71) Applicant: Taiwan Semiconductor Manufacturing Co., Ltd., Hsinchu (TW)

(72) Inventors: Pin-Wen Chen, Keelung (TW); Chang-Ting Chung, Taipei (TW); Yi-Hsiang Chao, New Taipei (TW); Yu-Ting Wen, Taichung (TW); Kai-Chieh Yang, New Taipei (TW); Yu-Chen Ko, Chiayi (TW); Peng-Hao Hsu, Hsinchu (TW); Ya-Yi Cheng, Taichung (TW); Min-Hsiu Hung, Hsinchu (TW); Chun-Hsien Huang, Tainan (TW); Wei-Jung Lin, Hsinchu (TW); Chih-Wei Chang, Hsinchu (TW); Ming-Hsing Tsai, Chu-Pei (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 249 days.

(21) Appl. No.: 17/663,302

(22) Filed: May 13, 2022

(65) Prior Publication Data
US 2023/0223302 A1 Jul. 13, 2023

Related U.S. Application Data

(60) Provisional application No. 63/298,699, filed on Jan. 12, 2022.

(51) Int. Cl.
H01L 21/768 (2006.01)
H01L 21/02 (2006.01)
H01L 23/535 (2006.01)

(52) U.S. Cl.
CPC .. *H01L 21/76895* (2013.01); *H01L 21/02063* (2013.01); *H01L 21/76805* (2013.01);
(Continued)

(58) Field of Classification Search
CPC ......... H01L 21/76895; H01L 21/02063; H01L 21/76805; H01L 21/76814;
(Continued)

(56) References Cited

U.S. PATENT DOCUMENTS 9,105,490 B2   8/2015   Wang et al.
9,236,267 B2   1/2016   De et al.
(Continued)

FOREIGN PATENT DOCUMENTS

TW   202201491 A   1/2022

*Primary Examiner* — Thanhha S Pham
(74) *Attorney, Agent, or Firm* — Slater Matsil, LLP

(57) ABSTRACT

A method includes forming a dielectric layer over an epitaxial source/drain region. An opening is formed in the dielectric layer. The opening exposes a portion of the epitaxial source/drain region. A barrier layer is formed on a sidewall and a bottom of the opening. An oxidation process is performing on the sidewall and the bottom of the opening. The oxidation process transforms a portion of the barrier layer into an oxidized barrier layer and transforms a portion of the dielectric layer adjacent to the oxidized barrier layer into a liner layer. The oxidized barrier layer is removed. The opening is filled with a conductive material in a bottom-up manner. The conductive material is in physical contact with the liner layer.

20 Claims, 67 Drawing Sheets

(52) U.S. Cl.
CPC .. *H01L 21/76814* (2013.01); *H01L 21/76843* (2013.01); *H01L 21/76865* (2013.01); *H01L 21/76868* (2013.01); *H01L 21/76889* (2013.01); *H01L 23/535* (2013.01)

(58) Field of Classification Search
CPC ......... H01L 21/76843; H01L 21/76865; H01L 21/76868; H01L 21/76889; H01L 23/535; H01L 21/76804; H01L 21/76829; H01L 29/66795; H01L 23/482; H01L 29/78
See application file for complete search history.

(56) References Cited

U.S. PATENT DOCUMENTS

| | | |
|---|---|---|
| 9,236,300 B2 | 1/2016 | Liaw |
| 9,406,804 B2 | 8/2016 | huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,647,071 B2 | 5/2017 | Peng et al. |
| 9,831,183 B2 | 11/2017 | Lin et al. |
| 9,859,386 B2 | 1/2018 | Ho et al. |
| 2005/0051900 A1 | 3/2005 | Liu et al. |
| 2012/0032333 A1* | 2/2012 | Harada ............. H01L 21/76826 438/618 |
| 2017/0053868 A1* | 2/2017 | Lin ................... H01L 21/76814 |
| 2019/0273042 A1 | 9/2019 | Cheng et al. |
| 2020/0126854 A1 | 4/2020 | Motoyama et al. |
| 2021/0391255 A1 | 12/2021 | Chen et al. |

* cited by examiner

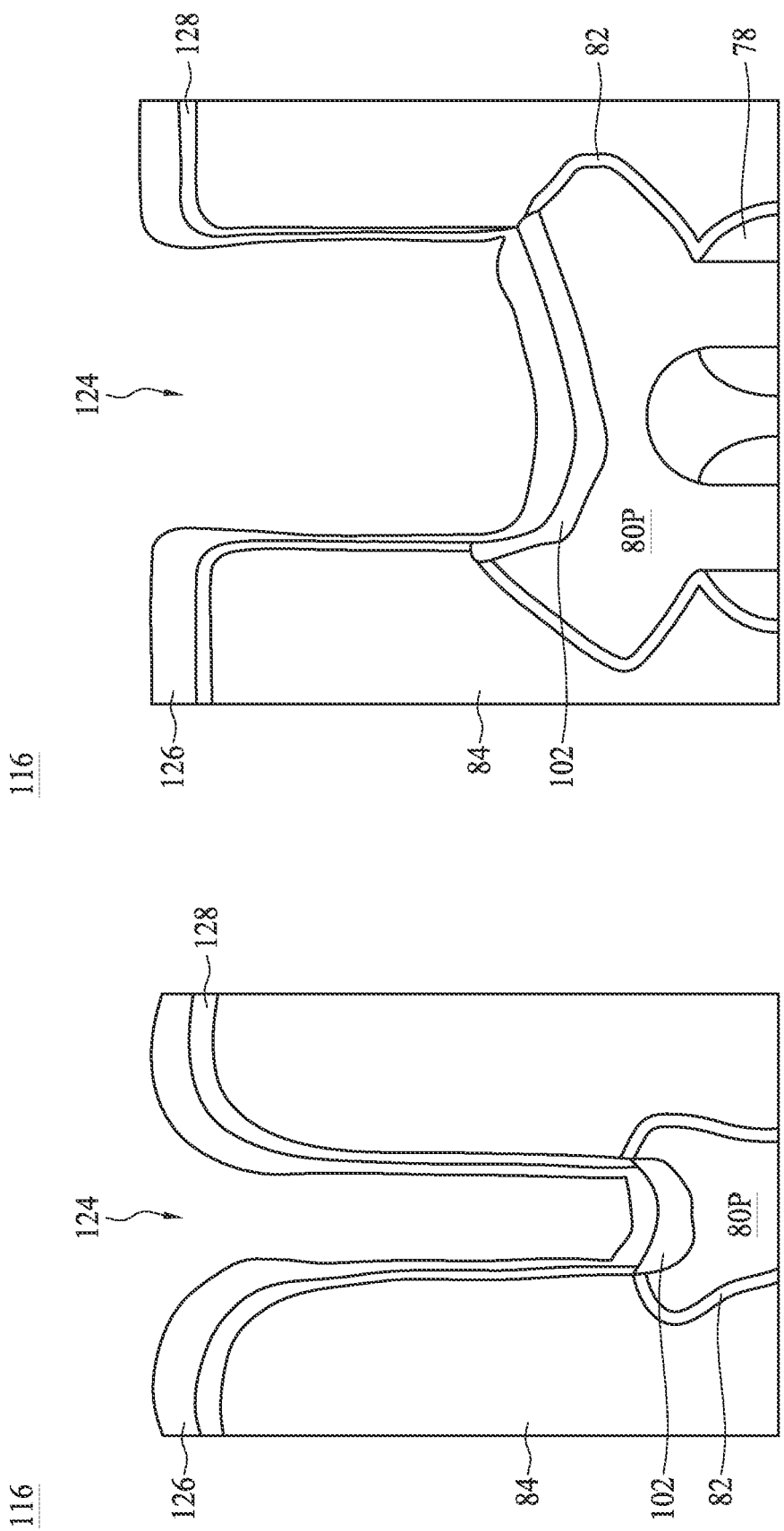

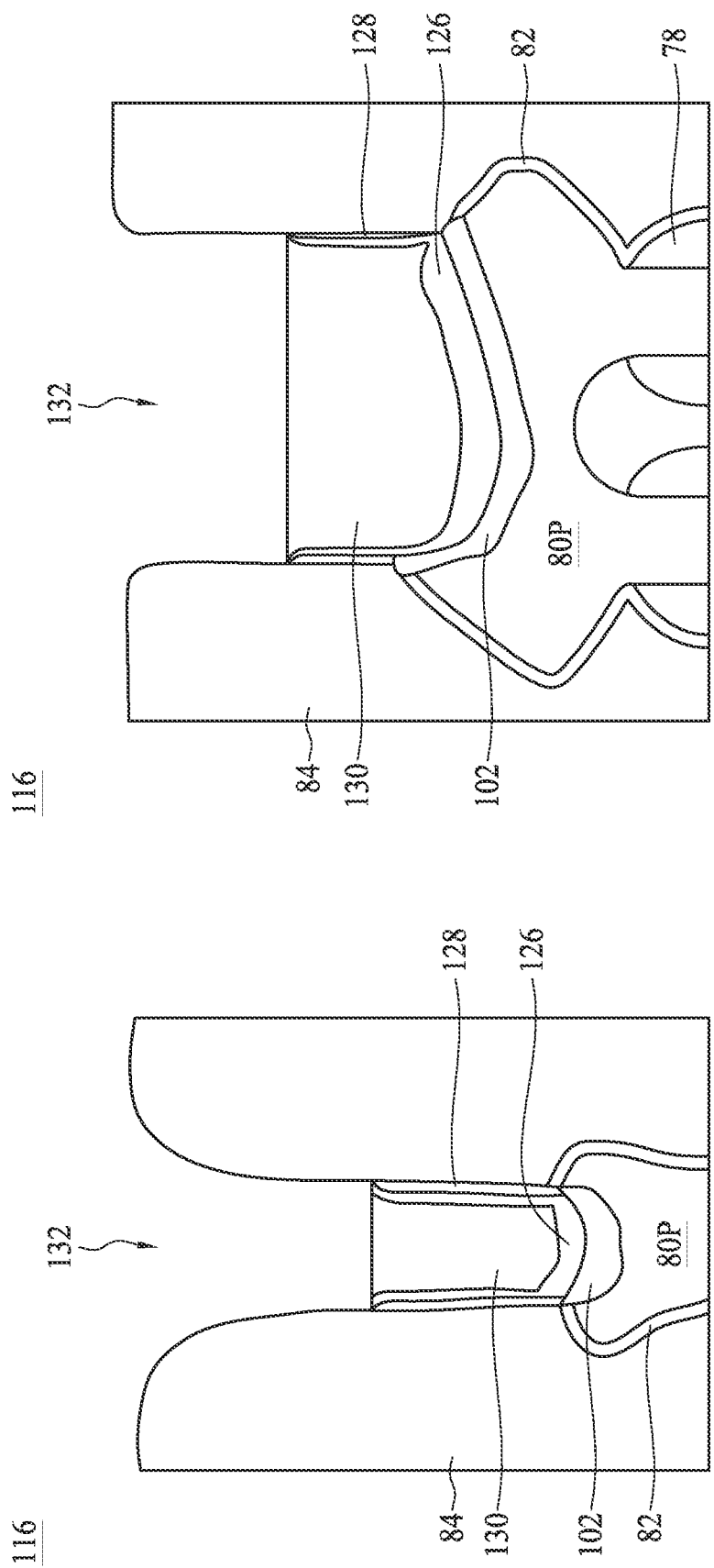

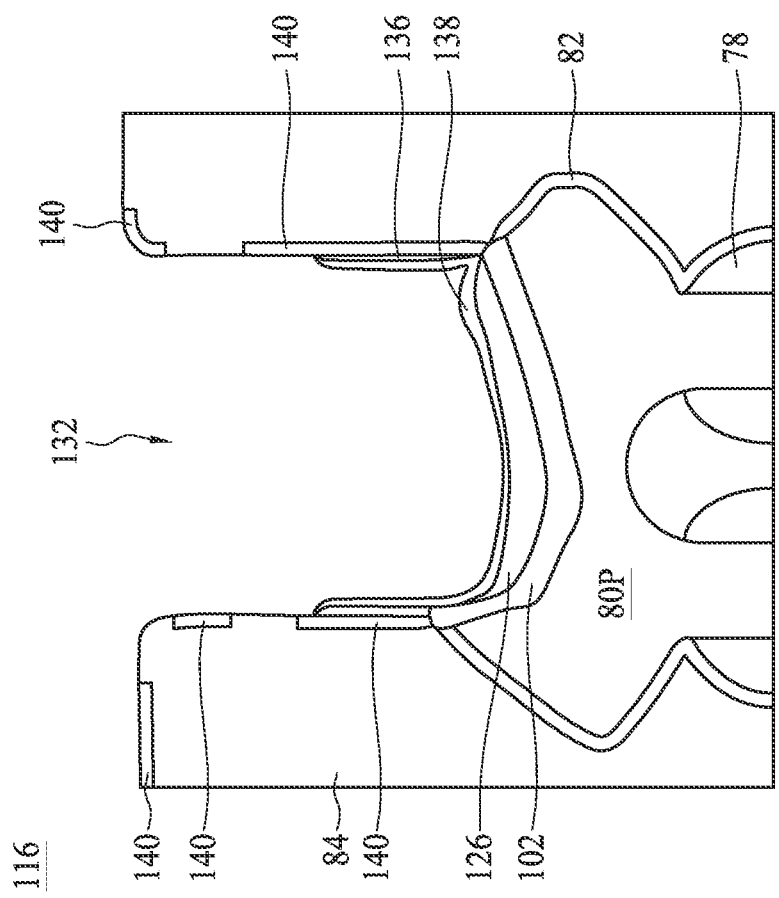
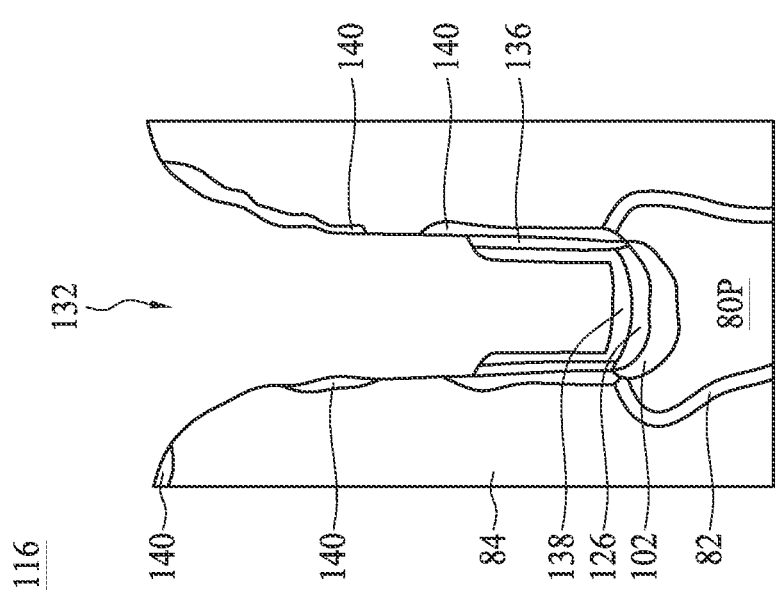
Figure 27B
Figure 27A

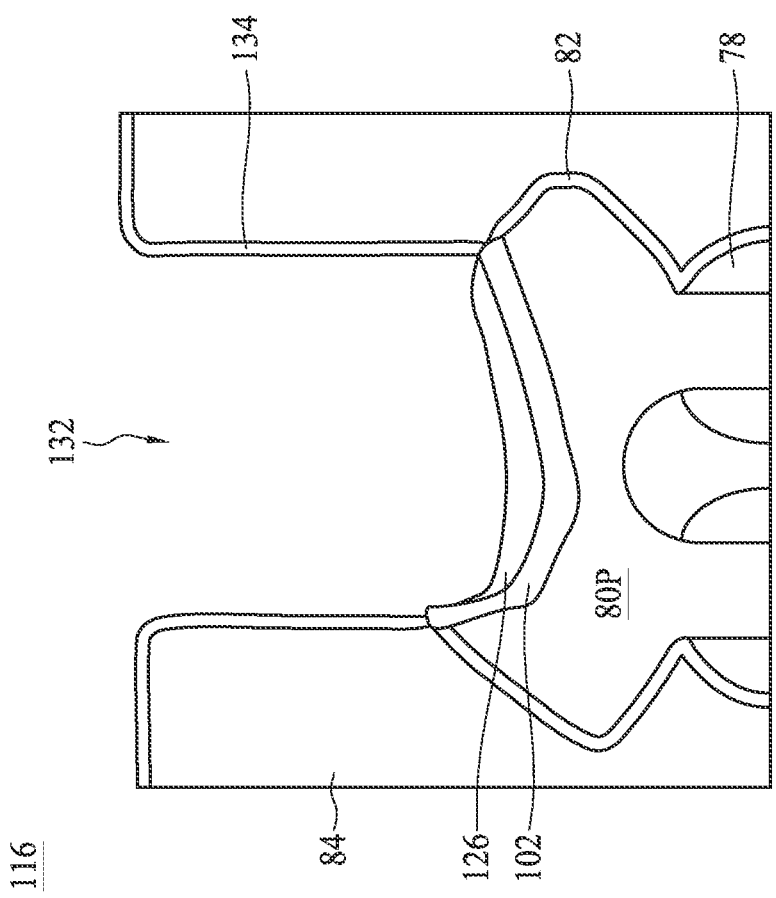
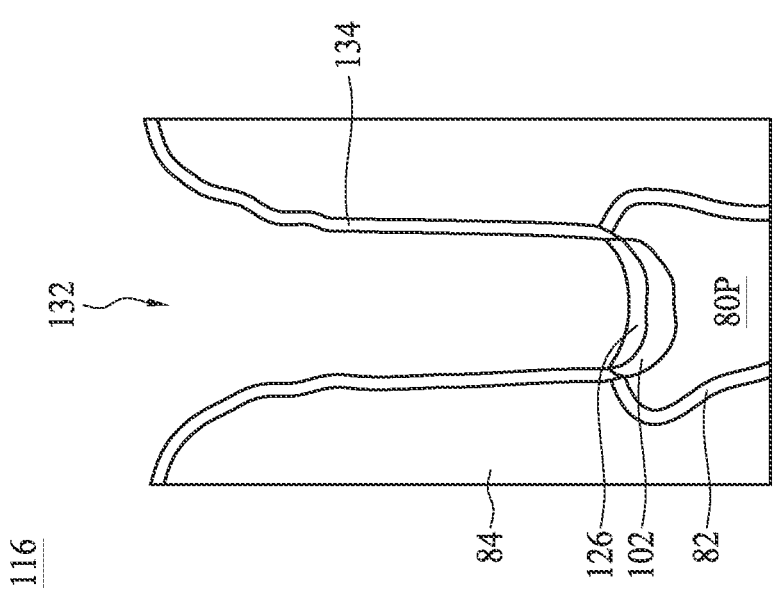

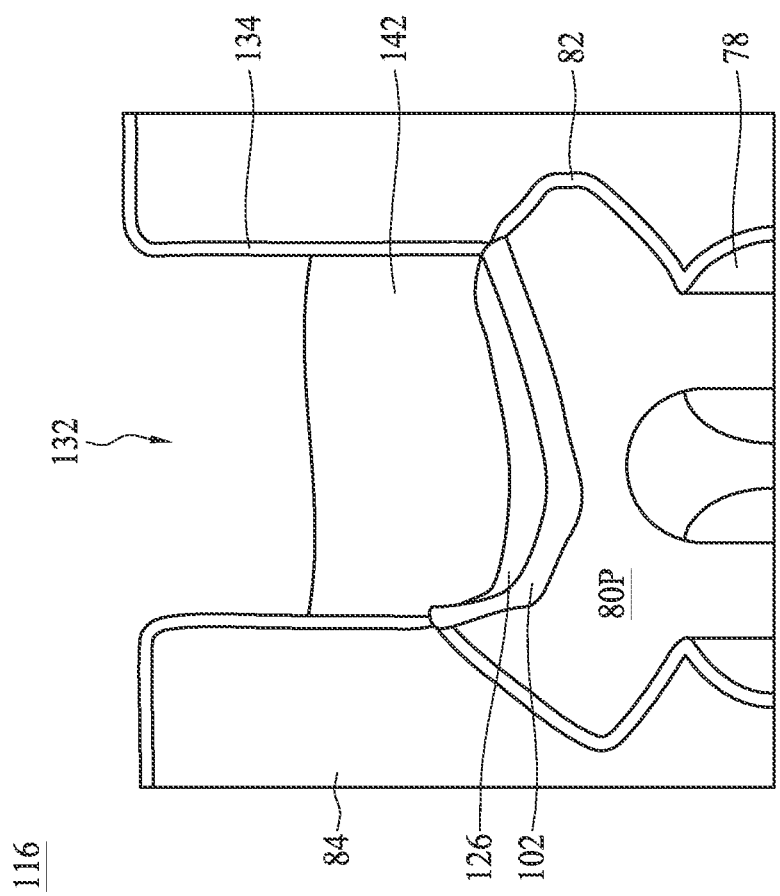
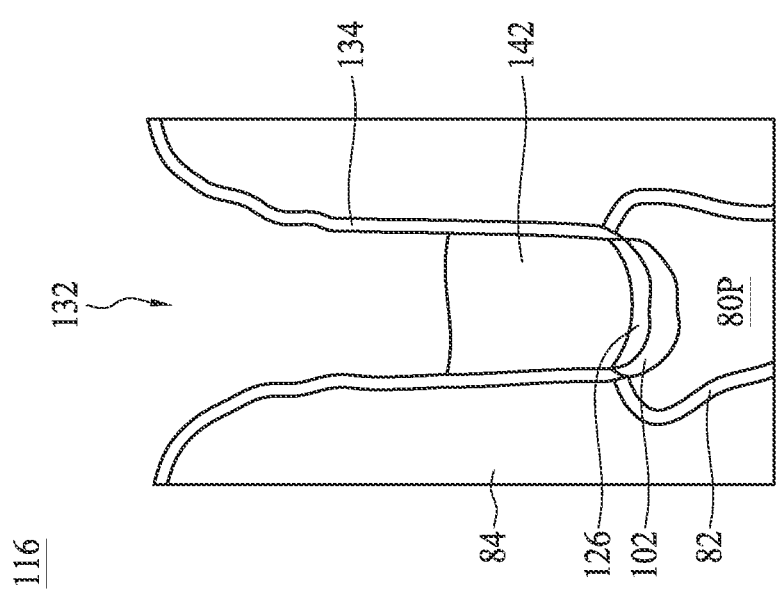

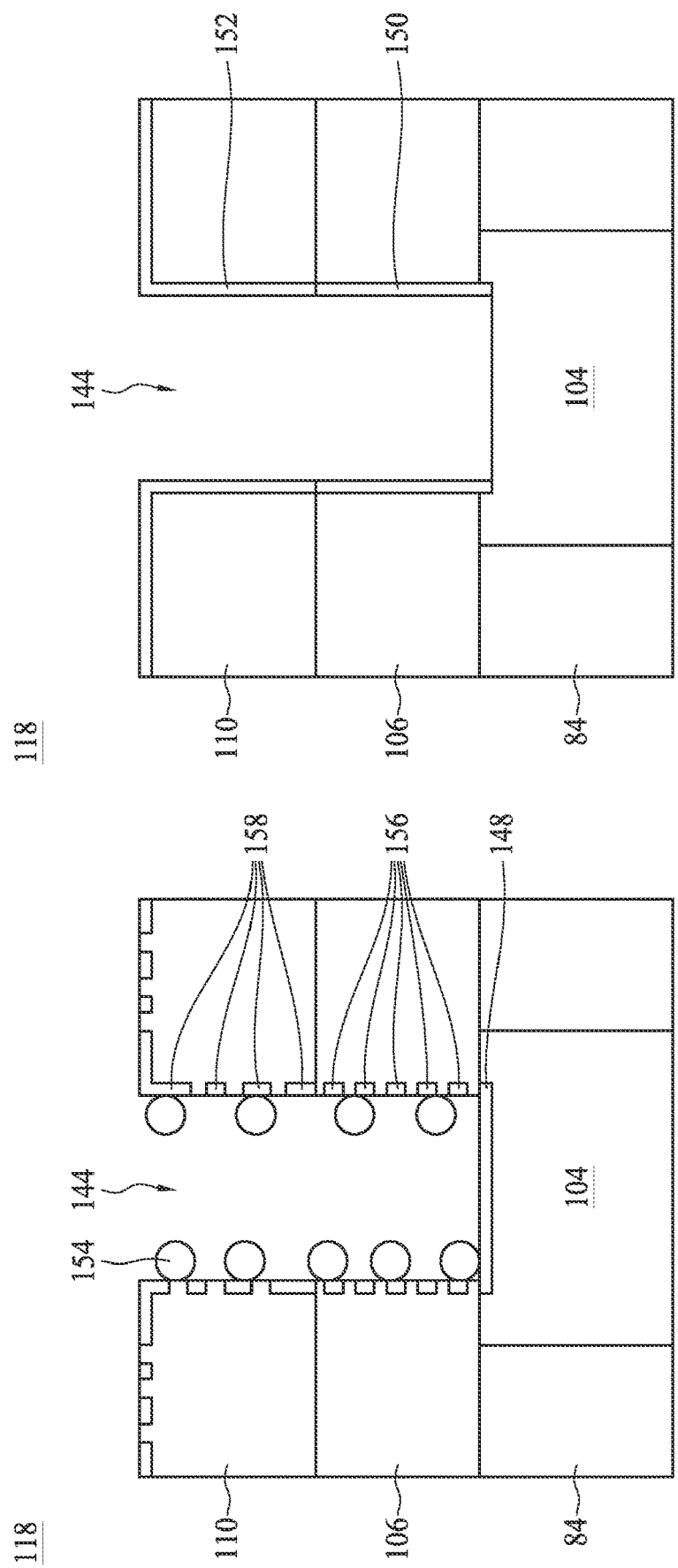

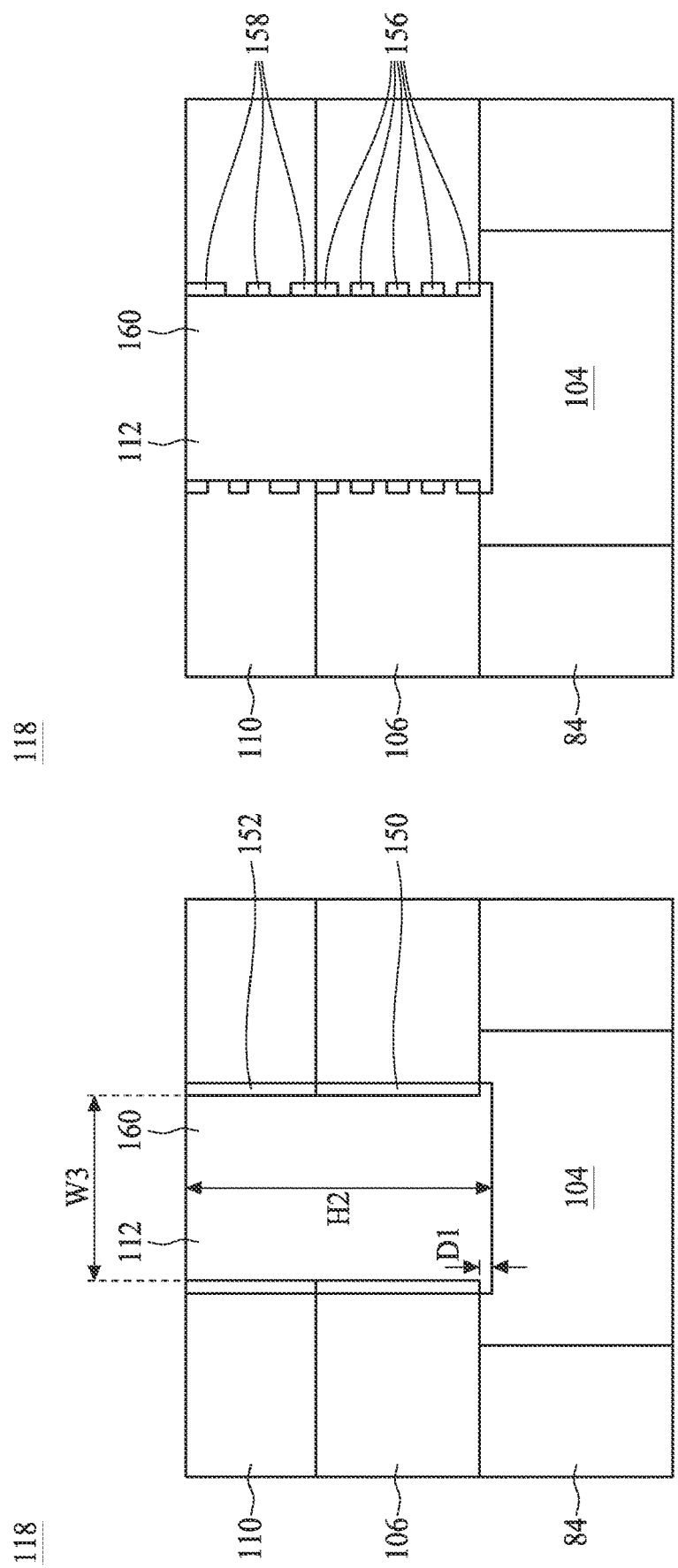

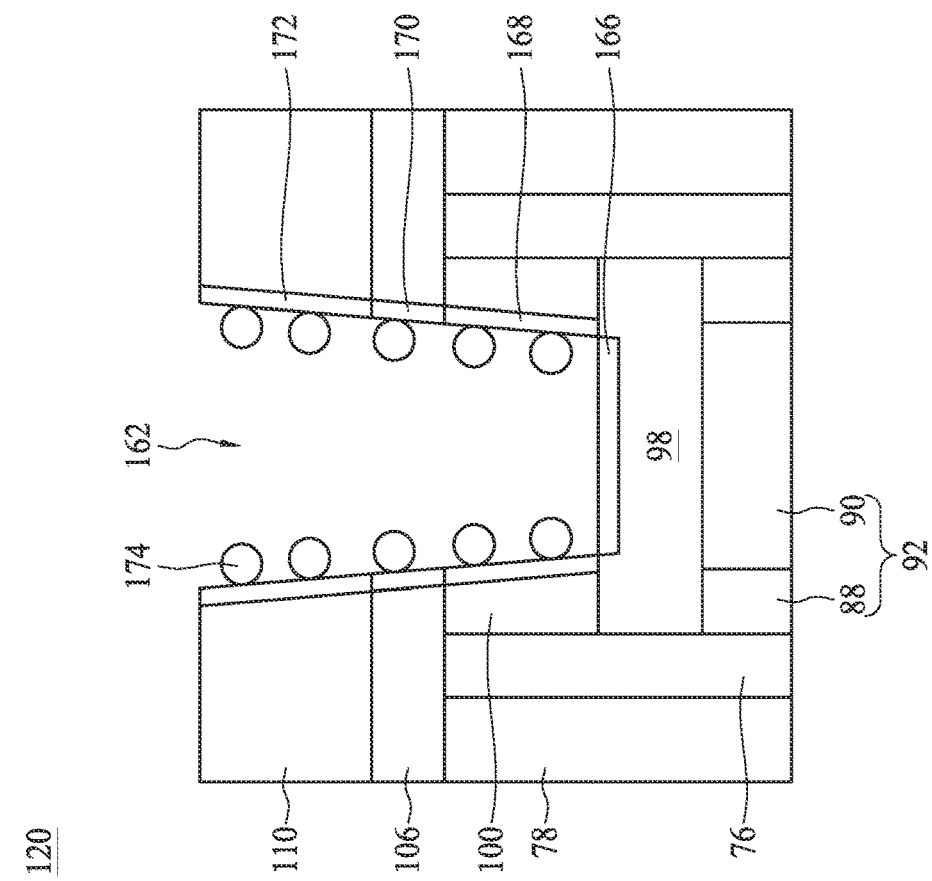
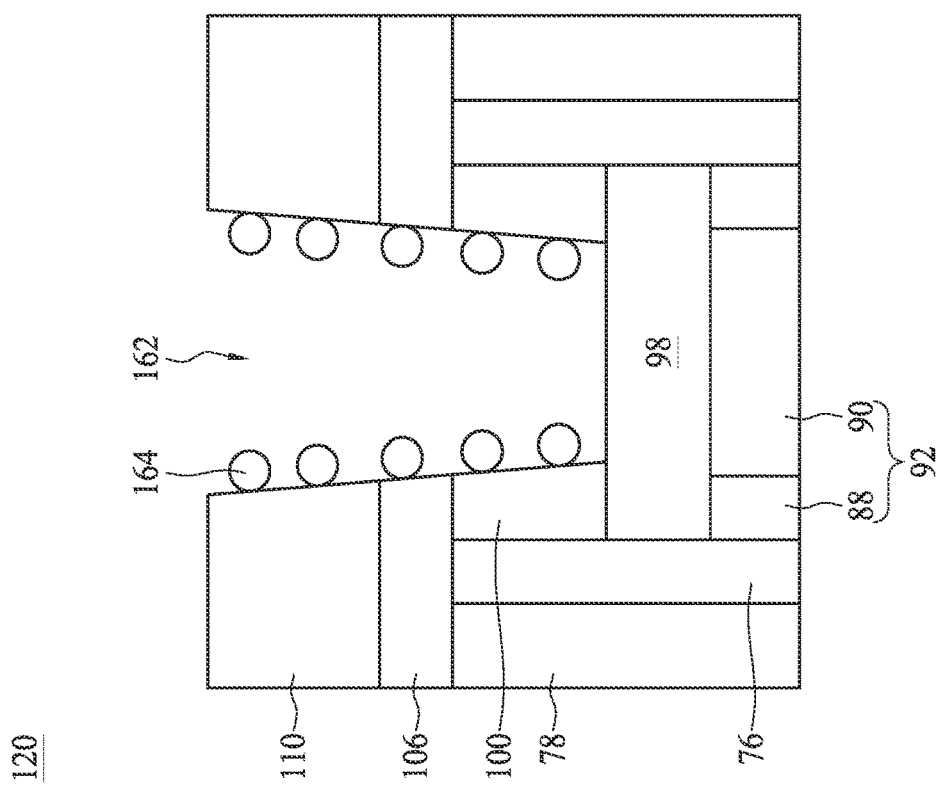

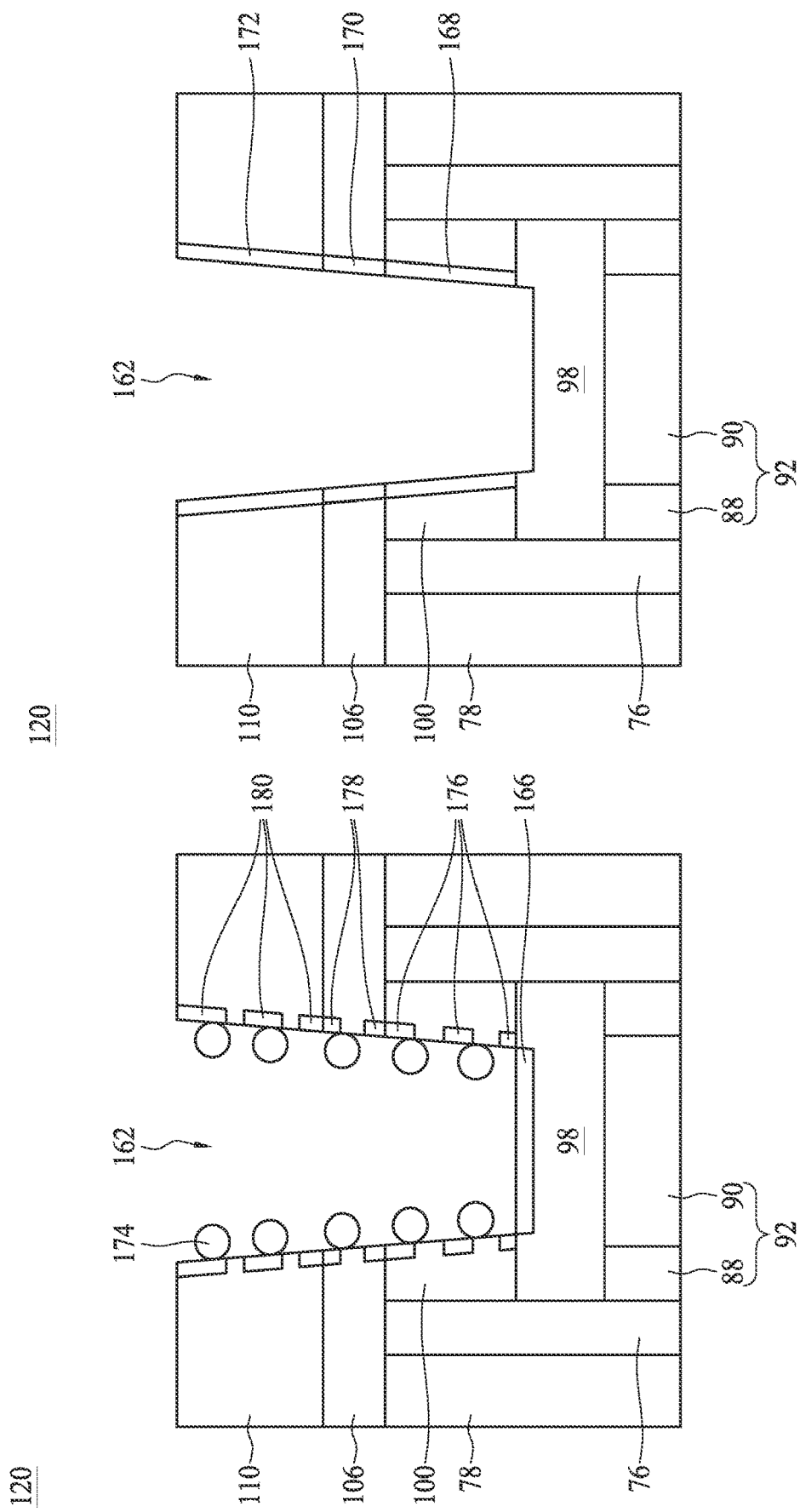

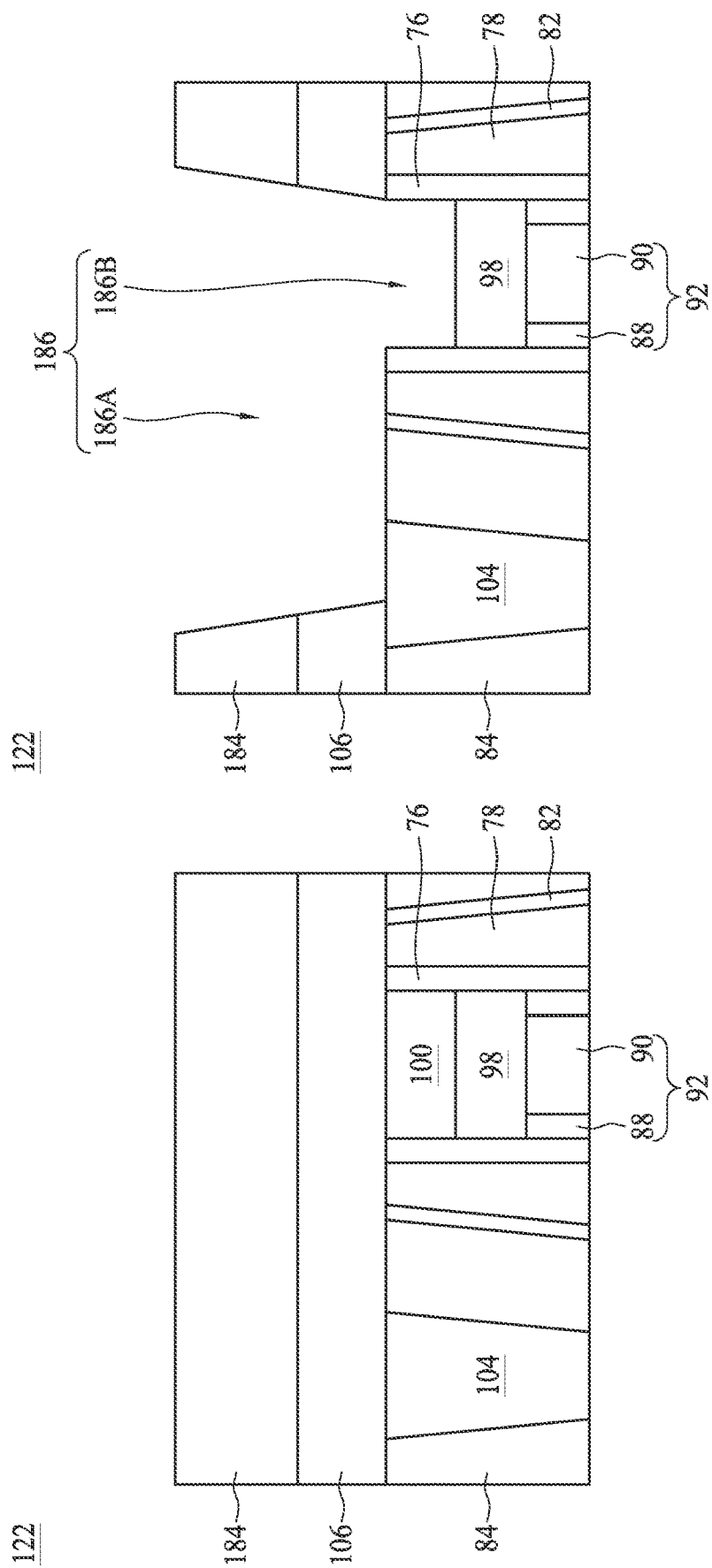

CONTACT FEATURES OF SEMICONDUCTOR DEVICE AND METHOD OF FORMING SAME

PRIORITY CLAIM AND CROSS-REFERENCE

This application claims the benefit of U.S. Provisional Application No. 63/298,699, filed on Jan. 12, 2022, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 21A, 21B, 22A, 22B, 23A, 23B, 24A, 24B, 25A, 25B, 26A, 26B, 27A, 27B, 28A, 28B, 29A, 29B, 30A, 30B, 31A, and 31B are cross-sectional views of intermediate stages in the manufacturing of a contact feature, in accordance with some embodiments.

FIGS. 34-38 are cross-sectional views of intermediate stages in the manufacturing of a contact feature, in accordance with some embodiments.

FIG. 39 is a cross-sectional view of a contact feature, in accordance with some embodiments.

FIGS. 40-44 are cross-sectional views of intermediate stages in the manufacturing of a contact feature, in accordance with some embodiments.

FIG. 45 is a cross-sectional view of a contact feature, in accordance with some embodiments.

FIGS. 46-53 are cross-sectional views of intermediate stages in the manufacturing of a contact feature, in accordance with some embodiments.

DETAILED DESCRIPTION

Figure 1:
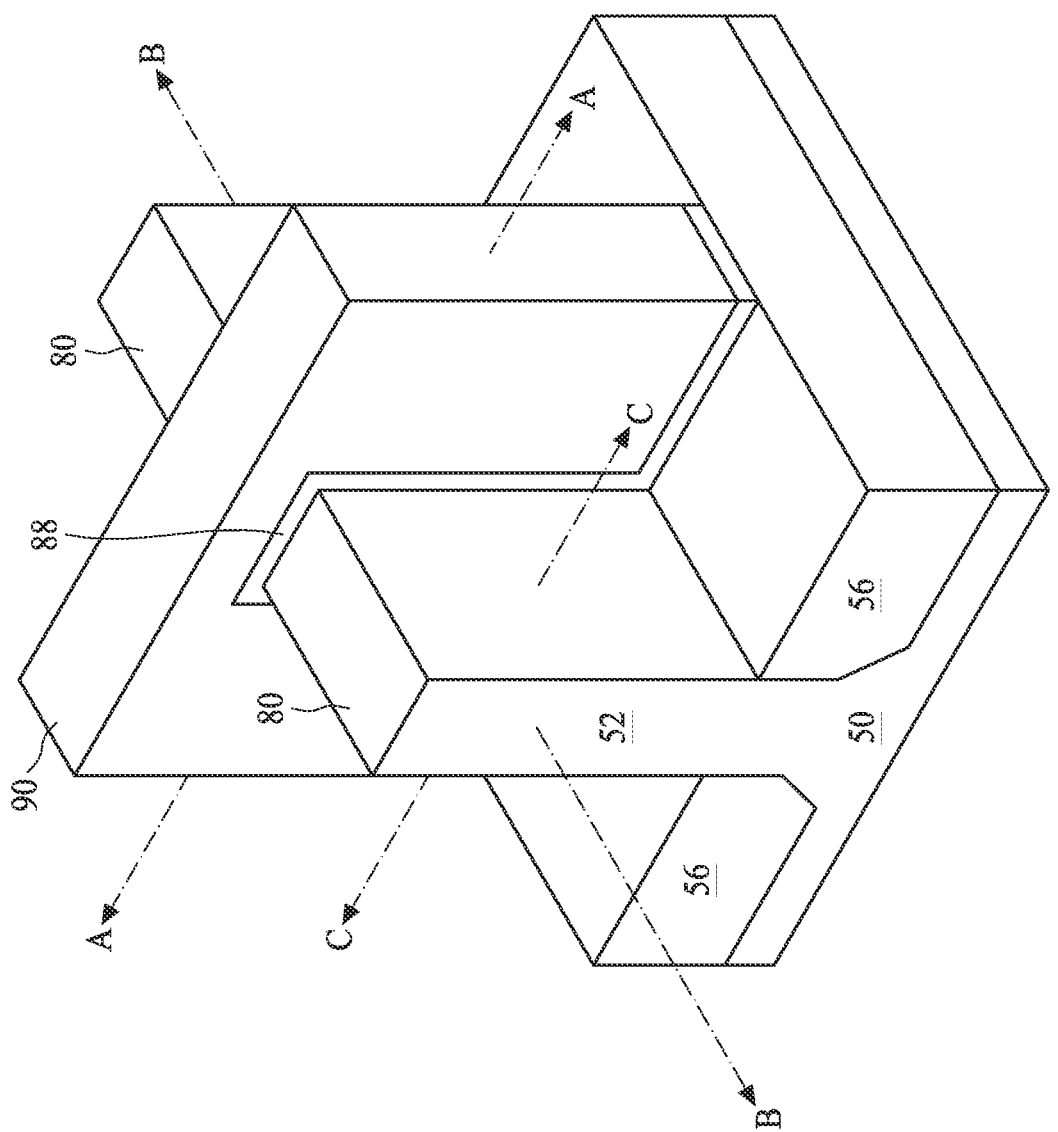
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, contact features (such as, for example, source/drain contact plugs, gate/drain contact plugs, gate contact plugs, source/drain and gate vias, or the like) of a semiconductor device and methods of forming the same. Various embodiments presented herein are discussed in the context of a fin field-effect transistor (FinFET) device formed using a gate-last process. In other embodiments, a gate-first process may be used. Various embodiments may be applied, however, to dies comprising other types of transistors, such as gate-all-around (GAA) transistors (for example, nanostructure (e.g., nanosheet, nanowire, or the like) field-effect transistors (NSFETs)) in lieu of or in combination with the FinFETs. In some embodiments, during formation of contact features, surface modification and etch processes are performed on sidewalls of contact openings to remove sidewall potions of barrier/adhesion layers or metallic materials that remain on the sidewalls of the contact openings during formation of the contact openings. By performing the surface modification (such as an oxidation process) and etch processes on sidewalls of contact openings, a selectivity loss of a selective metal deposition/growth process that forms contact features in the contact openings is reduced or avoided. Various embodiments discussed herein allow for selective bottom-up deposition/growth of contact features in contact openings to achieve low-resistance contact features, reducing or avoiding seam or void formation, increasing grain size of contact features, and improving yield.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 88 is along sidewalls and over a top surface of the fin 52, and a gate electrode 90 is over the gate dielectric layer 88. Source/drain regions 80 are disposed in opposite sides of the fin 52 with respect to the gate dielectric layer 88 and gate electrode 90. FIG. 1 further illustrates reference cross-sections that are used in later figures. Cross-section A-A is along a longitudinal axis of the gate electrode 90 and in a direction, for example, perpendicular to the direction of current flow between the source/drain regions 80 of the FinFET. Cross-section B-B is perpendicular to cross-section A-A and is along a longitudinal axis of the fin 52 and in a direction of, for example, a current flow between the source/drain regions 80 of the FinFET. Cross-section C-C is parallel to cross-section A-A and extends through a source/drain region 80 of the FinFET. Subsequent figures refer to these reference cross-sections for clarity.

FIGS. 2, 3, 4, 5, 6, 7, 8, 9A, 9B, 10A, 10B, 11A, 11B, 11C, 12A, 12B, 12C, 13A, 13B, 13C, 14A, 14B, 14C, 15A, 15B, 15C, 15D, 16A, 16B, 16C, 17A, 17B, 17C, 18A, 18B, 18C, 19A, 19B, 19C, 20A, 20B, and 20C, are cross-sectional views of intermediate stages in the manufacturing of a FinFET device, in accordance with some embodiments. FIGS. 2-8 and 9A-20A are illustrated along the reference cross-section A-A illustrated in FIG. 1, except for multiple fins/FinFETs. FIGS. 9B-20B and 15D are illustrated along the reference cross-section B-B illustrated in FIG. 1, except for multiple fins/FinFETs. FIGS. 11C-20C are illustrated along reference cross-section C-C illustrated in FIG. 1, except for multiple fins/FinFETs.

Figure 2:
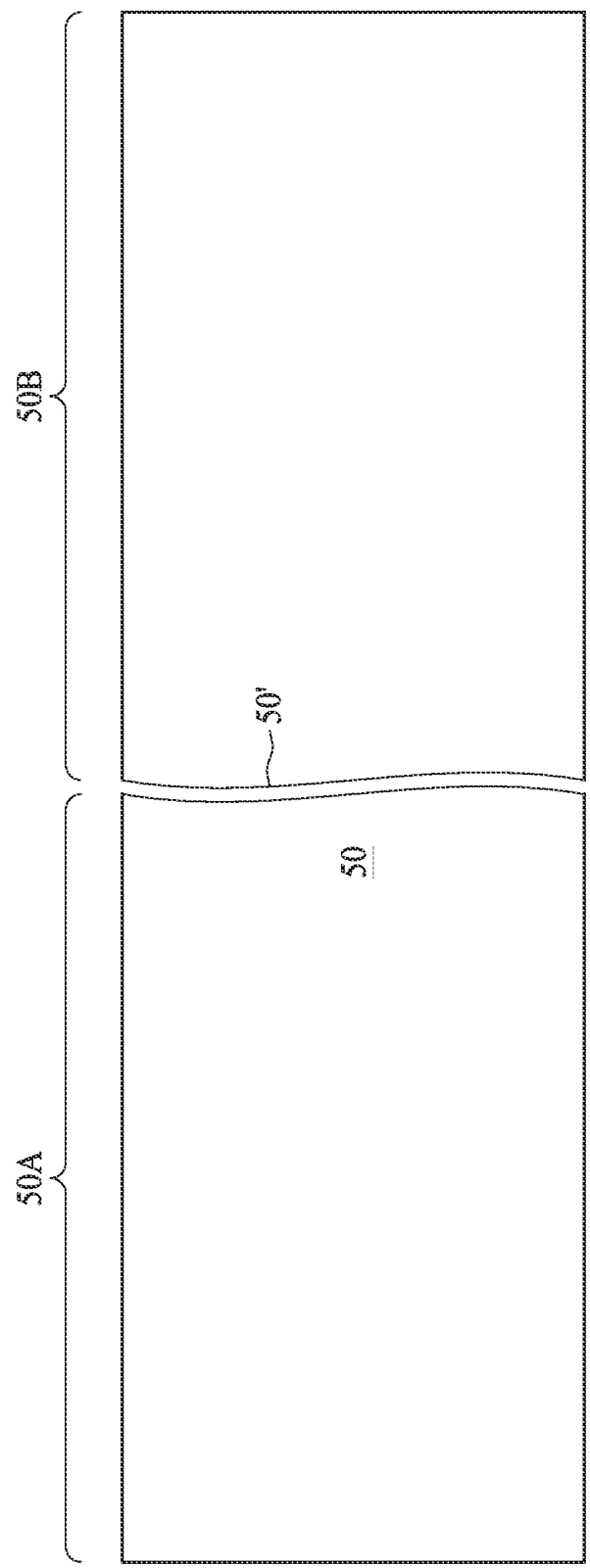
FIGS. 2, 3, 4, 5, 6, 7, 8, 9A, 9B, 10A, 10B, 11A, 11B, 11C, 12A, 12B, 12C, 13A, 13B, 13C, 14A, 14B, 14C, 15A, 15B, 15C, 15D, 16A, 16B, 16C, 17A, 17B, 17C, 18A, 18B, 18C, 19A, 19B, 19C, 20A, 20B, and 20C, are cross-sectional views of intermediate stages in the manufacturing of a FinFET device, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

In some embodiments, the substrate 50 may have a first region 50A and a second region 50B. In some embodiments, the first region 50A is a logic region and a second region 50B is a memory region, such as a static random-access memory (SRAM) region. The first region 50A may be physically separated from the second region 50B (as illustrated by a divider 50'), and any number of other desired regions may be disposed between the first region 50A and the second region 50B based on design specifications of a resulting FinFET device.

Figure 3:
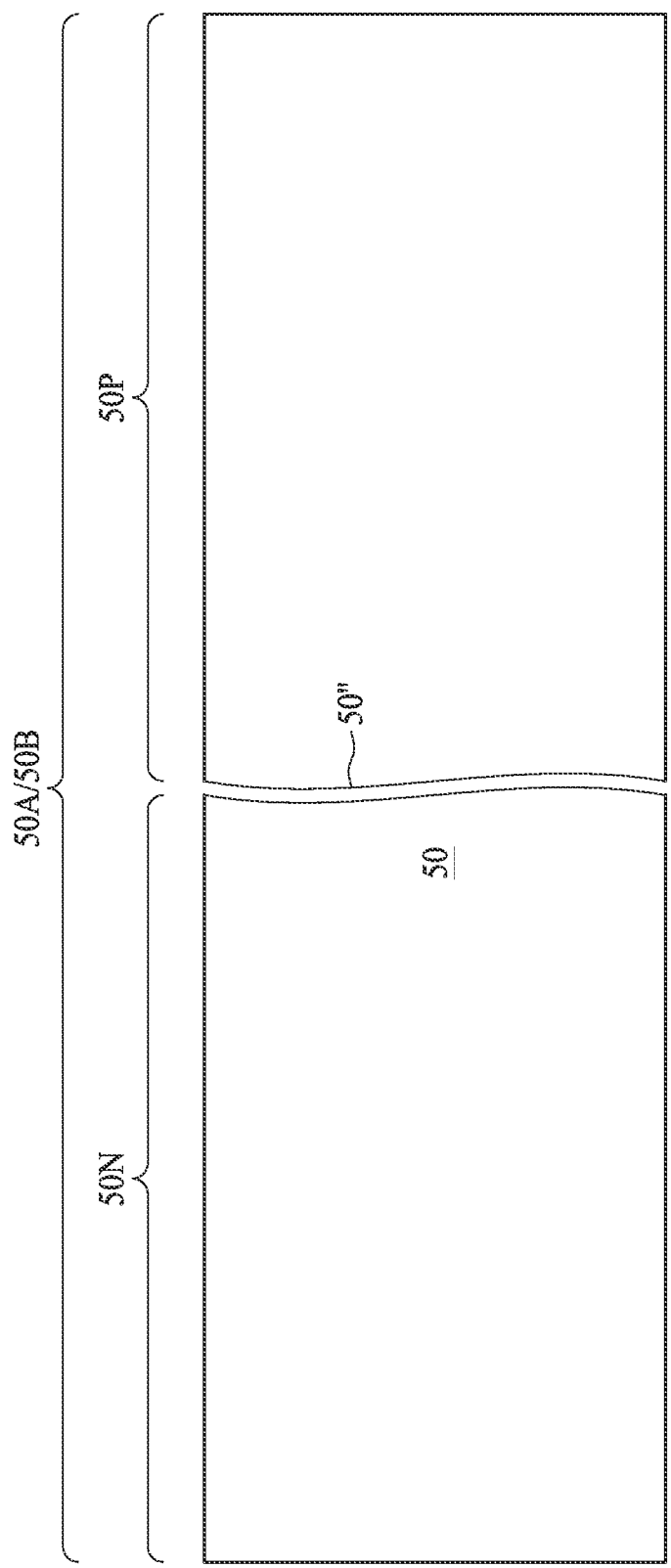

In FIG. 3, each of the first region 50A and the second region 50B may have an n-type region 50N and a p-type region 50P. The n-type region 50N is for forming n-type devices, such as NMOS transistors, e.g., n-type FinFETs. The p-type region 50P is for forming p-type devices, such as PMOS transistors, e.g., p-type FinFETs. The n-type region 50N may be physically separated from the p-type region 50P (as illustrated by a divider 50") in each of the first region 50A and the second region 50B, and any number of device features (e.g., other active devices, doped regions, isolation structures, etc.) may be disposed between the n-type region 50N and the p-type region 50P.

FIGS. 4-7, 8, 9A, 9B, 10A, 10B, 11A, 11B, 11C, 12A, 12B, 12C, 13A, 13B, 13C, 14A, 14B, 14C, 15A, 15B, 15C, 15D, 16A, 16B, 16C, 17A, 17B, 17C, 18A, 18B, 18C, 19A, 19B, 19C, 20A, 20B, and 20C illustrate various additional steps in the manufacturing of a FinFET device in accordance with some embodiments. FIGS. 4-7, 8A, 8B, 9A, 9B, 10A, 10B, 11A, 11B, 11C, 12A, 12B, 12C, 13A, 13B, 13C, 14A, 14B, 14C, 15A, 15B, 15C, 15D, 16A, 16B, 16C, 17A, 17B, 17C, 18A, 18B, 18C, 19A, 19B, 19C, 20A, 20B, and 20C illustrate features in either of the n-type region 50N and the p-type region 50P within each of the first region 50A and the second region 50B of the substrate 50. For example, the structures illustrated in FIGS. 4-7, 8A, 8B, 9A, 9B, 10A, 10B, 11A, 11B, 11C, 12A, 12B, 12C, 13A, 13B, 13C, 14A, 14B, 14C, 15A, 15B, 15C, 15D, 16A, 16B, 16C, 17A, 17B, 17C, 18A, 18B, 18C, 19A, 19B, 19C, 20A, 20B, and 20C may be applicable to both the n-type region 50N and the p-type region 50P within each of the first region 50A and the second region 50B of the substrate 50. Differences (if any) in the structures of the n-type region 50N and the p-type region 50P are described in the text accompanying each figure.

Figure 4:
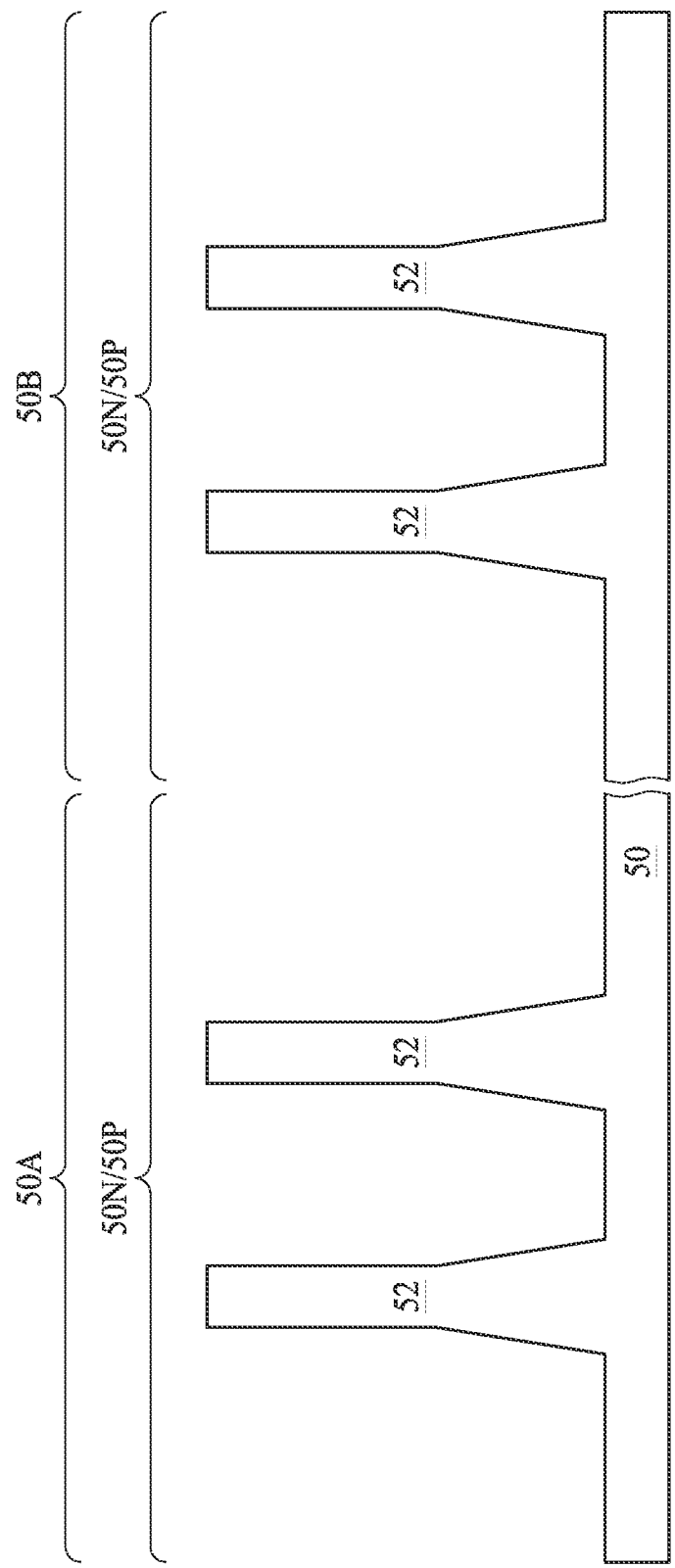

In FIG. 4, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The above method for forming the fins 52 is merely an example method for forming the fins 52. The fins 52 may be formed by any suitable method. For example, the fins 52 may be formed using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as an etch mask to form the fins 52. In some embodiments, a mask (or other layer) may remain on the fins 52.

Figure 5:
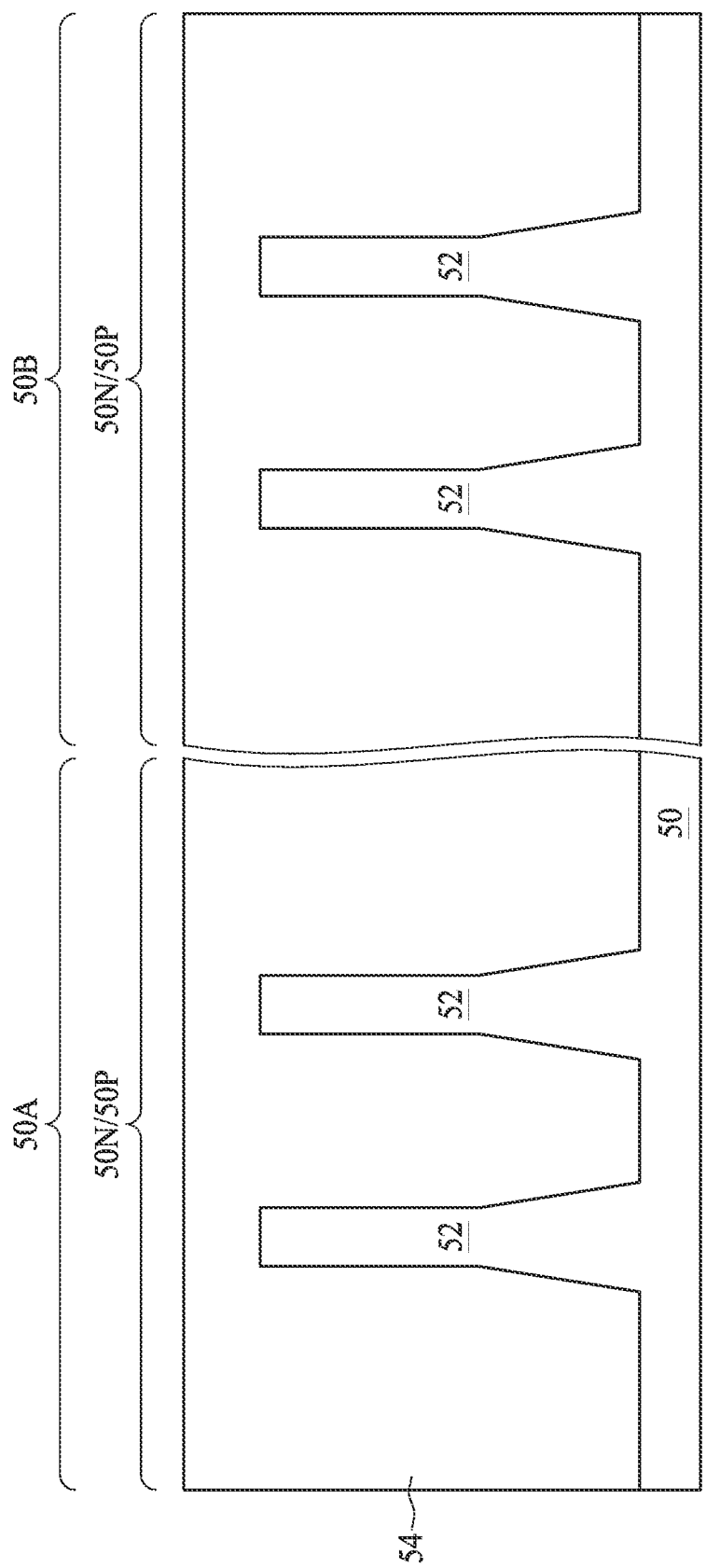

In FIG. 5, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material 54 is formed. In an embodiment, the insulation material 54 is formed such that excess insulation material 54 covers the fins 52. Although the insulation material 54 is illustrated as a single layer, some embodiments may utilize multiple layers. For example, in some embodiments, a liner (not shown) may first be formed along surfaces of the substrate 50 and the fins 52. Thereafter, a fill material, such as those discussed above may be formed over the liner.

Figure 6:
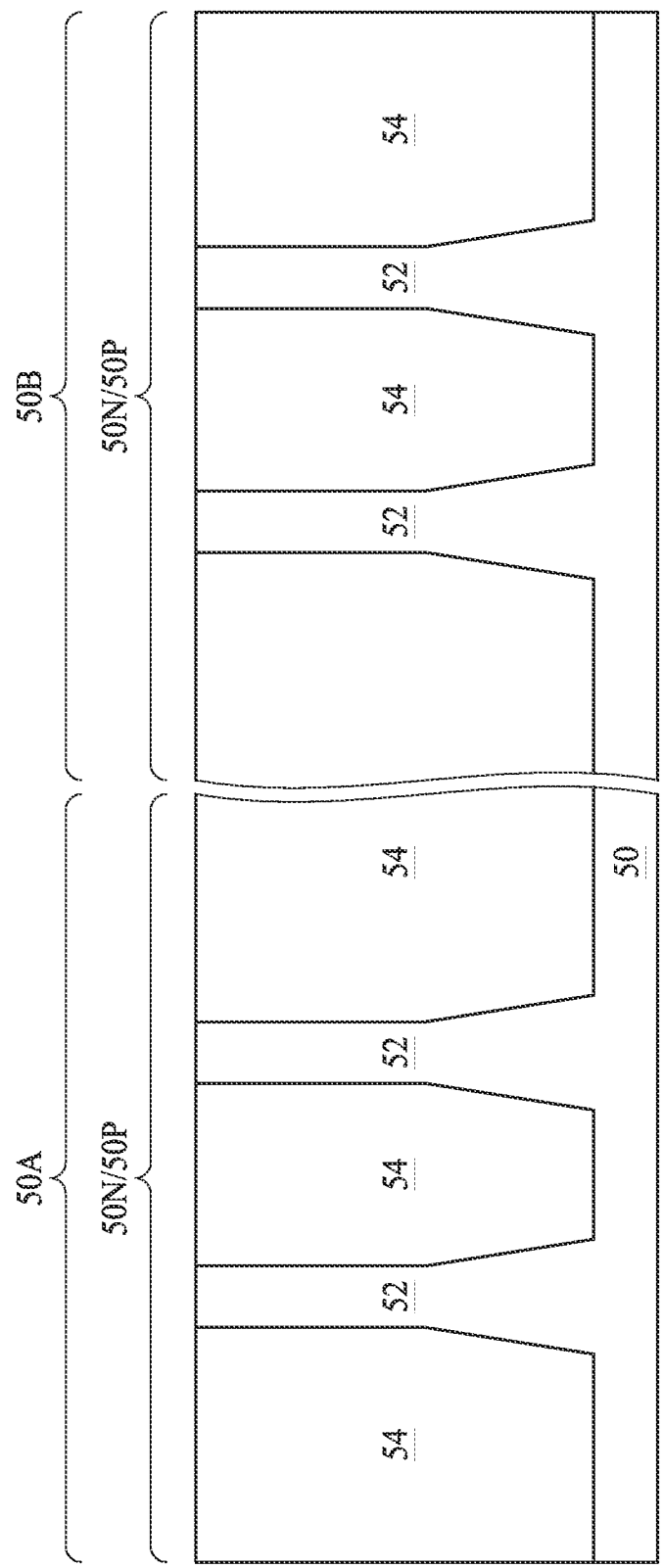

In FIG. 6, a removal process is applied to the insulation material 54 to remove excess insulation material 54 over the fins 52. In some embodiments, a planarization process, such as a chemical mechanical polish (CMP), an etch-back process, combinations thereof, or the like may be utilized. The planarization process exposes the fins 52 such that top surfaces of the fins 52 and the insulation material 54 are substantially level (within process variations of the planarization process) after the planarization process is completed. In embodiments in which a mask remains on the fins 52, the planarization process may expose the mask or remove the mask such that top surfaces of the mask or the fins 52, respectively, and the insulation material 54 are level after the planarization process is completed.

Figure 7:
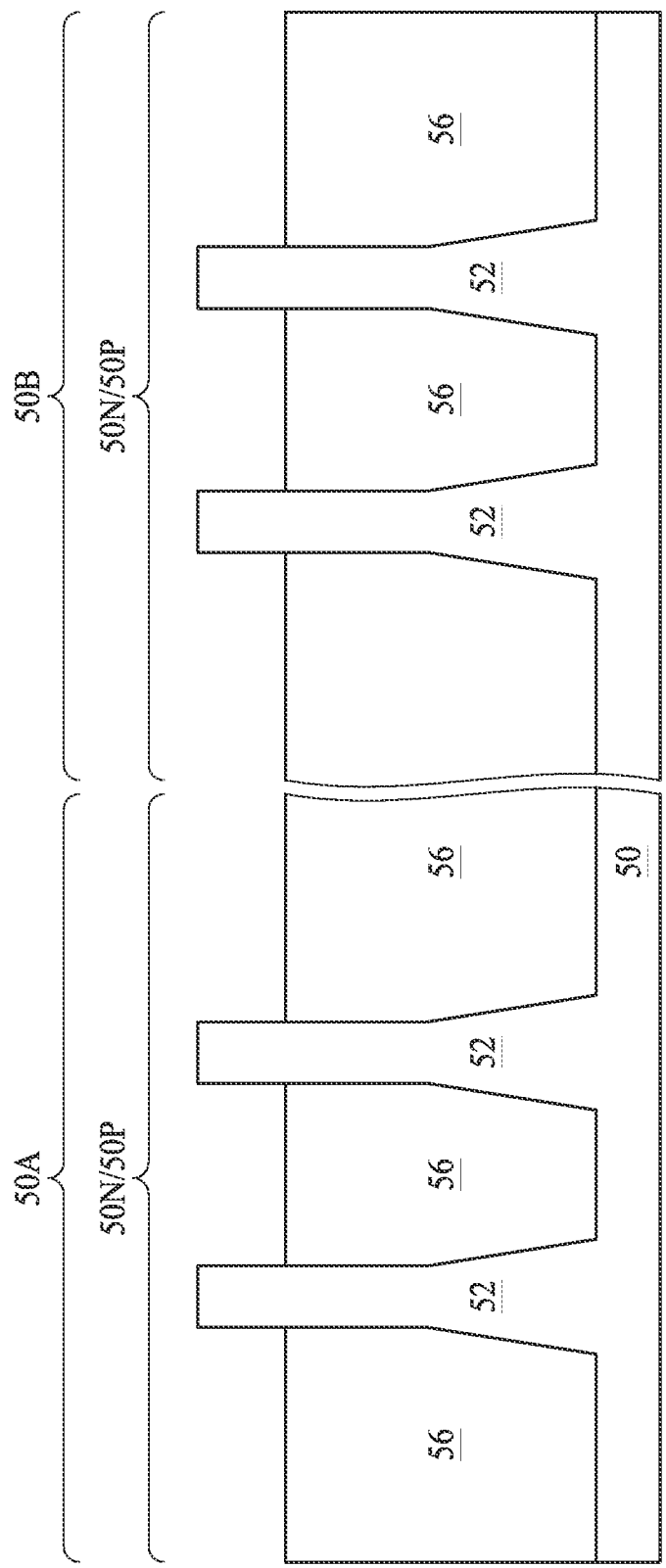

In FIG. 7, the insulation material 54 (see FIG. 6) is recessed to form isolation regions 56. The isolation regions 56 may be also referred to as Shallow Trench Isolation (STI) regions. The insulation material 54 is recessed such that upper portions of fins 52 protrude from between neighboring isolation regions 56. Further, the top surfaces of the isolation regions 56 may have a flat surface as illustrated, a convex surface, a concave surface (such as dishing), or a combination thereof. The top surfaces of the isolation regions 56 may be formed flat, convex, and/or concave by an appropriate etch. The isolation regions 56 may be recessed using an acceptable etch process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2-7 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins. For example, the fins 52 in FIG. 6 can be recessed, and a material different from the fins 52 may be epitaxially grown over the recessed fins 52. In such embodiments, the fins comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins. In some embodiments where homoepitaxial or heteroepitaxial structures are epitaxially grown, the epitaxially grown materials may be in situ doped during growth, which may obviate prior and subsequent implantations, although in situ and implantation doping may be used together.

Still further, it may be advantageous to epitaxially grow a material in the n-type regions 50N different from the material in the p-type regions 50P. In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 7, appropriate wells (not shown) may be formed in the fins 52 and/or the substrate 50. In some embodiments, P wells may be formed in the n-type regions 50N, and N wells may be formed in the p-type regions 50P. In some embodiments, P wells or N wells are formed in both the n-type regions 50N and the p-type regions 50P. In the embodiments with different well types, the different implant steps for the n-type regions 50N and the p-type regions 50P may be achieved using a photoresist and/or other masks (not shown). For example, a photoresist may be formed over the fins 52 and the isolation regions 56 in both the n-type regions 50N and the p-type regions 50P. The photoresist is then patterned to expose the p-type regions 50P of the substrate 50. The photoresist can be formed by using a spin-on technique and can be patterned using acceptable photolithography techniques. Once the photoresist is patterned, an n-type impurity implant is performed in the p-type regions 50P, and the photoresist may act as a mask to substantially prevent n-type impurities from being implanted into the n-type regions 50N. The n-type impurities may be phosphorus, arsenic, antimony, or the like implanted in the regions to a concentration of equal to or less than $10^{18}$ cm$^{-3}$, such as between about $10^{16}$ cm$^{-3}$ and about $10^{18}$ cm$^{-3}$. After the implantation, the photoresist is removed, such as by an acceptable ashing process followed by a wet clean process.

Following the implanting of the p-type regions 50P, a photoresist is formed over the fins 52 and the isolation regions 56 in both the n-type regions 50N and the p-type regions 50P. The photoresist is then patterned to expose the n-type regions 50N of the substrate 50. The photoresist can be formed by using a spin-on technique and can be patterned using acceptable photolithography techniques. Once the photoresist is patterned, a p-type impurity implant may be performed in the n-type regions 50N, and the photoresist may act as a mask to substantially prevent p-type impurities from being implanted into the p-type regions 50P. The p-type impurities may be boron, boron fluoride, indium, or the like implanted in the regions to a concentration of equal to or less than $10^{18}$ cm$^{-3}$, such as between about $10^{16}$ cm$^{-3}$ and about $10^{18}$ cm$^{-3}$. After the implantation, the photoresist may be removed, such as by an acceptable ashing process followed by a wet clean process.

After performing the implantations of the n-type regions 50N and the p-type regions 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 8:
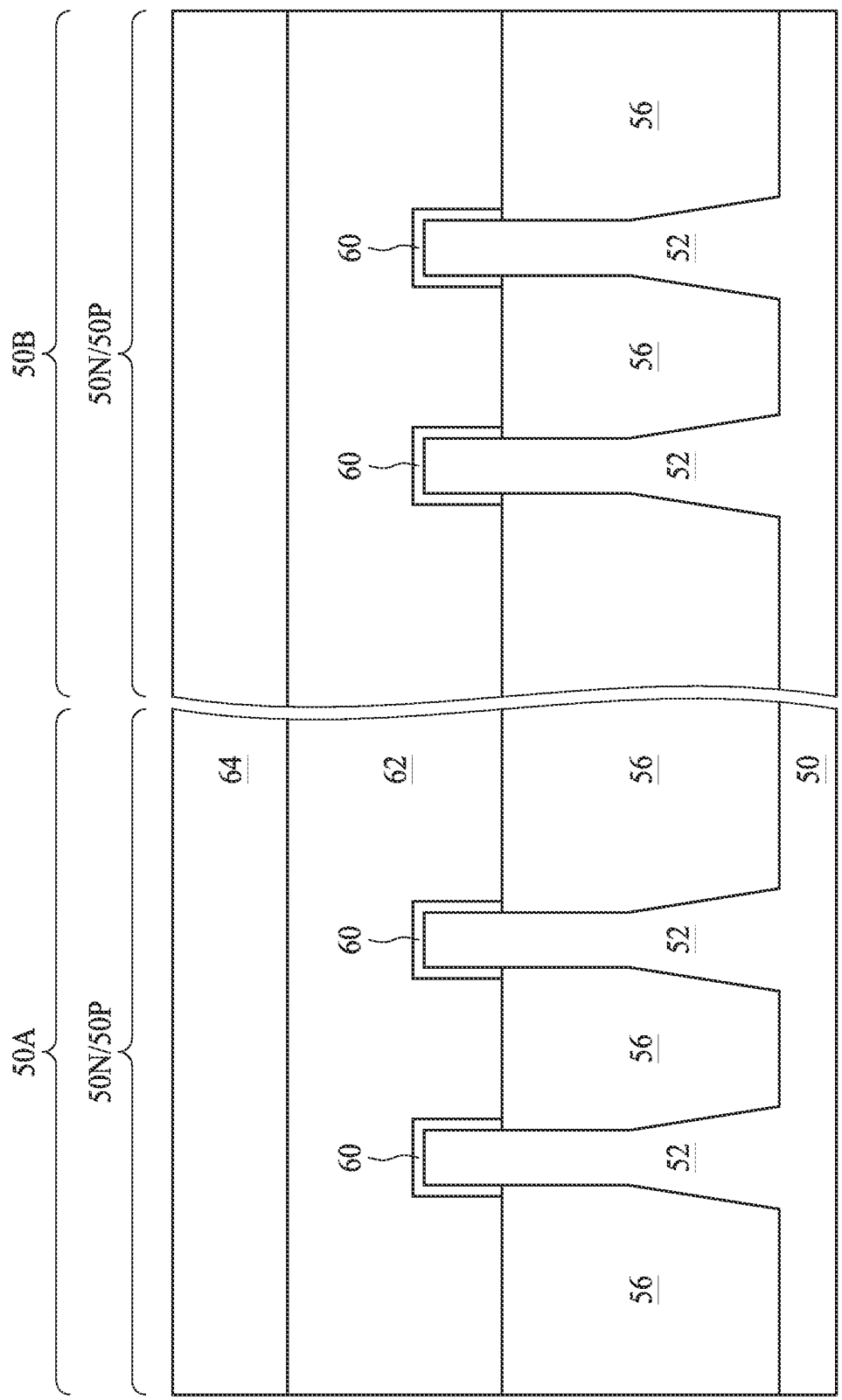

In FIG. 8, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of the isolation regions 56 and/or the dummy dielectric layer 60. The mask layer 64 may include one or more layers of, for example, silicon oxide, silicon nitride, silicon oxynitride, or the like. In this example, a single dummy gate layer 62 and a single mask layer 64 are formed across the first region 50A and the second region 50B, and over the n-type regions 50N and the p-type regions 50P within each of the first region 50A and the second region 50B. It is noted that the dummy dielectric layer 60 is shown covering only the fins 52 for illustrative purposes only. In some embodiments, the dummy dielectric layer 60 may be deposited such that the dummy dielectric layer 60 covers the isolation regions 56, extending over the isolation regions 56 and between the dummy gate layer 62 and the isolation regions 56.

Figure 9A:
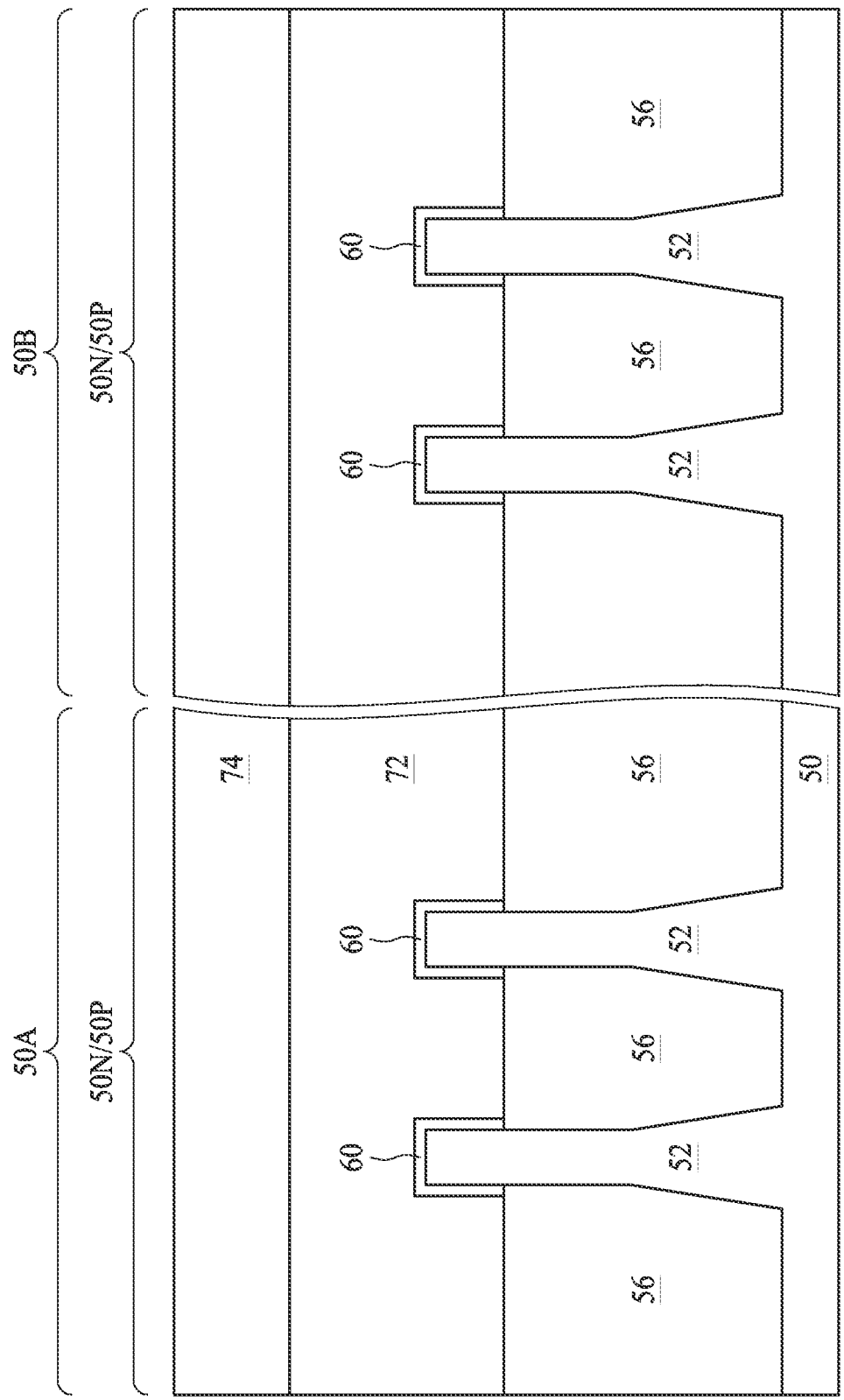
Figure 9B:
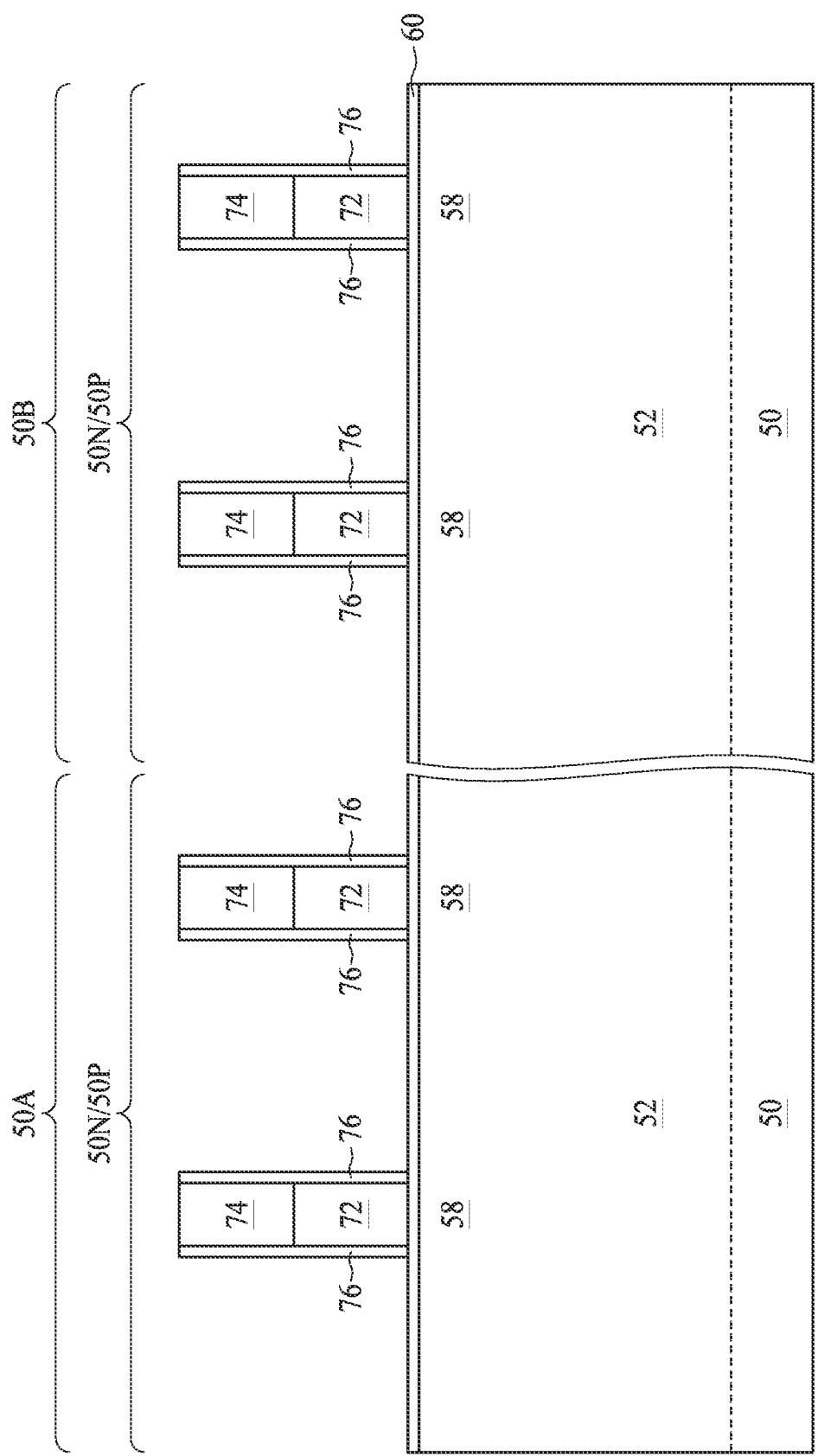

In FIGS. 9A and 9B, the mask layer 64 (see FIG. 8) may be patterned using acceptable photolithography and etching techniques to form masks 74. The pattern of the masks 74 then may be transferred to the dummy gate layer 62 (see FIG. 8) to form dummy gates 72. In some embodiments (not illustrated), the pattern of the masks 74 may also be transferred to the dummy dielectric layer 60 by an acceptable etching technique. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective fins 52.

Further in FIGS. 9A and 9B, gate seal spacers 76 can be formed on exposed surfaces of the dummy gates 72, the masks 74, and/or the fins 52. A thermal oxidation or a deposition followed by an anisotropic etch may form the gate seal spacers 76. The gate seal spacers 76 may be formed of silicon oxide, silicon nitride, silicon oxynitride, or the like.

After the formation of the gate seal spacers 76, implants for lightly doped source/drain (LDD) regions (not explicitly illustrated) may be performed. In the embodiments with different device types, similar to the implants discussed above in FIG. 7, a mask, such as a photoresist, may be formed over the n-type regions 50N, while exposing the p-type regions 50P, and appropriate type (e.g., p-type) impurities may be implanted into the exposed fins 52 in the p-type regions 50P. The mask may then be removed. Subsequently, a mask, such as a photoresist, may be formed over the p-type regions 50P while exposing the n-type regions 50N, and appropriate type impurities (e.g., n-type) may be implanted into the exposed fins 52 in the n-type regions 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ $cm^{-3}$ to about $10^{19}$ $cm^{-3}$. An anneal may be used to repair implant damage and to activate the implanted impurities.

Figure 10A:
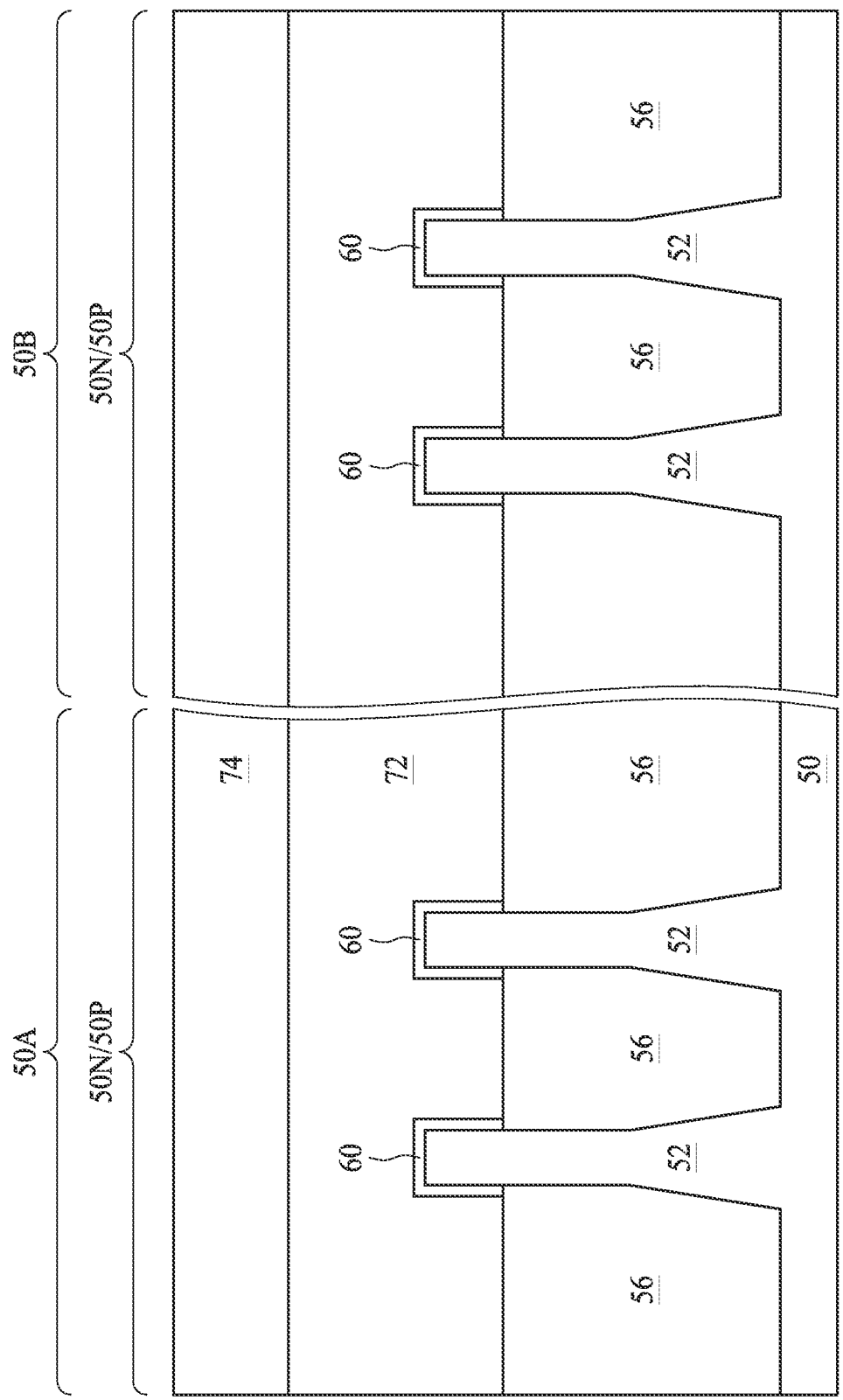
Figure 10B:
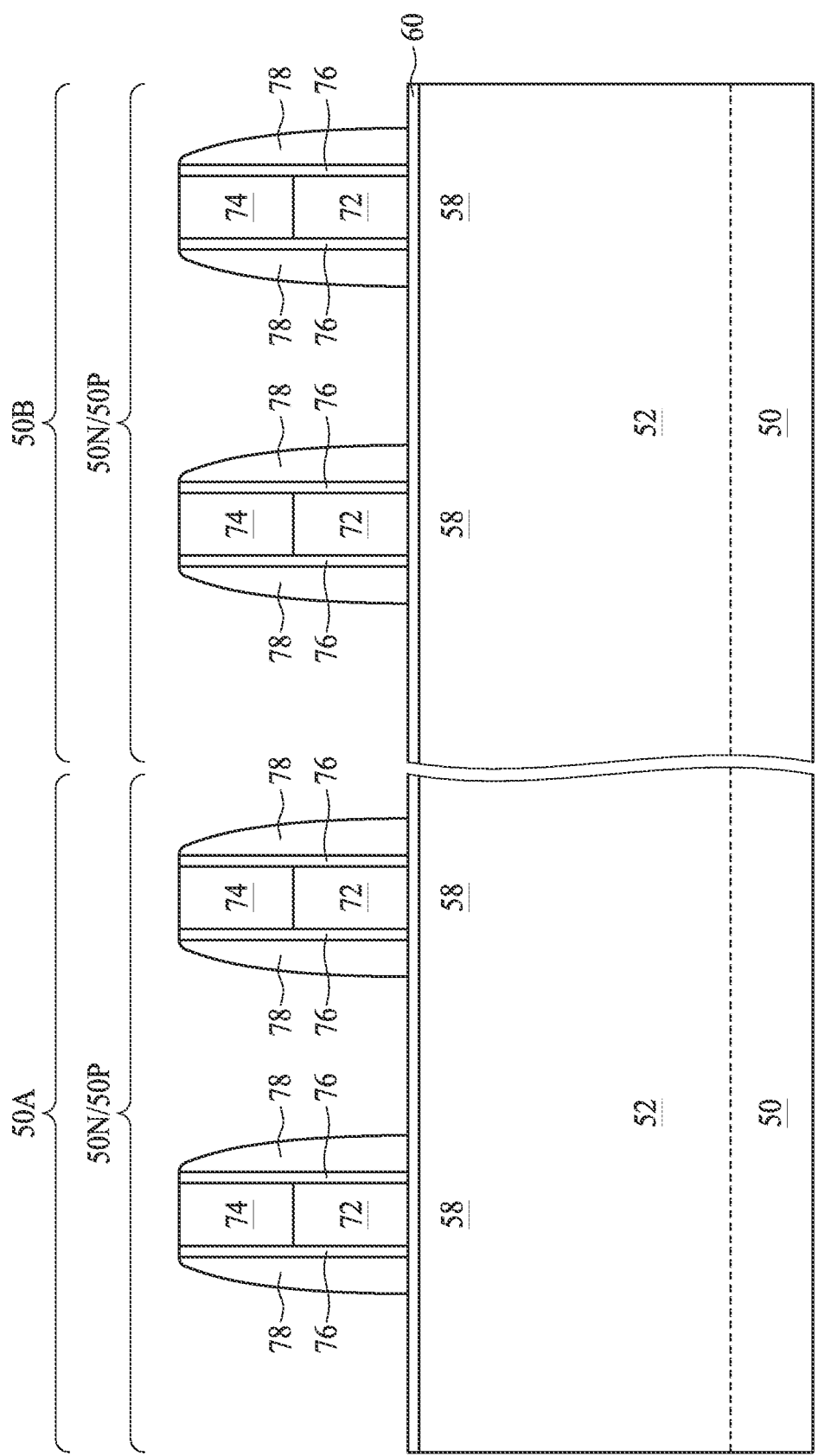

In FIGS. 10A and 10B, gate spacers 78 are formed on the gate seal spacers 76 along sidewalls of the dummy gates 72 and the masks 74. The gate spacers 78 may be formed by conformally depositing an insulating material and subsequently anisotropically etching the insulating material. The insulating material of the gate spacers 78 may be silicon oxide, silicon nitride, silicon oxynitride, silicon carbonitride, a combination thereof, or the like. In some embodiments, the gate spacers 78 and the gate seal spacers 76 comprise a same material. In other embodiments, the gate spacers 78 and the gate seal spacers 76 comprise different materials.

It is noted that the above disclosure generally describes a process of forming spacers and LDD regions. Other processes and sequences may be used. For example, fewer or additional spacers may be utilized, different sequence of steps may be utilized (e.g., the gate seal spacers 76 may not be etched prior to forming the gate spacers 78, yielding "L-shaped" gate seal spacers, spacers may be formed and removed, and/or the like). Furthermore, the n-type and p-type devices may be formed using a different structures and steps. For example, LDD regions for n-type devices may be formed prior to forming the gate seal spacers 76, while the LDD regions for p-type devices may be formed after forming the gate seal spacers 76.

Figure 11A:
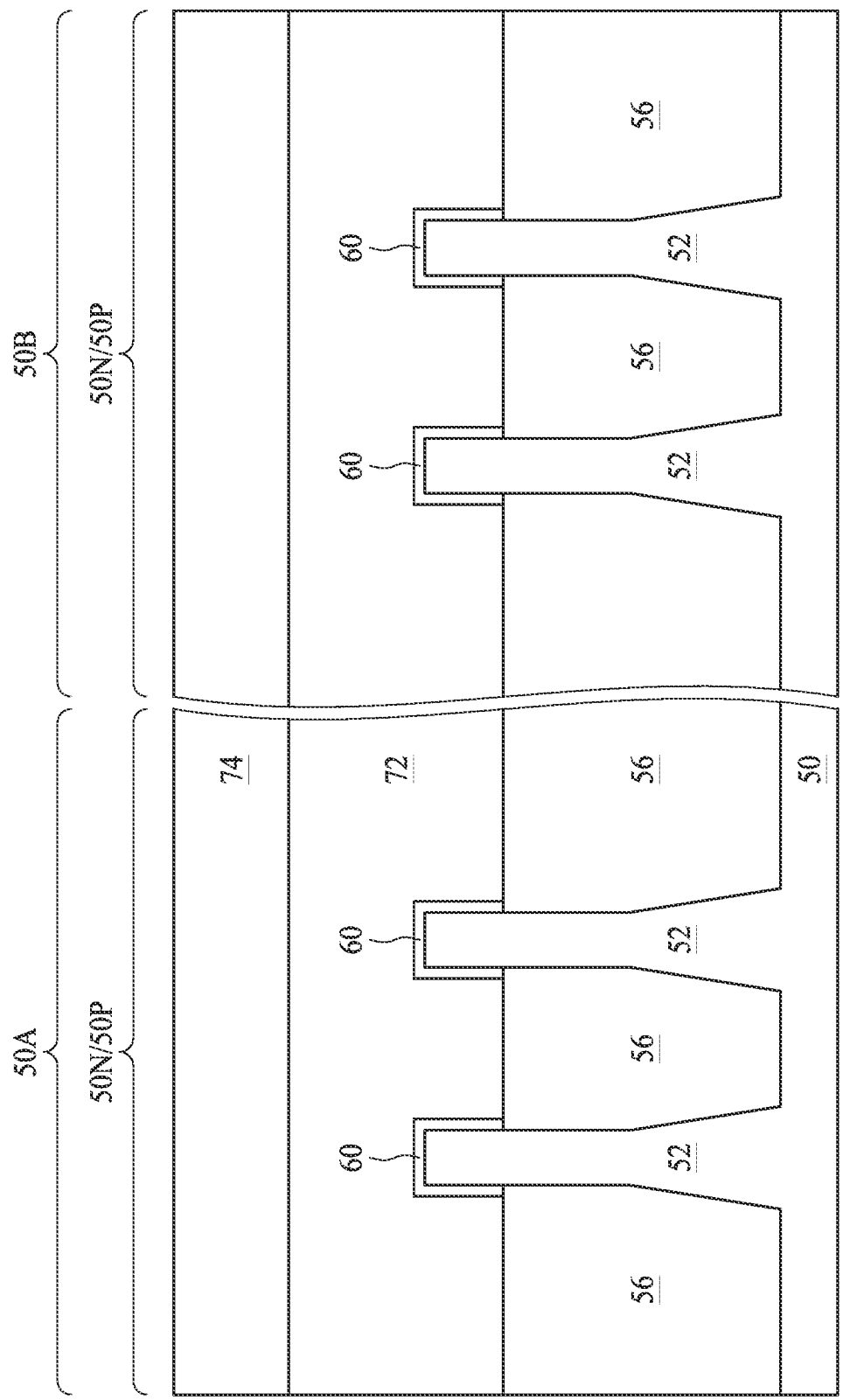
Figure 11B:
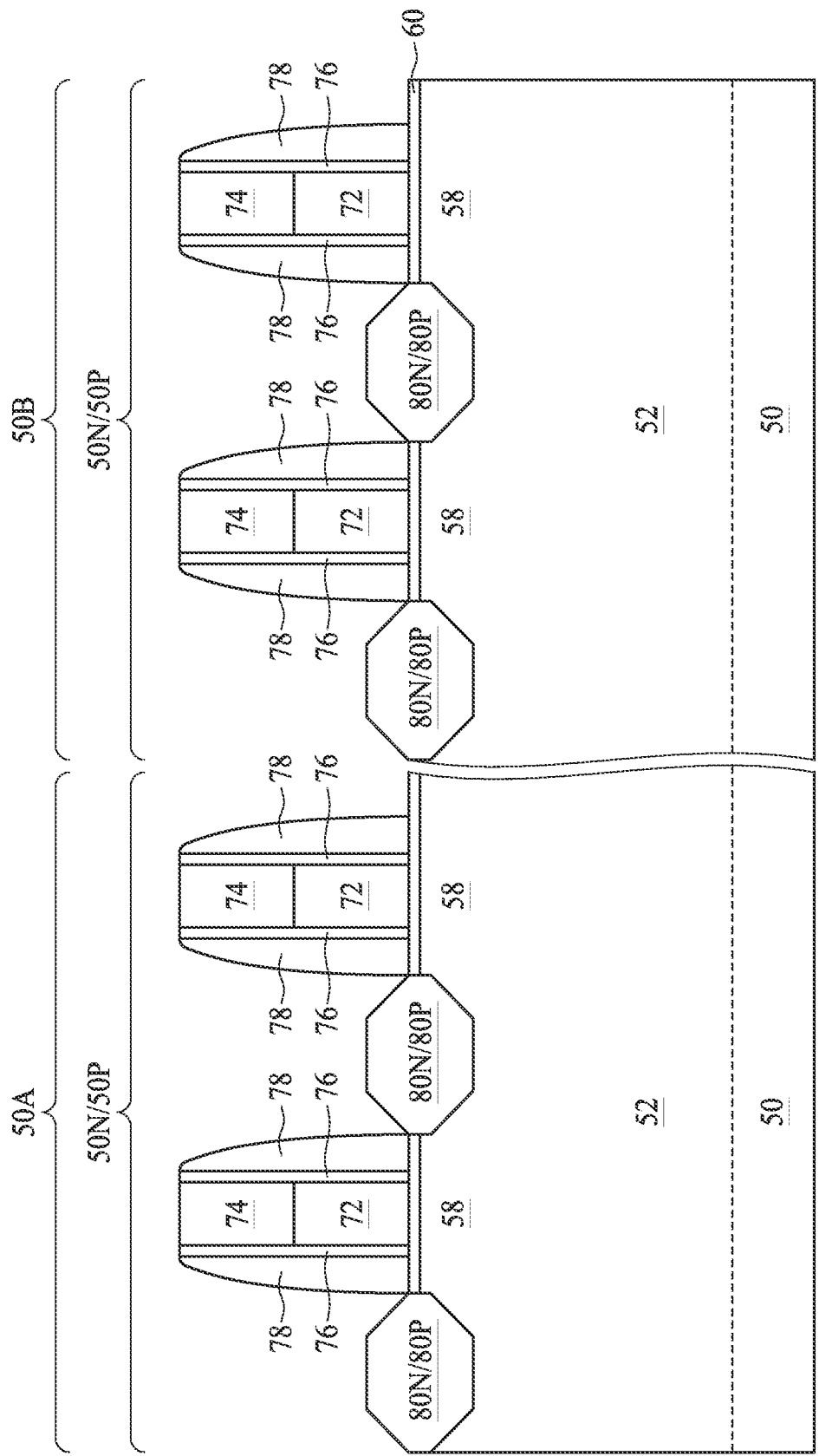
Figure 11C:
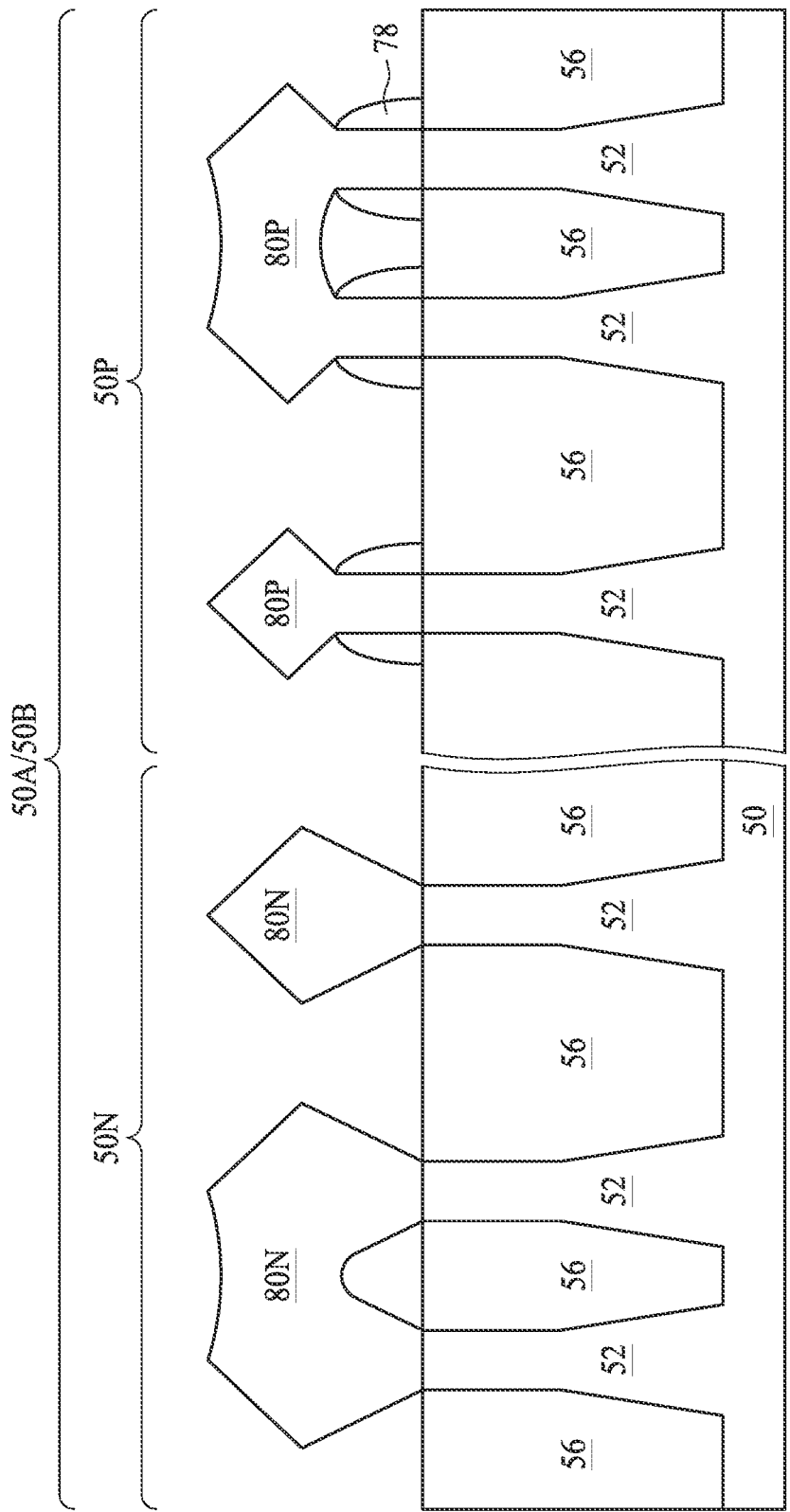

In FIGS. 11A, 11B and 11C, epitaxial source/drain regions 80N are formed in the fins 52 in the n-type regions 50N and epitaxial source/drain regions 80P are formed in the fins 52 in the p-type regions 50P. The epitaxial source/drain regions 80N may be also referred to as n-type epitaxial source/drain regions. The epitaxial source/drain regions 80P may be also referred to as p-type epitaxial source/drain regions. The epitaxial source/drain regions 80N and 80P are formed in the fins 52 such that each dummy gate 72 is disposed between respective neighboring pairs of the epitaxial source/drain regions 80N and 80P. In some embodiments the epitaxial source/drain regions 80N and 80P may extend into, and may also penetrate through, the fins 52. In some embodiments, the gate spacers 78 are used to separate the epitaxial source/drain regions 80N and 80P from the dummy gates 72 by an appropriate lateral distance so that the epitaxial source/drain regions 80N and 80P do not short out subsequently formed gates of the resulting FinFETs. A material of the epitaxial source/drain regions 80N and 80P may be selected to exert stress in the respective channel regions 58, thereby improving performance.

The epitaxial source/drain regions 80N in the n-type regions 50N may be formed by masking the p-type regions 50P and etching source/drain regions of the fins 52 in the n-type regions 50N to form recesses in the fins 52. Then, the epitaxial source/drain regions 80N in the n-type regions 50N are epitaxially grown in the recesses. The epitaxial source/drain regions 80N may include any acceptable material, such as appropriate for n-type FinFETs. For example, if the fin 52 is made of silicon, the epitaxial source/drain regions 80N in the n-type regions 50N may include materials exerting a tensile strain in the channel region 58, such as silicon, silicon carbide, phosphorous doped silicon carbide, silicon phosphide, or the like. The epitaxial source/drain regions 80N in the n-type regions 50N may have surfaces raised from respective surfaces of the fins 52 and may have facets.

The epitaxial source/drain regions 80P in the p-type regions 50P may be formed by masking the n-type regions 50N and etching source/drain regions of the fins 52 in the p-type regions 50P to form recesses in the fins 52. Then, the epitaxial source/drain regions 80P in the p-type regions 50P are epitaxially grown in the recesses. The epitaxial source/drain regions 80P may include any acceptable material, such as appropriate for p-type FinFETs. For example, if the fin 52 is made of silicon, the epitaxial source/drain regions 80P in the p-type region 50P may comprise materials exerting a compressive strain in the channel region 58, such as silicon-germanium, boron doped silicon-germanium, germanium, germanium tin, or the like. The epitaxial source/drain regions 80P in the p-type regions 50P may have surfaces raised from respective surfaces of the fins 52 and may have facets.

The epitaxial source/drain regions 80N and 80P and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 80N and 80P may be in situ doped during growth.

As a result of the epitaxy processes used to form the epitaxial source/drain regions 80N in the n-type regions 50N and the epitaxial source/drain regions 80P in the p-type regions 50P, upper surfaces of the epitaxial source/drain regions 80N and 80P have facets which expand laterally outward beyond sidewalls of the fins 52. In some embodiments, these facets cause adjacent source/drain regions 80N and 80P of a same FinFET to merge as illustrated by FIG. 11C. In some embodiments, in the p-type regions 50P, gate spacers 78 are formed covering a portion of the sidewalls of the fins 52 that extend above the isolation regions 56, thereby blocking the epitaxial growth. In n-type regions 50N, the spacer etch used to form the gate spacers 78 may be adjusted to remove the spacer material from a portion of the sidewalls of the fins 52 that extend above the isolation regions 56. In some embodiments, the epitaxial source/drain regions 80N and epitaxial source/drain regions 80P have different shapes.

Figure 12A:
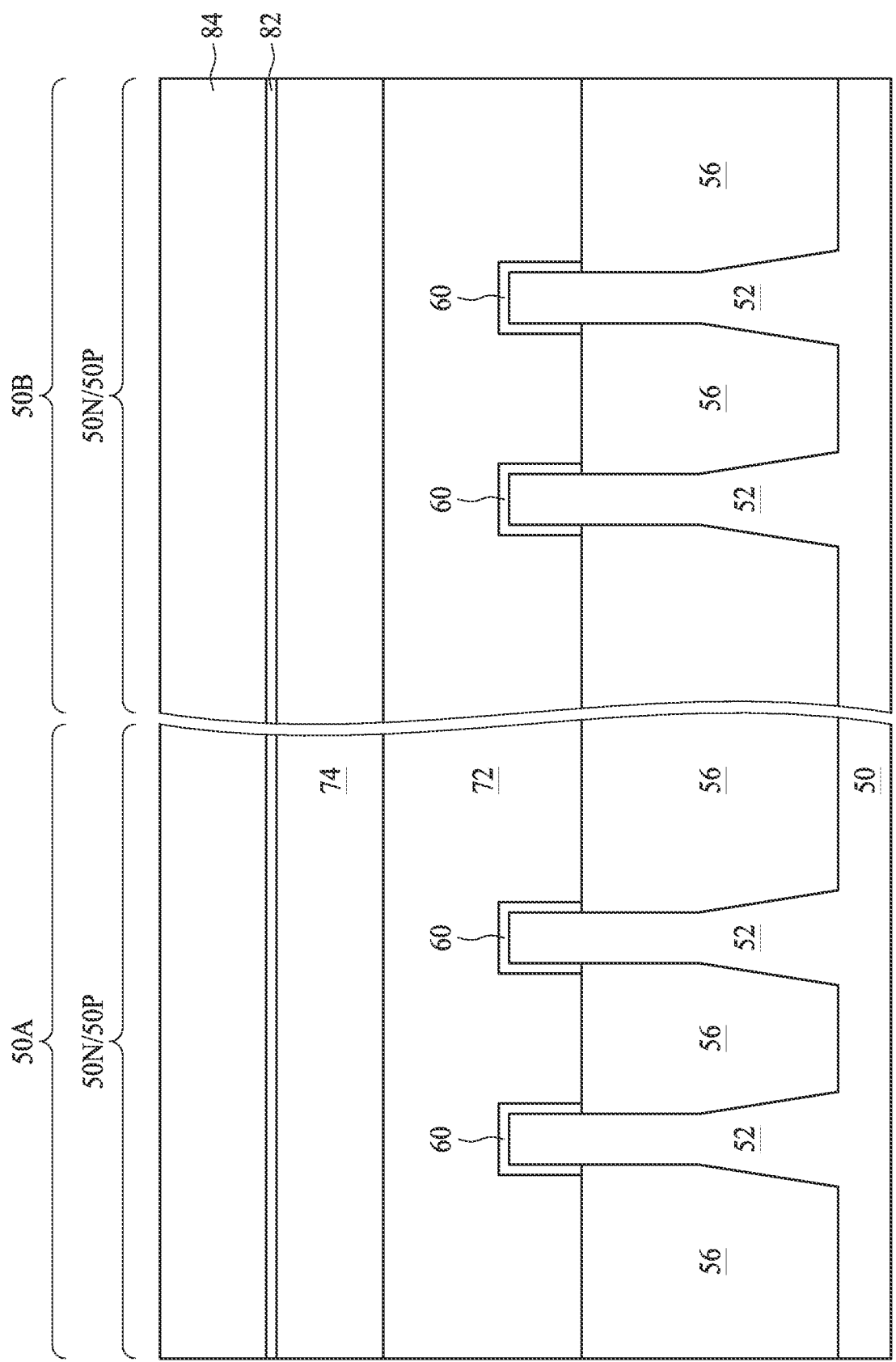
Figure 12B:
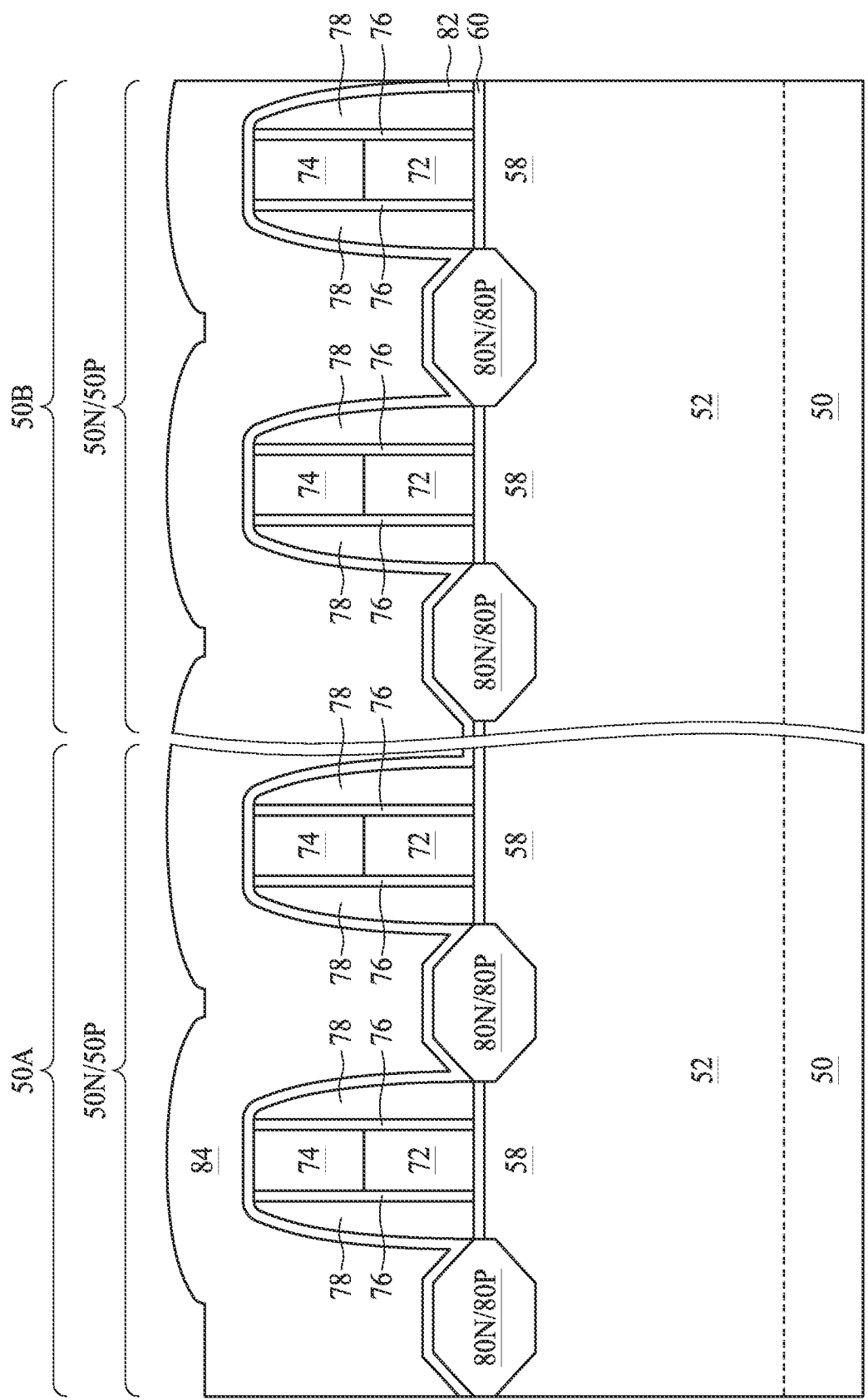
Figure 12C:
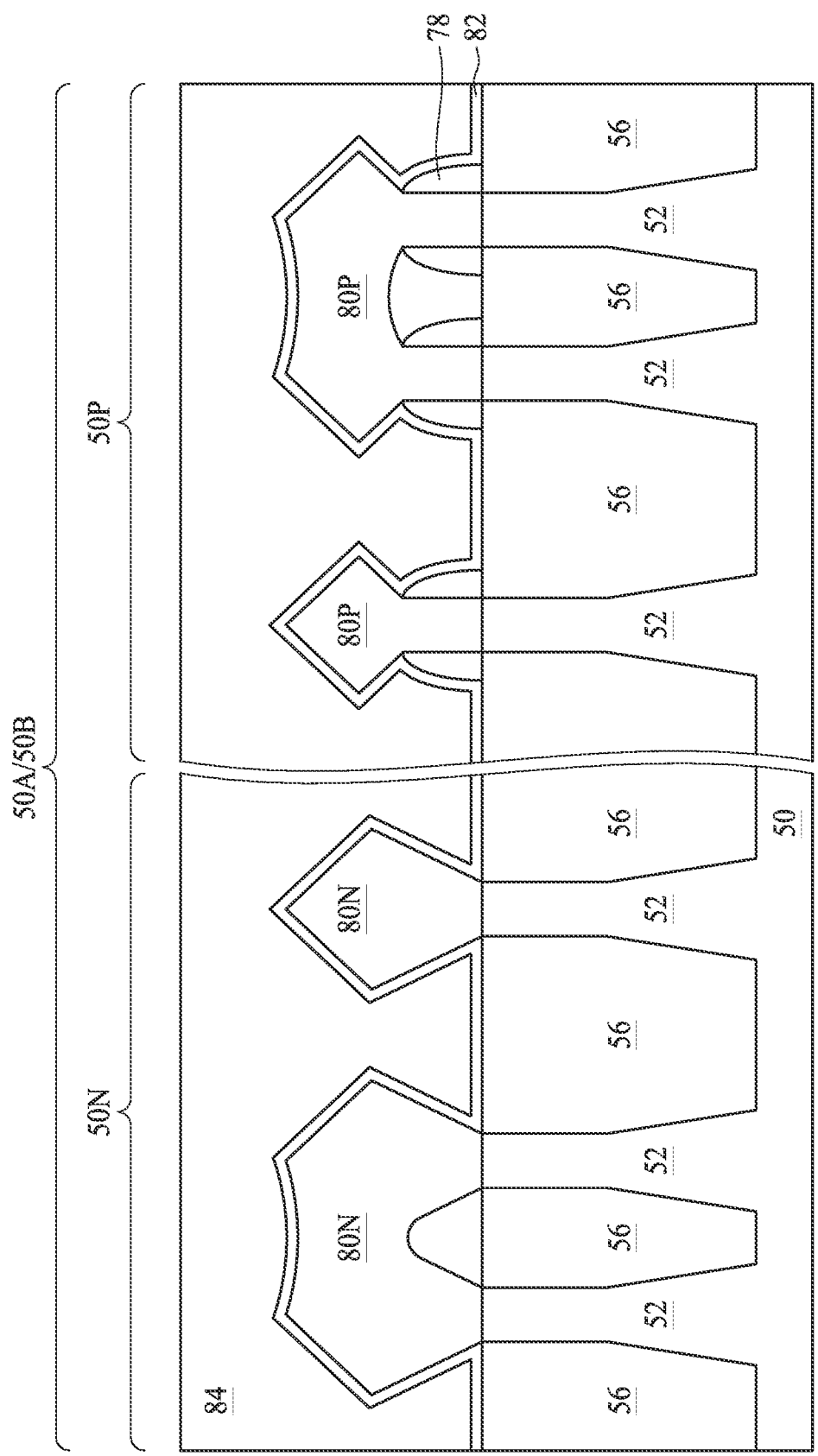

In FIGS. 12A, 12B and 12C, a first interlayer dielectric (ILD) 84 is deposited over the structure illustrated in FIGS. 11A, 11B and 11C. The first ILD 84 may be formed of a dielectric material, and may be deposited by any suitable method, such as CVD, plasma-enhanced CVD (PECVD), FCVD, a combination thereof, or the like. Dielectric materials may include silicon oxide, silicon nitride, phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 82 is disposed between the first ILD 84 and the epitaxial source/drain regions 80N and 80P, the masks 74, and the gate spacers 78. The CESL 82 may comprise a dielectric material, such as, silicon nitride, silicon oxide, silicon oxynitride, or the like, having a lower etch rate than the material of the overlying first ILD 84.

Figure 13A:
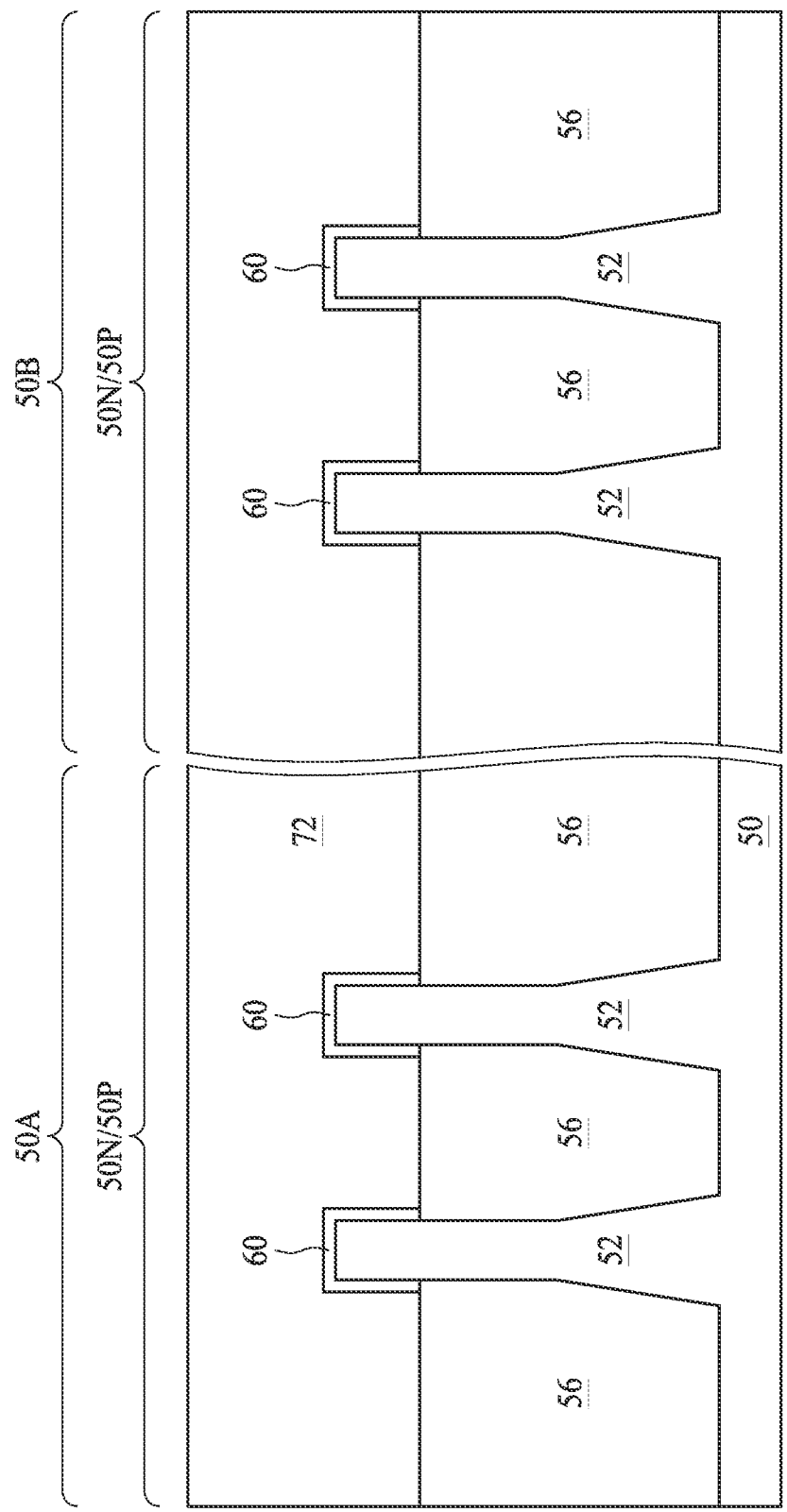
Figure 13B:
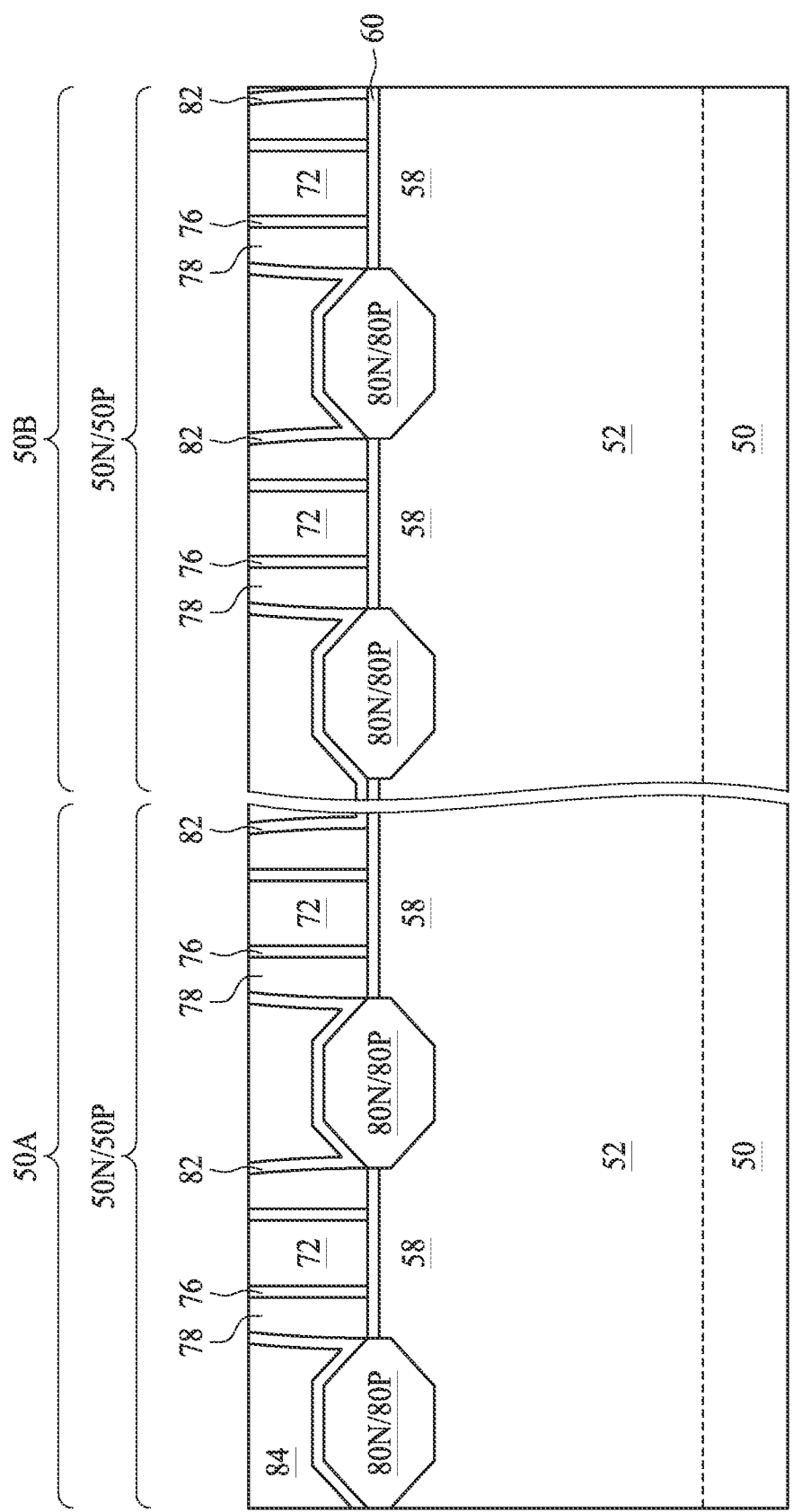
Figure 13C:
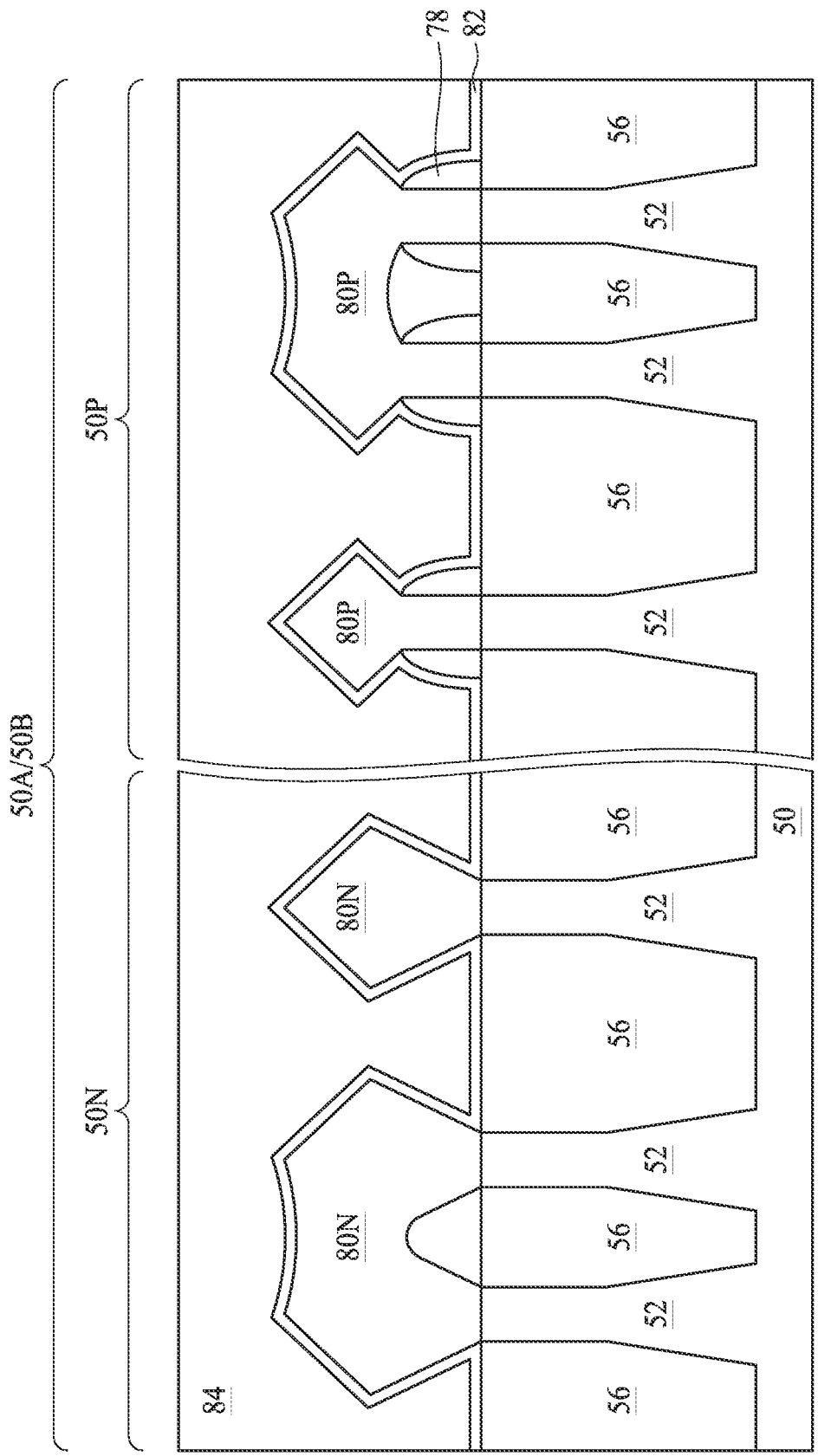

In FIGS. 13A, 13B and 13C, a planarization process, such as a CMP, may be performed to level a top surface of the first ILD 84 with top surfaces of the dummy gates 72 or the masks 74 (see FIGS. 12A and 12B). The planarization process may also remove the masks 74 on the dummy gates 72, and portions of the CESL 82, the gate seal spacers 76 and the gate spacers 78 along sidewalls of the masks 74. After the planarization process, top surfaces of the dummy gates 72, the gate seal spacers 76, the gate spacers 78, the CESL 82, and the first ILD 84 are substantially level or coplanar within process variations of the planarization process. Accordingly, the top surfaces of the dummy gates 72 are exposed through the first ILD 84. In some embodiments, the masks 74 may remain on the dummy gates 72, in which case the planarization process levels the top surface of the first ILD 84 with top surfaces of the masks 74.

Figure 14A:
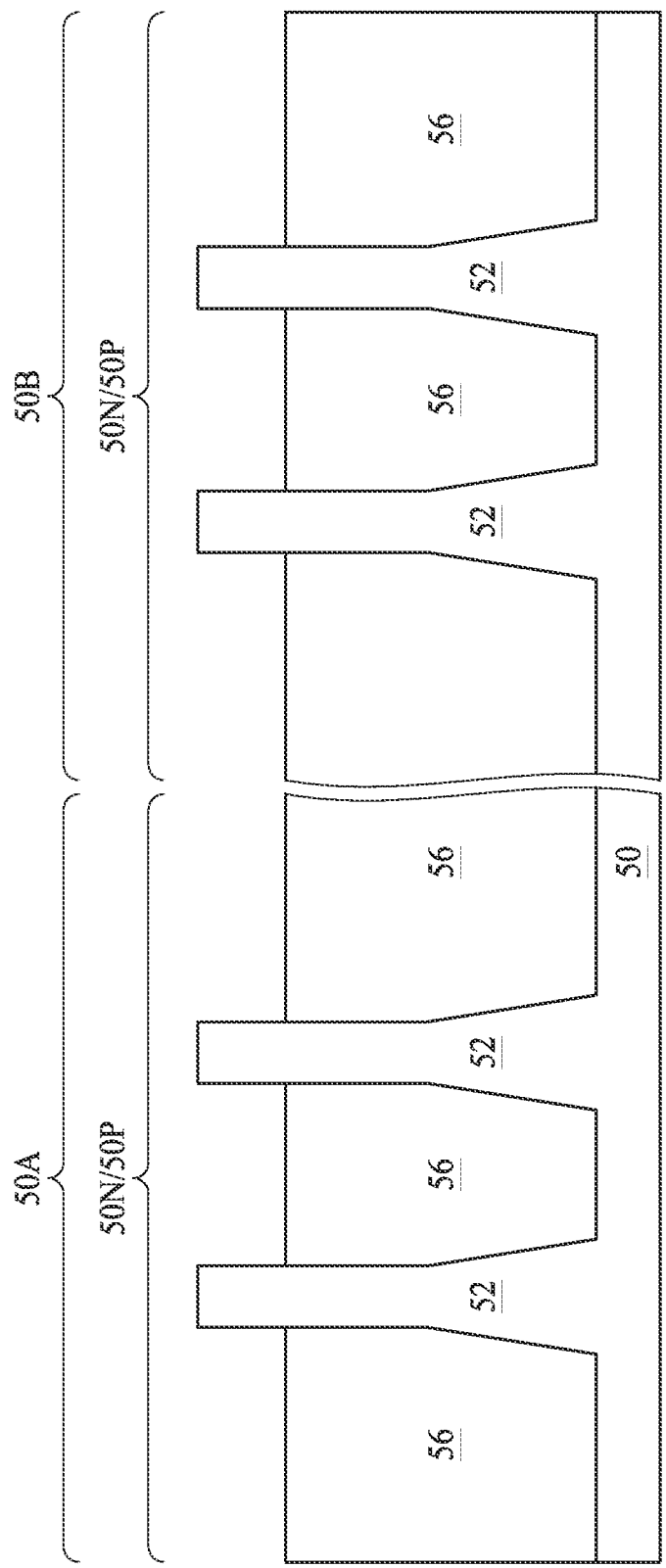
Figure 14B:
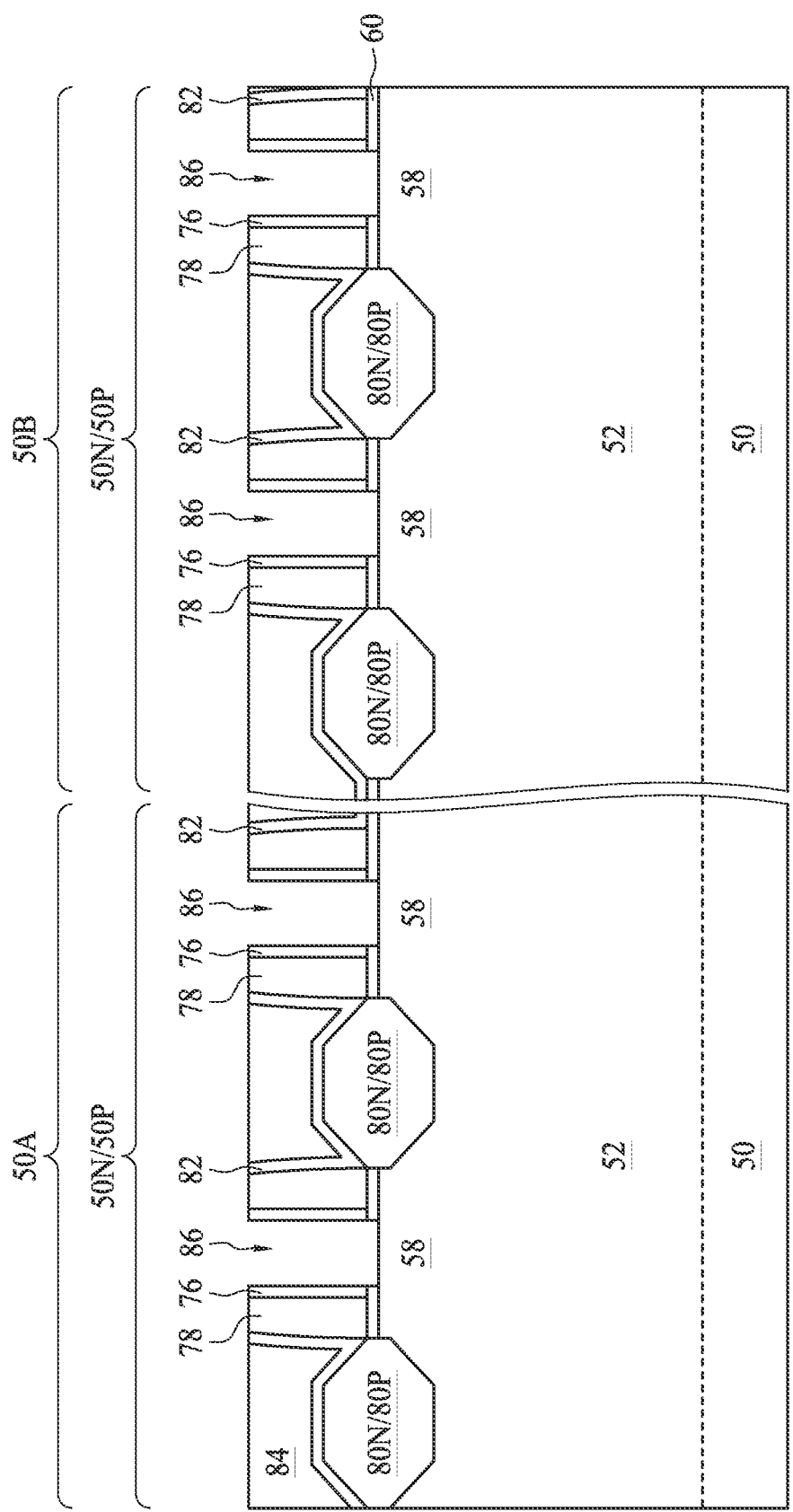
Figure 14C:
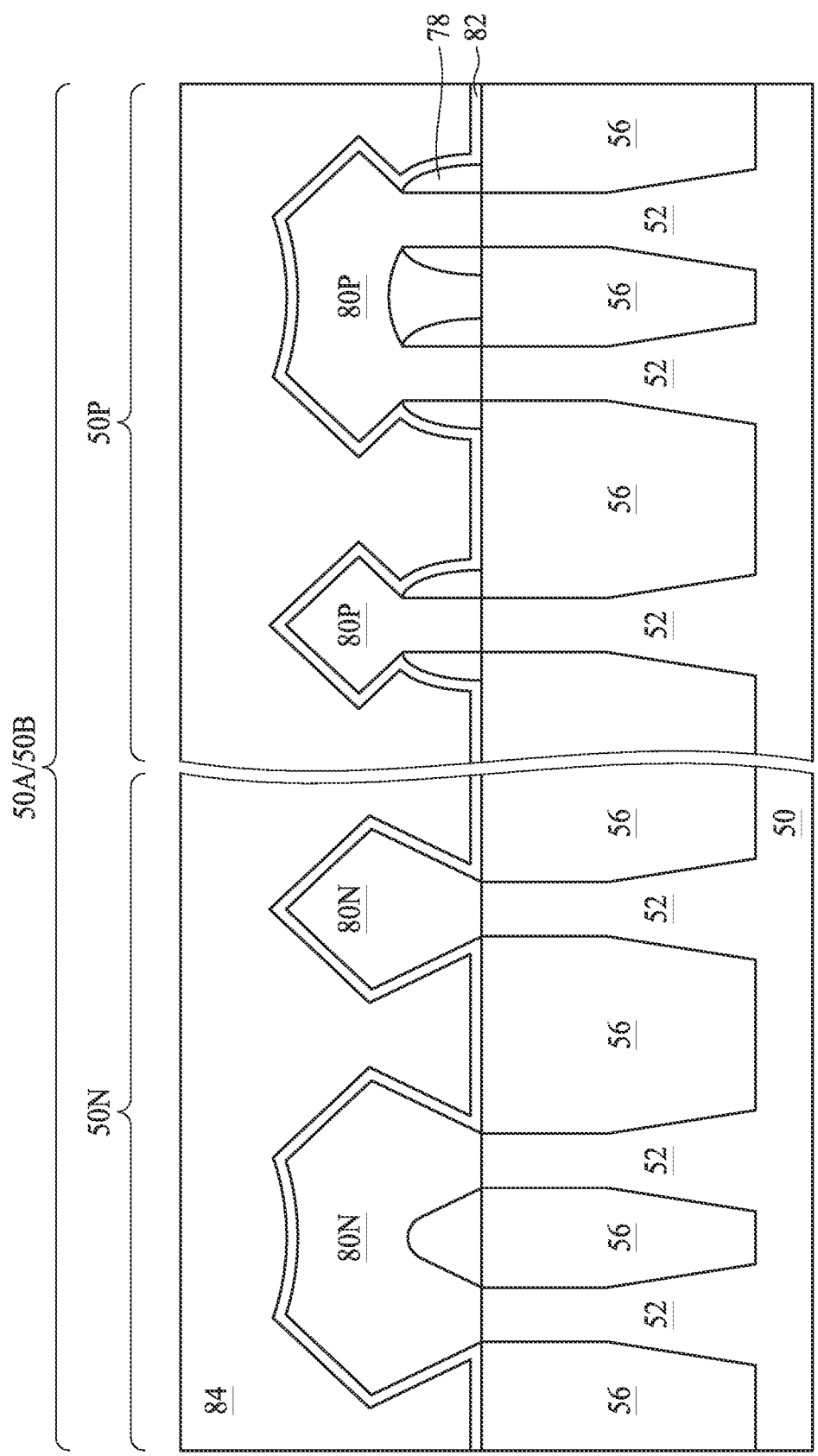

In FIGS. 14A, 14B and 14C, the dummy gates 72, and the masks 74 (see FIGS. 13A, 13B and 13C) if present, are removed in an etching step(s), so that recesses 86 are formed. Portions of the dummy dielectric layer 60 in the recesses 86 may also be removed. In some embodiments, only the dummy gates 72 are removed and the dummy dielectric layer 60 remains and is exposed by the recesses 86. In some embodiments, the dummy gates 72 are removed by an anisotropic dry etch process. For example, the etch process may include a dry etch process using reaction gas(es) that selectively etch the dummy gates 72 with little or no etching of the first ILD 84, the CESL 82, the gate seal spacers 76, or the gate spacers 78. Each recess 86 exposes and/or overlies a channel region 58 of a respective fin 52. Each channel region 58 is disposed between neighboring pairs of the epitaxial source/drain regions 80N and 80P. During the removal, the dummy dielectric layer 60 may be used as an etch stop layer when the dummy gates 72 are etched. The dummy dielectric layer 60 may then be optionally removed after the removal of the dummy gates 72.

Figure 15A:
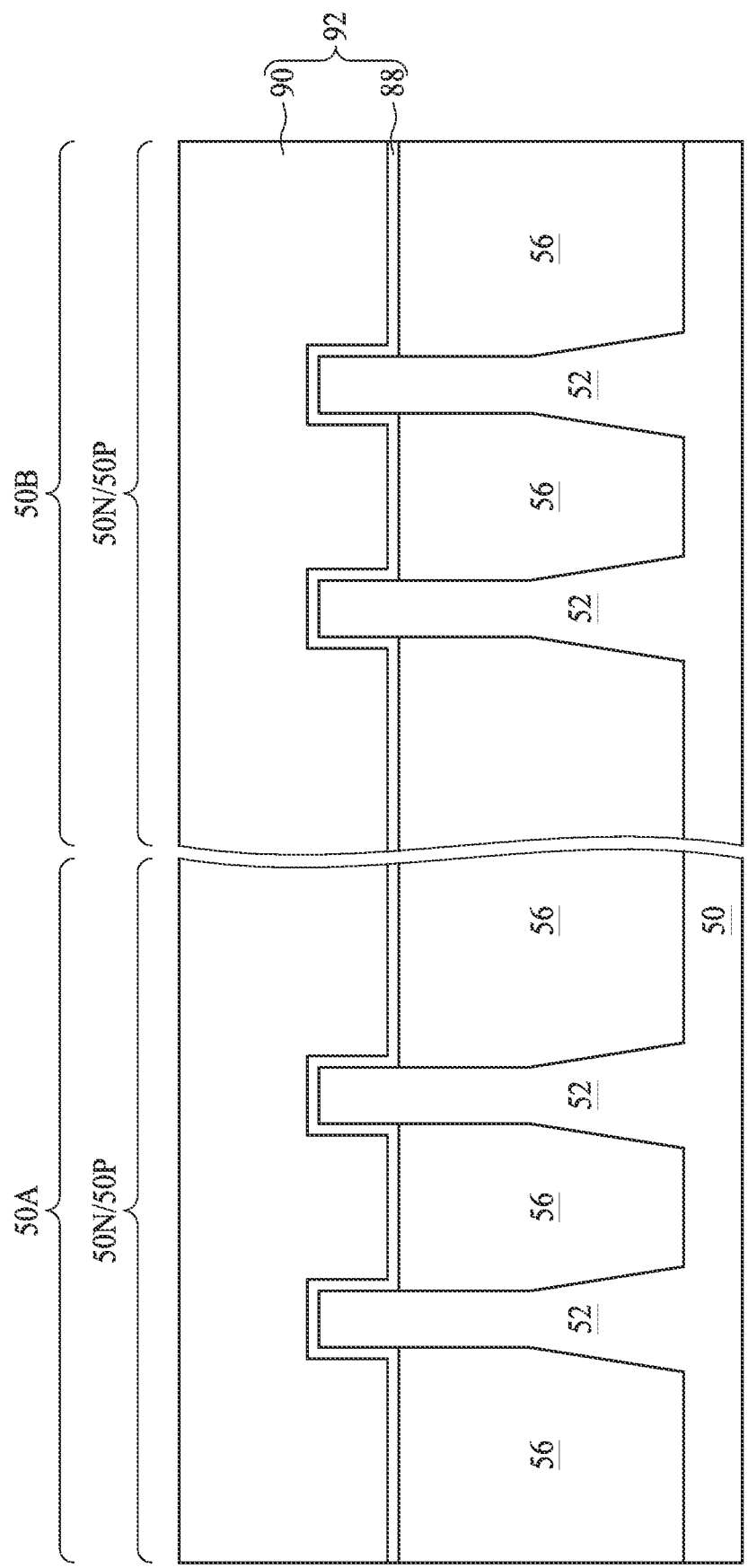
Figure 15B:
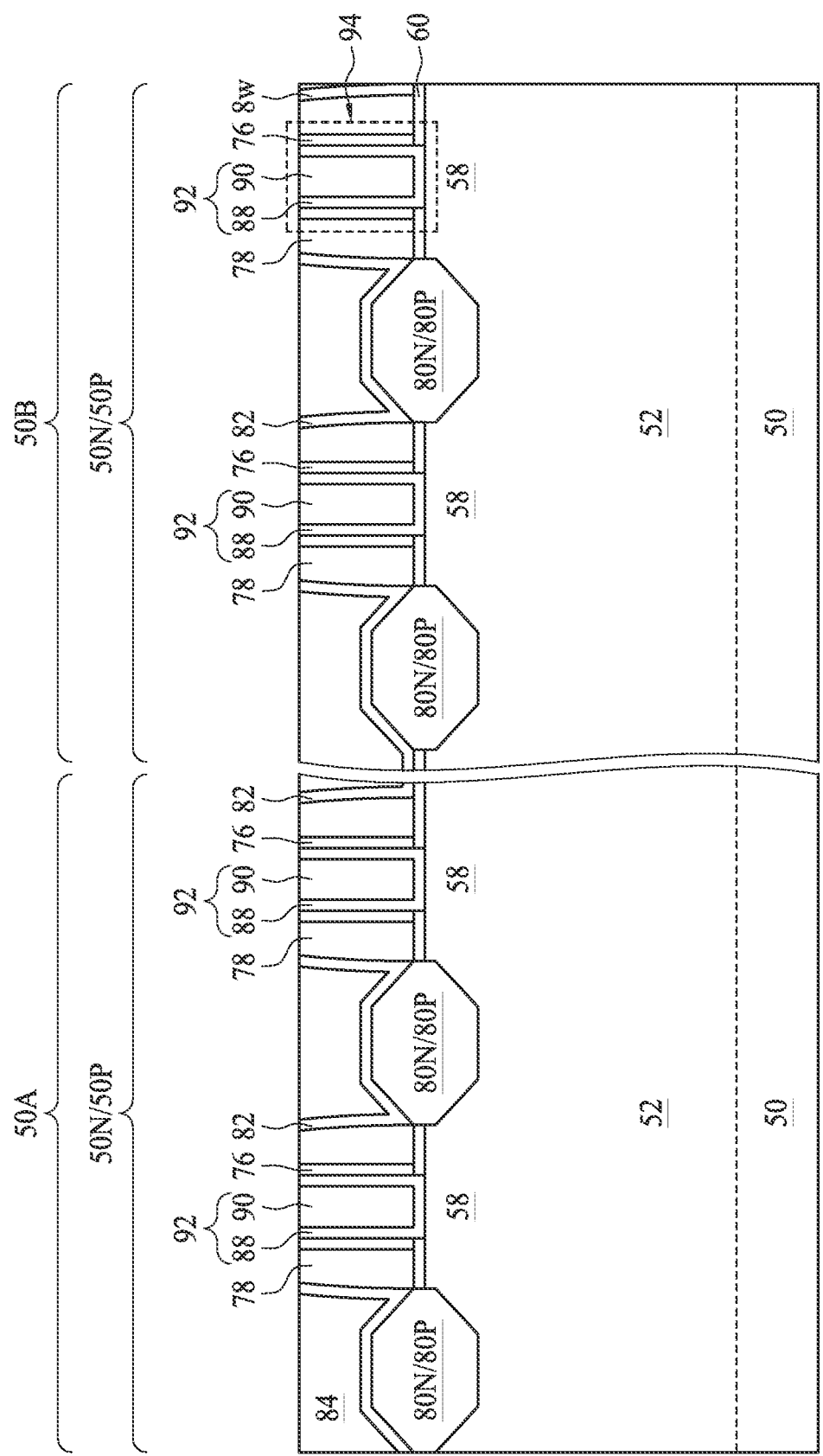
Figure 15C:
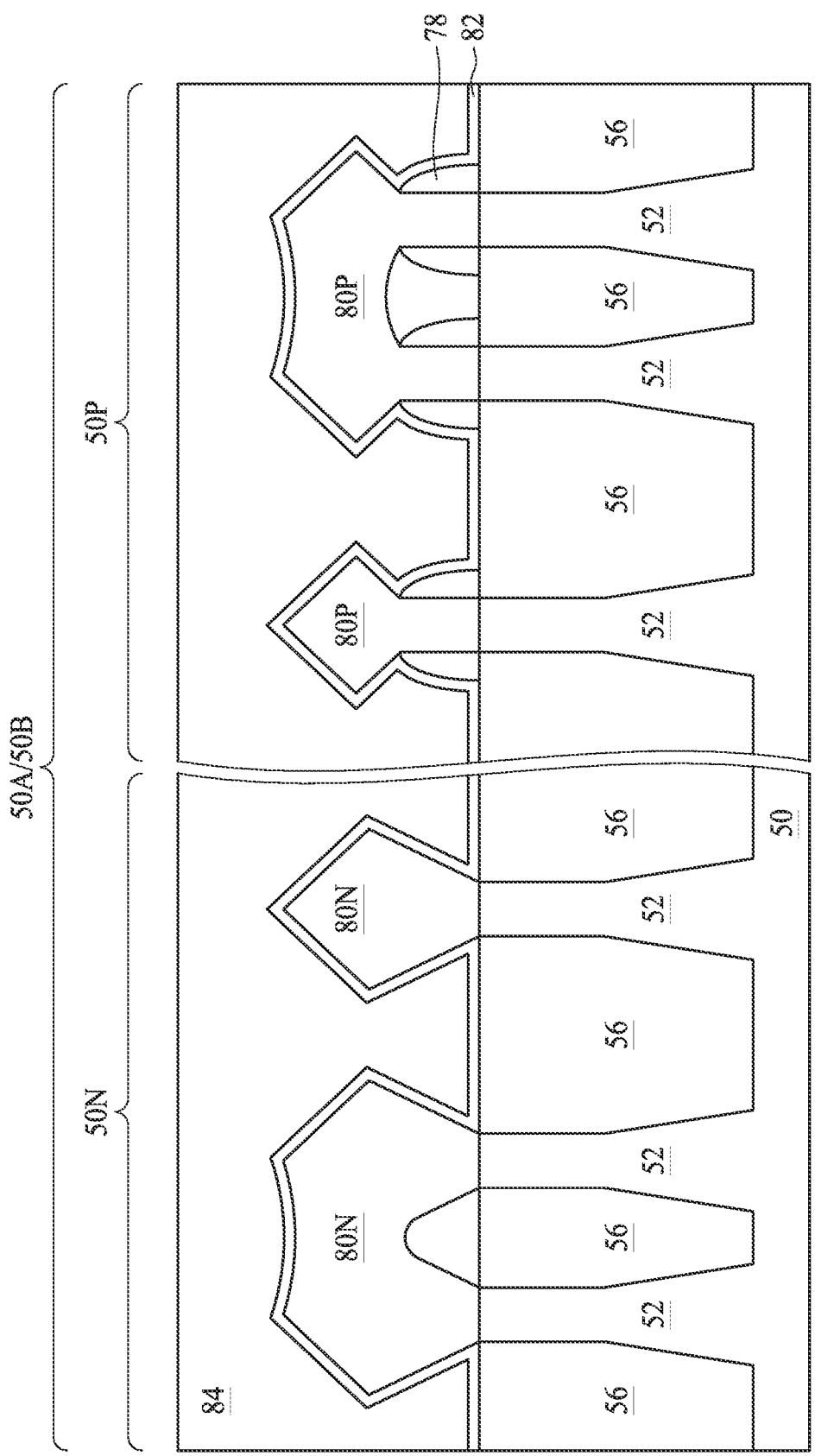
Figure 15D:
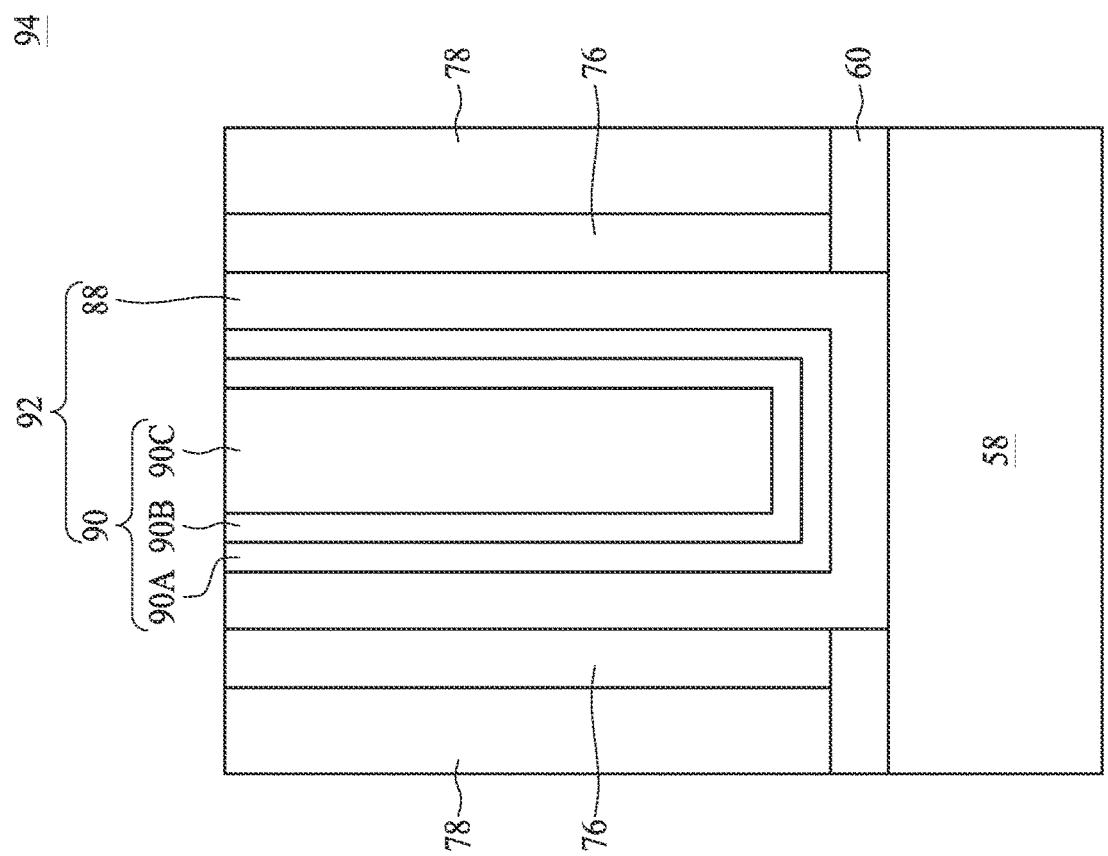

In FIGS. 15A, 15B and 15C, gate dielectric layers 88 and gate electrodes 90 are formed in the recesses 86 (see FIGS. 14A, 14B and 14C) to form replacement gate stacks 92. FIG. 15D illustrates a detailed view of a region 94 of FIG. 15B. The replacement gate stacks 92 may be also referred to as gate stacks or metal gate stacks. In some embodiments, all of the dummy gates 72 (see FIGS. 13A and 13B) are replaced with the replacement gate stacks 92. In other embodiments, some of the dummy gates 72 are not replaced by the replacement gate stacks 92 and remain in the final structure of the resulting FinFET device.

In some embodiments, the gate dielectric layers 88 are deposited in the recesses 86, such as on the top surfaces and the sidewalls of the fins 52 and on sidewalls of the gate seal spacers 76/gate spacers 78. The gate dielectric layers 88 may also be formed on the top surface of the first ILD 84. In some embodiments, the gate dielectric layers 88 comprise one or more dielectric layers, such as one or more layers of silicon oxide, silicon nitride, metal oxide, metal silicate, or the like. In some embodiments, the gate dielectric layers 88 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, or combinations thereof. The high-k dielectric material may have a k value greater than about 7.0. The formation methods of the gate dielectric layers 88 may include Molecular-Beam Deposition (MBD), ALD, PECVD, or the like. In embodiments where portions of the dummy dielectric layer 60 remains in the recesses 86, the gate dielectric layers 88 include a material of the dummy dielectric layer 60 (e.g., $SiO_2$).

The gate electrodes 90 are deposited over the gate dielectric layers 88 and fill the remaining portions of the recesses 86 (see FIGS. 14A and 14B). Although single layer gate electrodes 90 are illustrated in FIGS. 15A and 15B, each of the gate electrodes 90 may comprise any number of liner layers 90A, any number of work function tuning layers 90B, and a conductive fill layer 90C as illustrated by FIG. 15D. The liner layers 90A may include TiN, TiO, TaN, TaC, combinations thereof, multi-layers thereof, or the like, and may be formed using PVD, CVD, ALD, a combination thereof, or the like. In the n-type regions 50N of the substrate 50, the work function tuning layers 90B may include Ti, Ag, Al, TiAl, TiAlN, TiAlC, TaC, TaCN, TaSiN, TaAlC, Mn, Zr, combinations thereof, multi-layers thereof, or the like, and may be formed using PVD, CVD, ALD, a combination thereof, or the like. In the p-type regions 50P of the substrate 50, the work function tuning layers 90B may include TiN, WN, TaN, Ru, Co, combinations thereof, multi-layers thereof, or the like, and may be formed using PVD, CVD, ALD, a combination thereof, or the like. In some embodiments, the conductive fill layer 90C may comprise Co, Ru, Al, Ag, Au, W, Ni, Ti, Cu, Mn, Pd, Re, Ir, Pt, Zr, alloys thereof, combinations thereof, multi-layers thereof, or the like, and may be formed using PVD, CVD, ALD, a combination thereof, or the like.

After the filling of the recesses 86 (see FIGS. 14A and 14B), a planarization process, such as a CMP process, may be performed to remove excess portions of the gate dielectric layers 88 and the gate electrodes 90, which excess portions are over the top surface of the first ILD 84. The remaining portions of the gate electrodes 90 and the gate dielectric layers 88 thus form replacement gate stacks 92 of the resulting FinFETs. After the planarization process, top surfaces of the replacement gate stacks 92 are substantially level or coplanar with the top surface of the first ILD 84 within process variations of the planarization process.

The formation of the gate dielectric layers 88 in the n-type regions 50N and the p-type regions 50P of the substrate 50 may occur simultaneously such that the gate dielectric layers 88 in each region are formed of the same materials. In other embodiments, the gate dielectric layers 88 in each region may be formed by distinct processes such that the gate dielectric layers 88 in different regions may be formed of different materials. The formation of the conductive fill layers 90C in the n-type regions 50N and the p-type regions 50P of the substrate 50 may occur simultaneously such that the conductive fill layers 90C in each region are formed of the same materials. In other embodiments, the conductive fill layers 90C in each region may be formed by distinct processes such that the conductive fill layers 90C in different regions may be formed of different materials. Various masking steps may be used to mask and expose appropriate regions when using distinct processes.

Figure 16A:
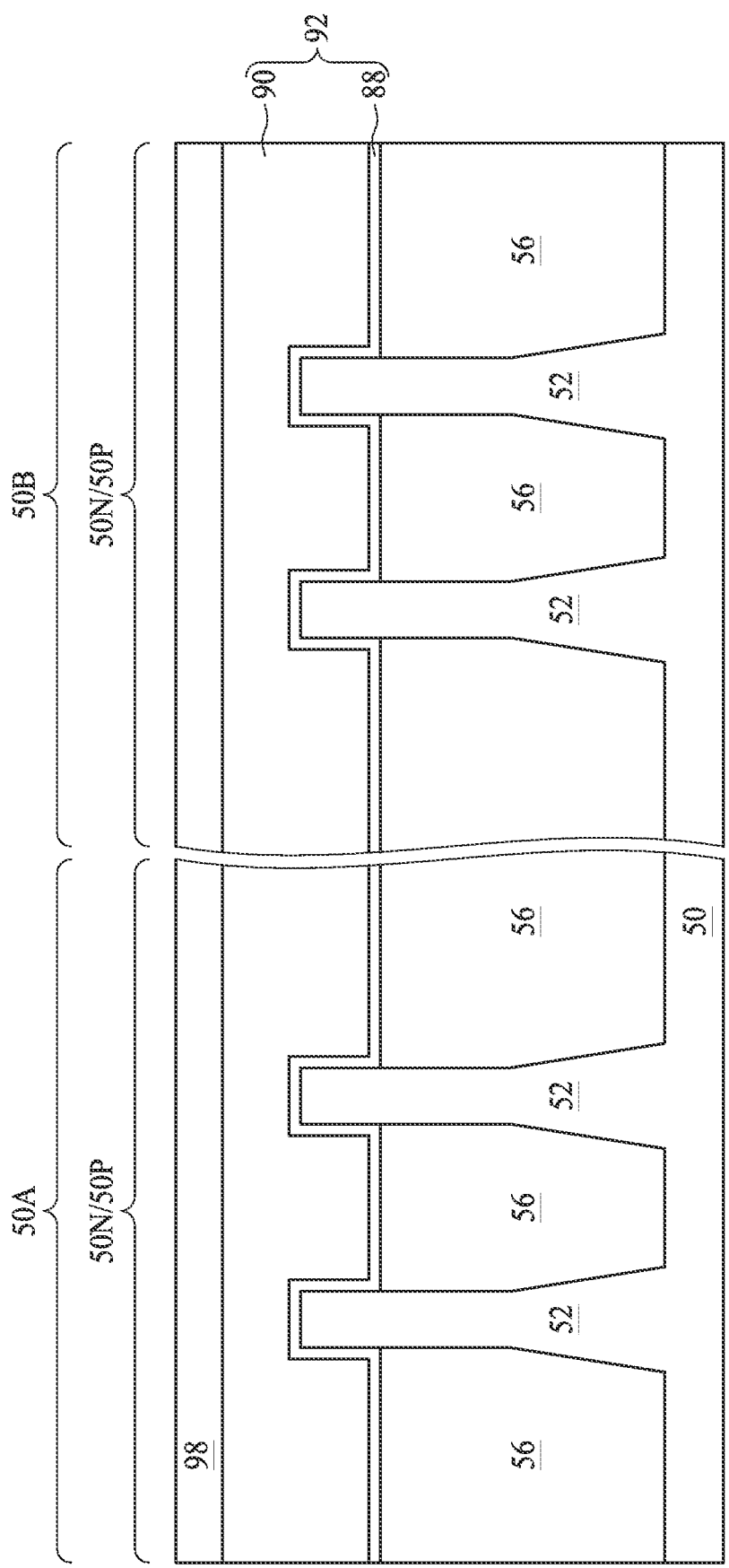
Figure 16B:
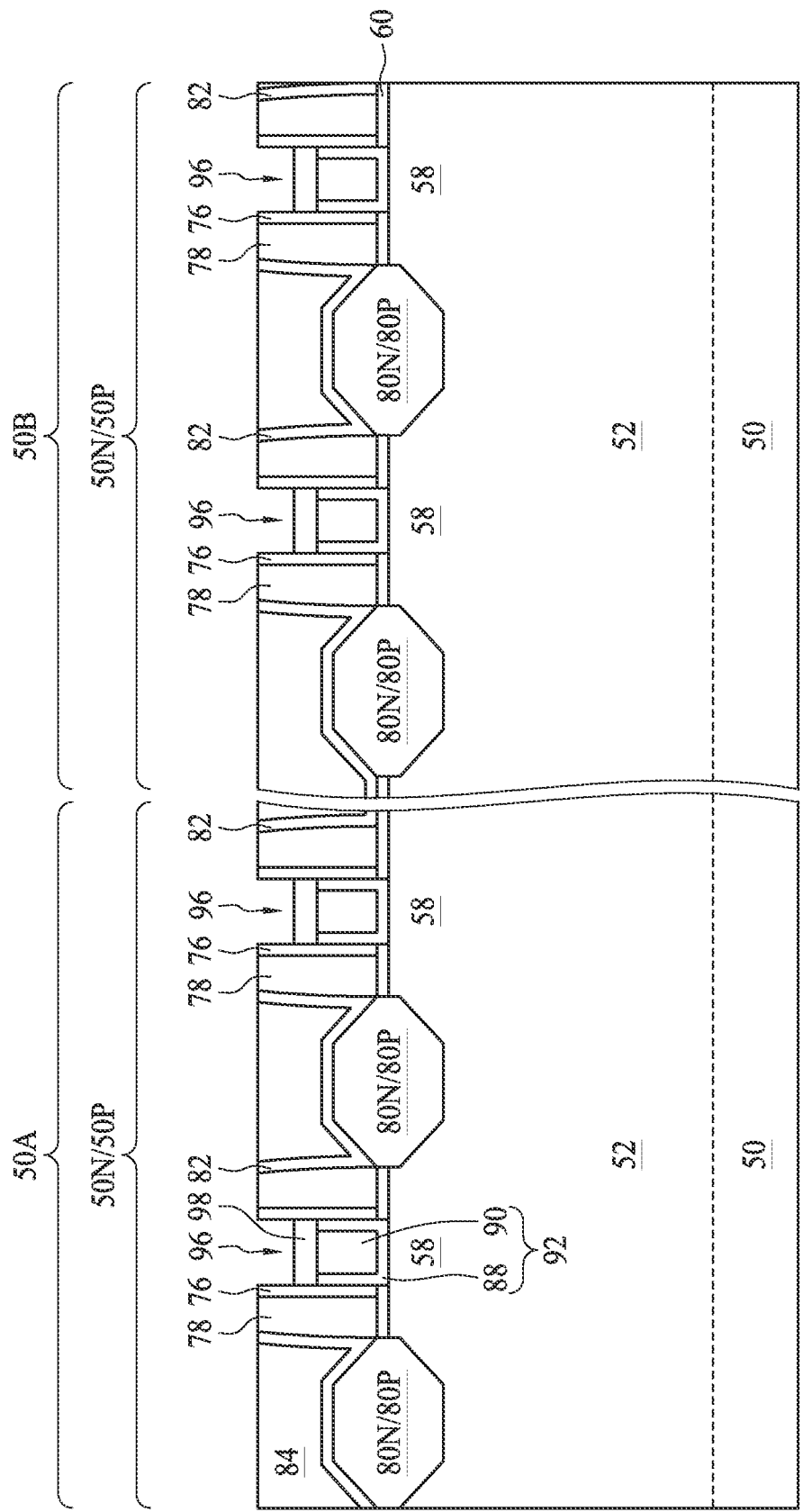
Figure 16C:
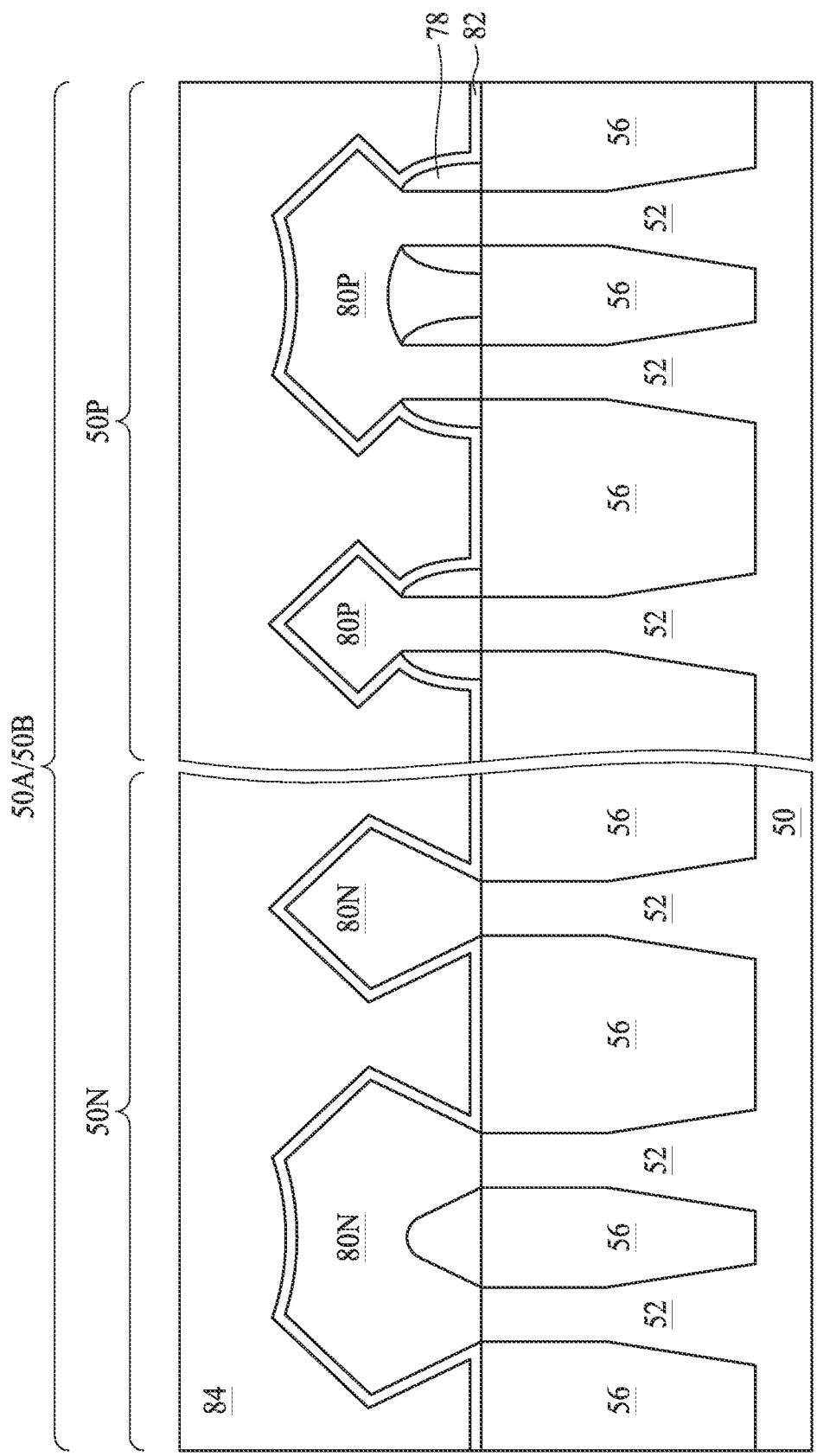

In FIGS. 16A, 16B and 16C, capping layers 98 are formed over the gate stacks 92 and between opposing portions of the gate seal spacers 76/gate spacers 78. In some embodiments, forming the capping layers 98 includes recessing the gate stacks 92 so that recesses 96 are formed directly over the gate stacks 92 and between opposing portions of gate seal spacers 76/gate spacers 78. The capping layers 98 are then formed in respective recesses 96. In some embodiments, the capping layers 98 partially fill the respective recesses 96. In some embodiments, the capping layers 98 are metal layers and comprise tungsten, cobalt, molybdenum, ruthenium, or the like. In other embodiments, the capping layers 98 are metal nitride layers and comprise TiN, TaN, WN, or the like. In some embodiments, a material of the capping layers 98 are selectively deposited over respective gate stacks 92 in respective recesses 96 until the desired thickness of the capping layers 98 is achieved. In other embodiments, a material of the capping layers 98 are deposited over respective gate stacks 92 such that the material fully fills respective recesses 96. In such embodiments, after filling the recesses 96, the material of the capping layers 98 is planarized to remove portions of the material overfilling the recesses 96 and is subsequently recessed, for example, by an appropriate etch process until the desired thickness of the capping layers 98 is achieved. In some embodiments, the capping layers 98 have a thickness between about 10 Å and about 100 Å.

Figure 17A:
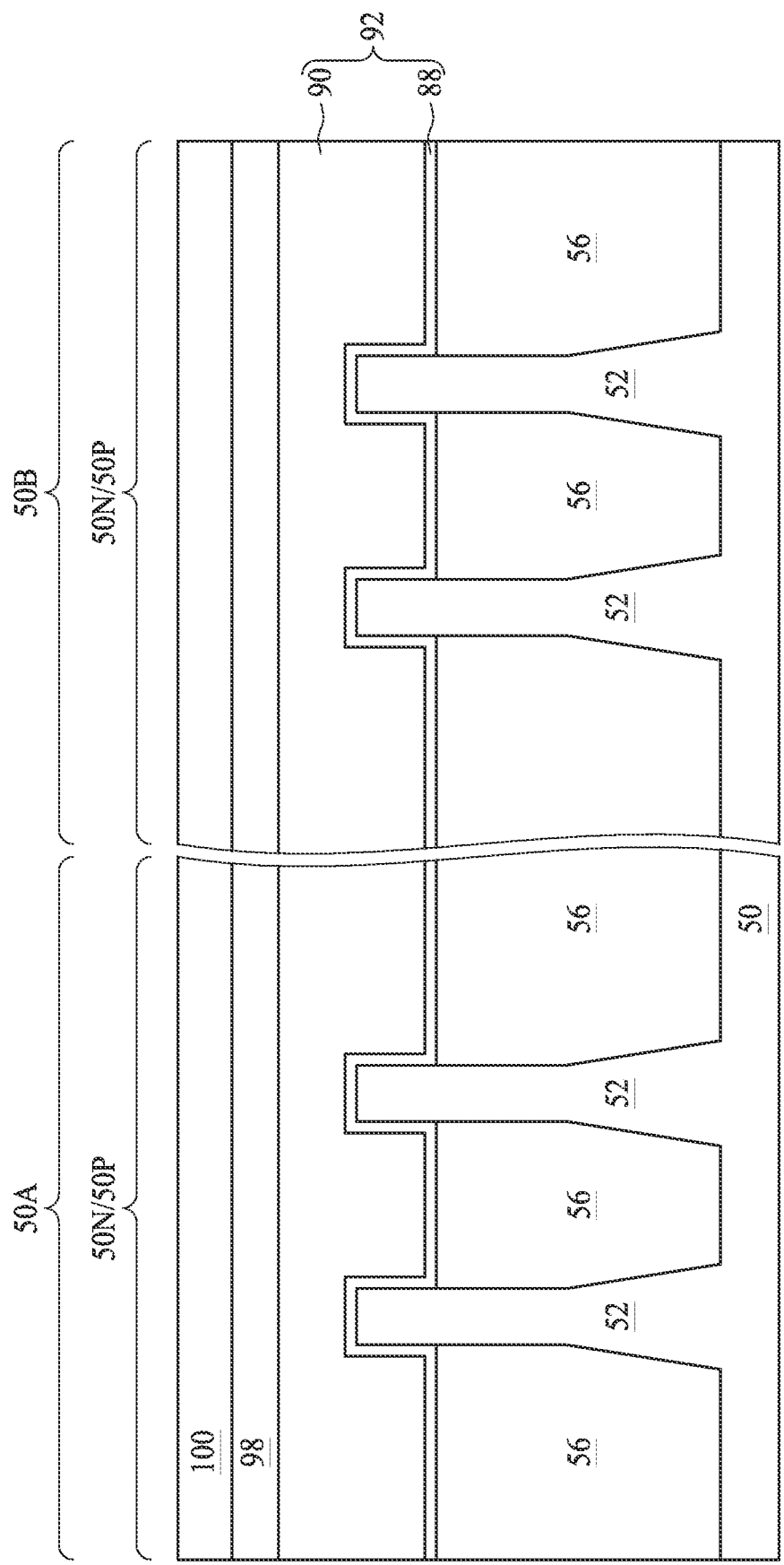
Figure 17B:
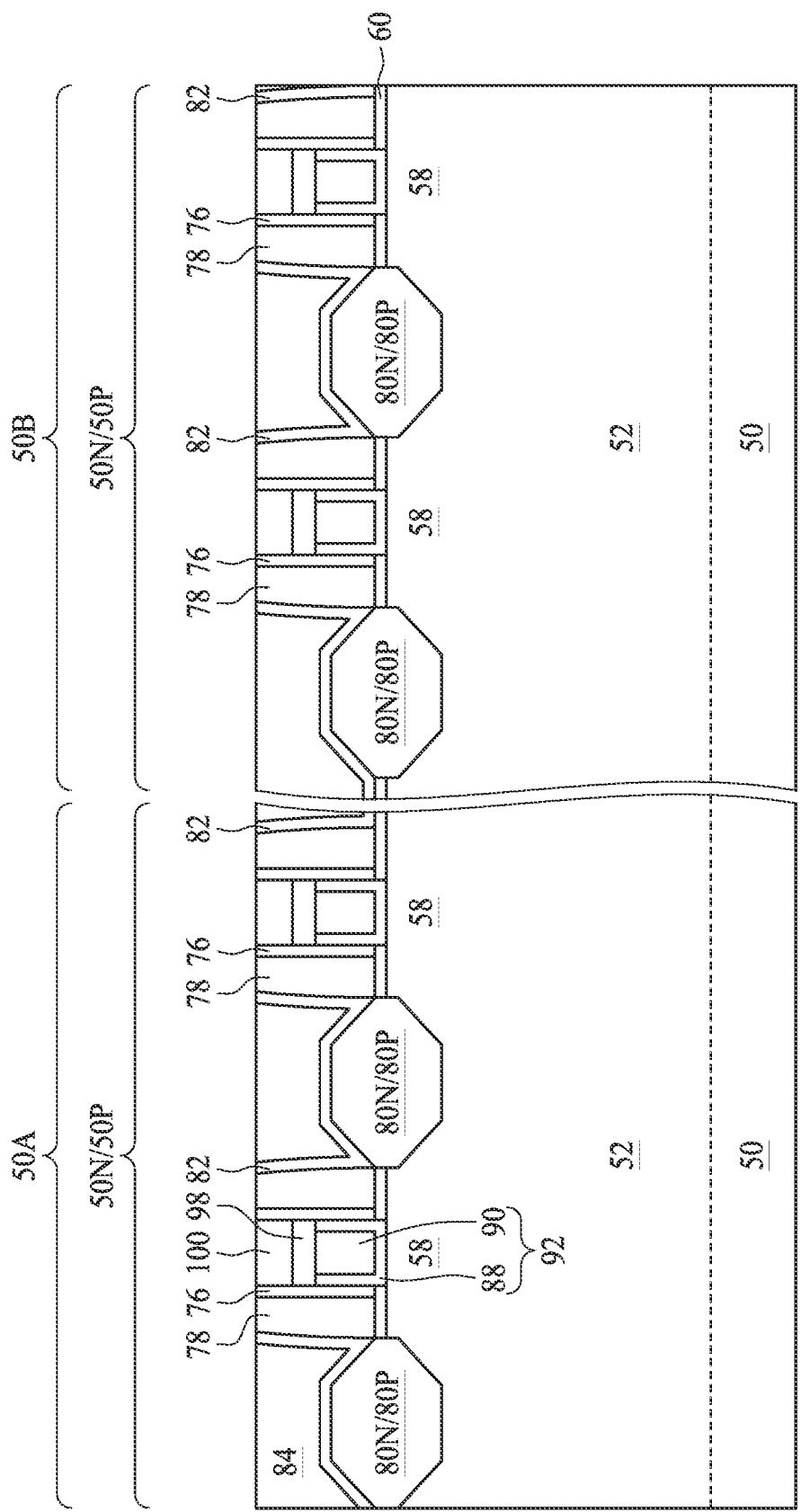
Figure 17C:
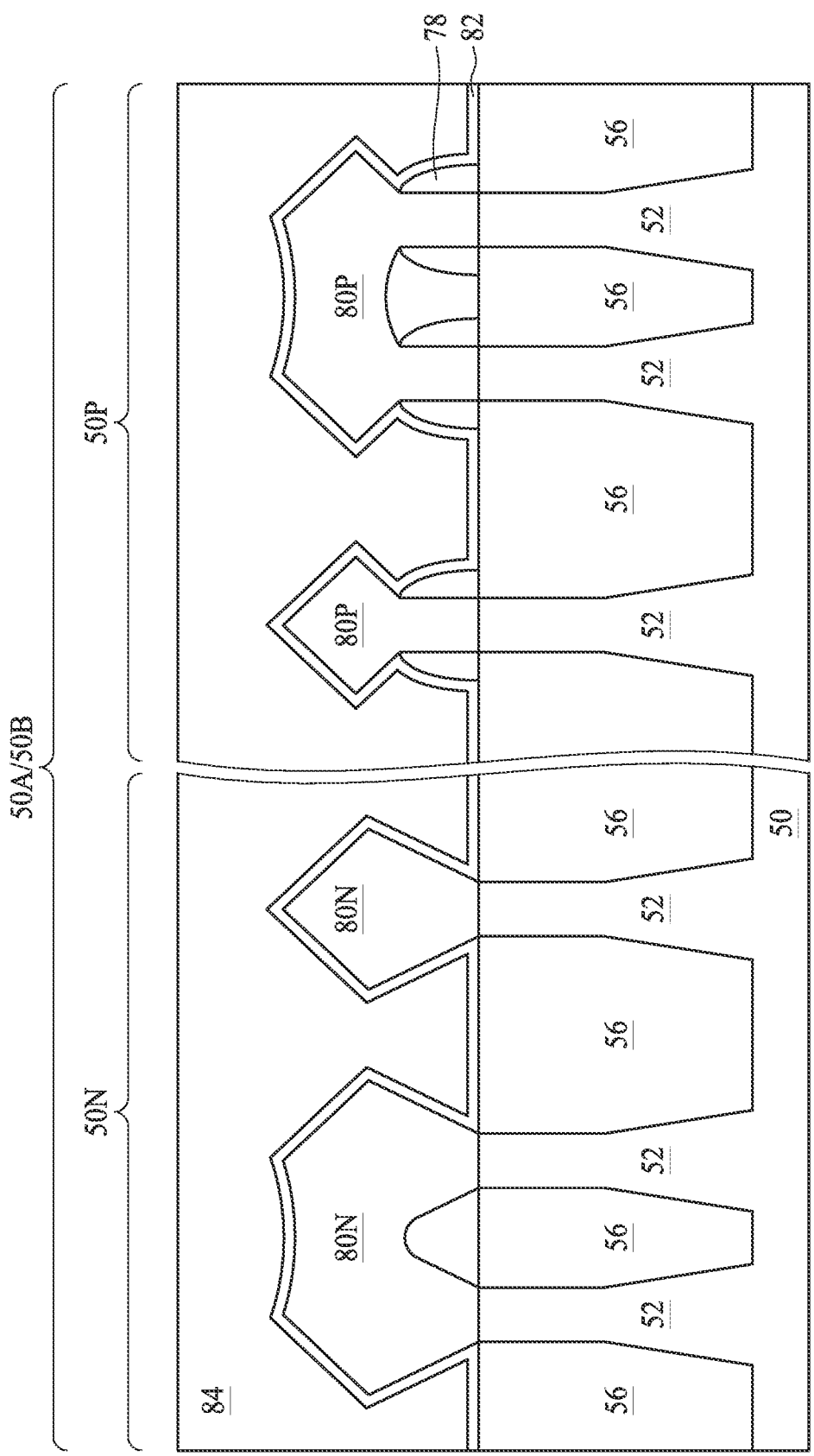

In FIGS. 17A, 17B and 17C, gate masks 100 are formed over the capping layers 98 and in the recesses 96 (see FIG. 16B). The gate masks 100 comprising one or more layers of dielectric material, such as silicon oxide, silicon nitride, silicon oxynitride, or the like, are filled in the recesses 96, followed by a planarization process to remove excess portions of the dielectric material extending over the first ILD 84. After the planarization process, top surfaces of the gate masks 100 are substantially level or coplanar with the top surface of the first ILD 84 within process variations of the planarization process.

Figure 18A:
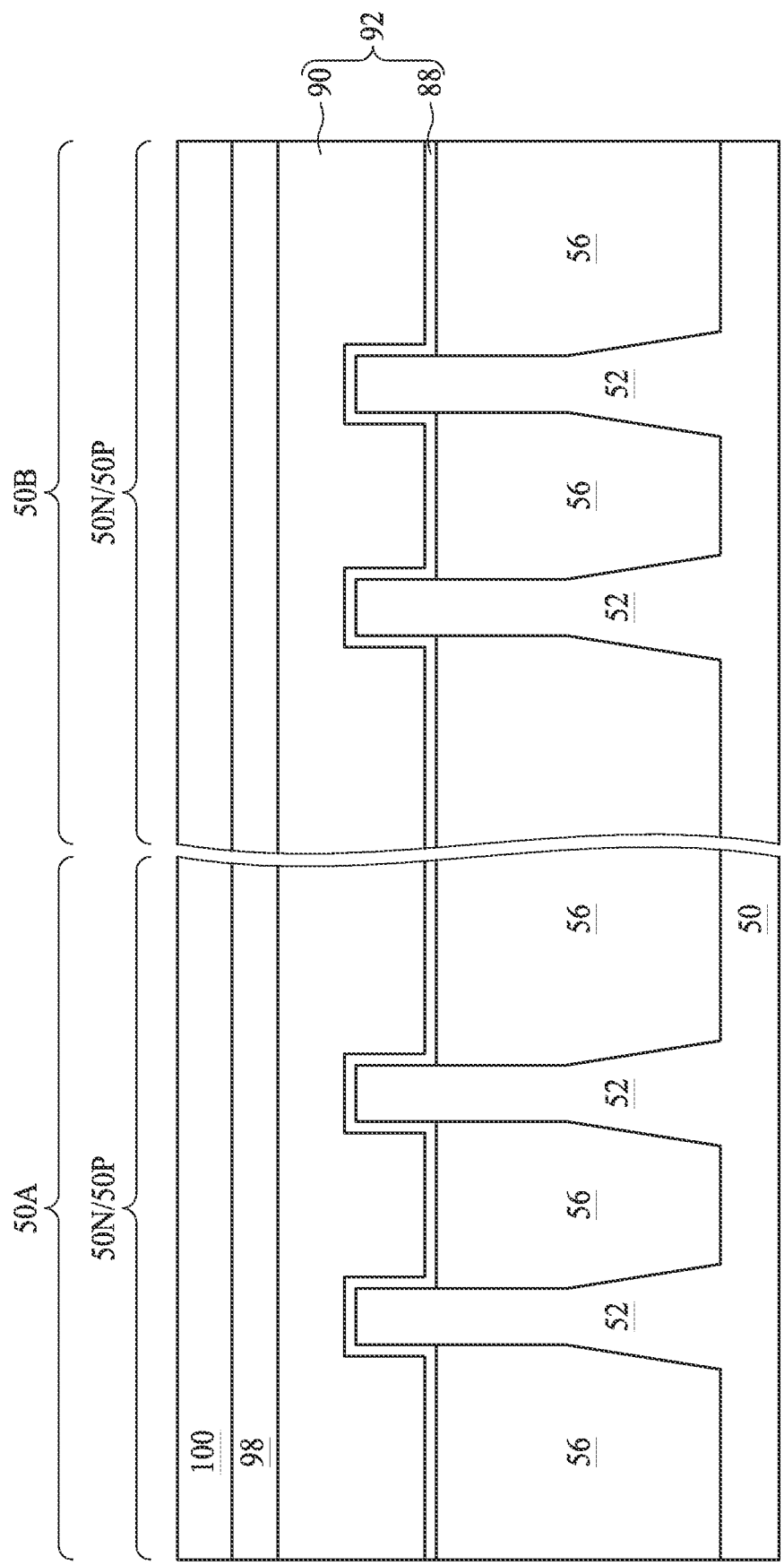
Figure 18B:
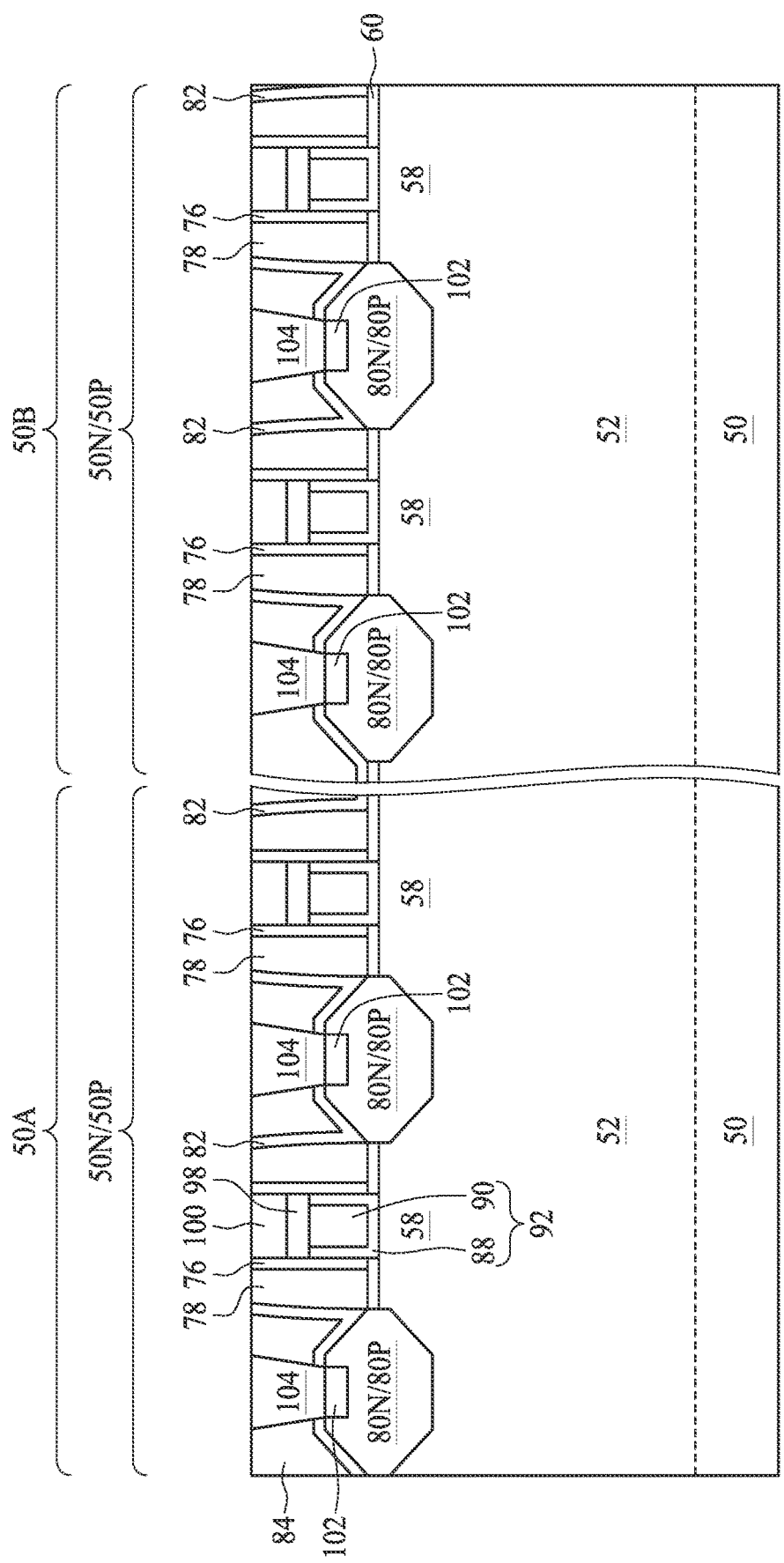
Figure 18C:
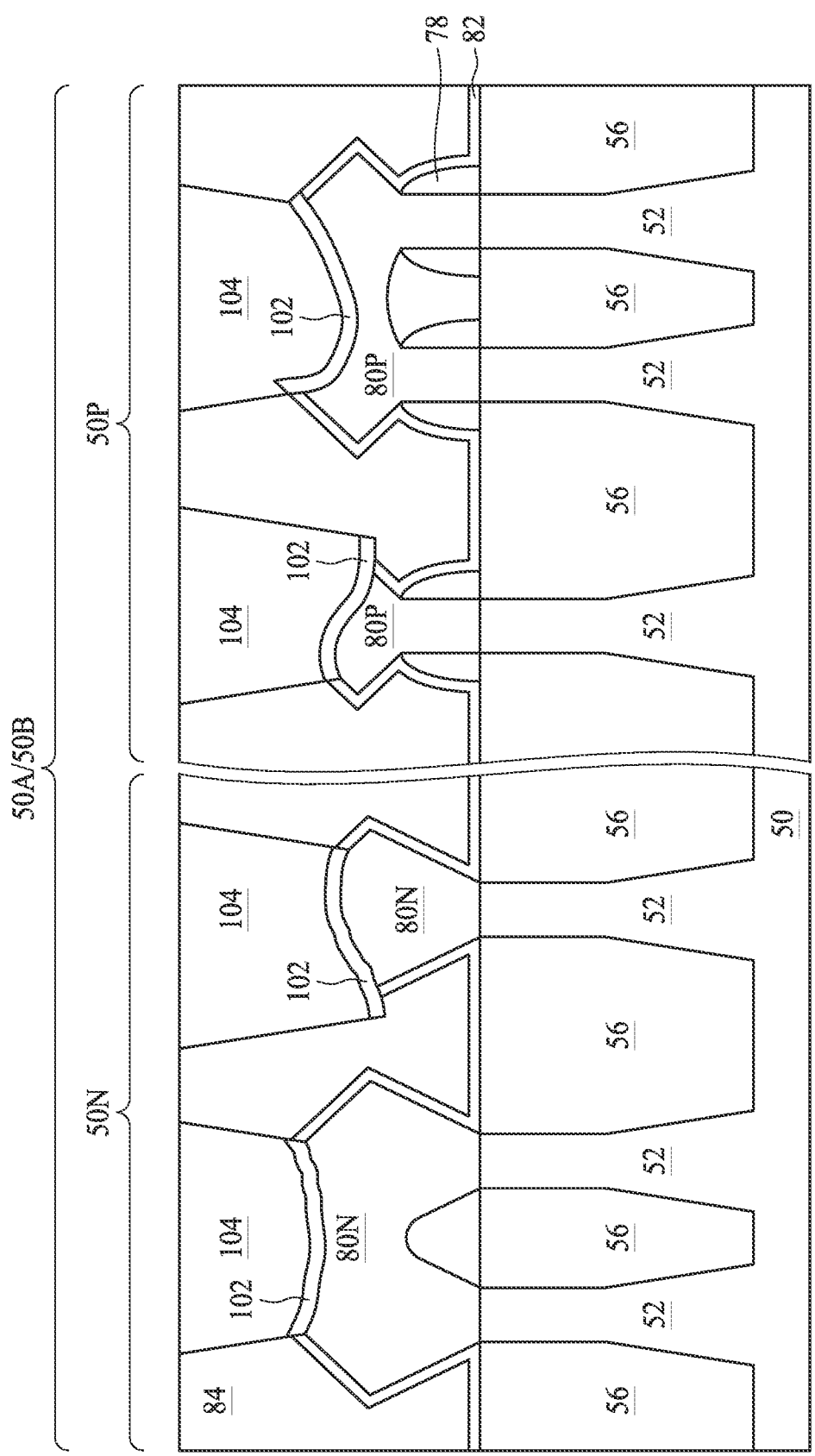

In FIGS. 18A, 18B and 18C, contact features 104 are formed in the first ILD 84 and in electrical contact with respective epitaxial source/drain regions 80N and 80P. The contact features 104 may be also referred to as source/drain contacts or source/drain contact plugs. Openings for the contact features 104 are formed through the CESL 82 and the first ILD 84. In some embodiments, the openings may also extend into respective epitaxial source/drain regions 80N and 80P. The openings may be formed using acceptable photolithography and etch techniques. The etch may be anisotropic.

In some embodiments, after forming the openings, silicide layers 102 are formed over the epitaxial source/drain regions 80N and 80P in the openings. After forming the silicide layers 102, the contact features 104 are formed over the silicide layers 102 in the openings. In some embodiments, the silicide layers 102 and the contact features 104 are formed as described below with reference to FIGS. 21A-32A and 21B-32B, and the detailed description is provided at that time.

Figure 19A:
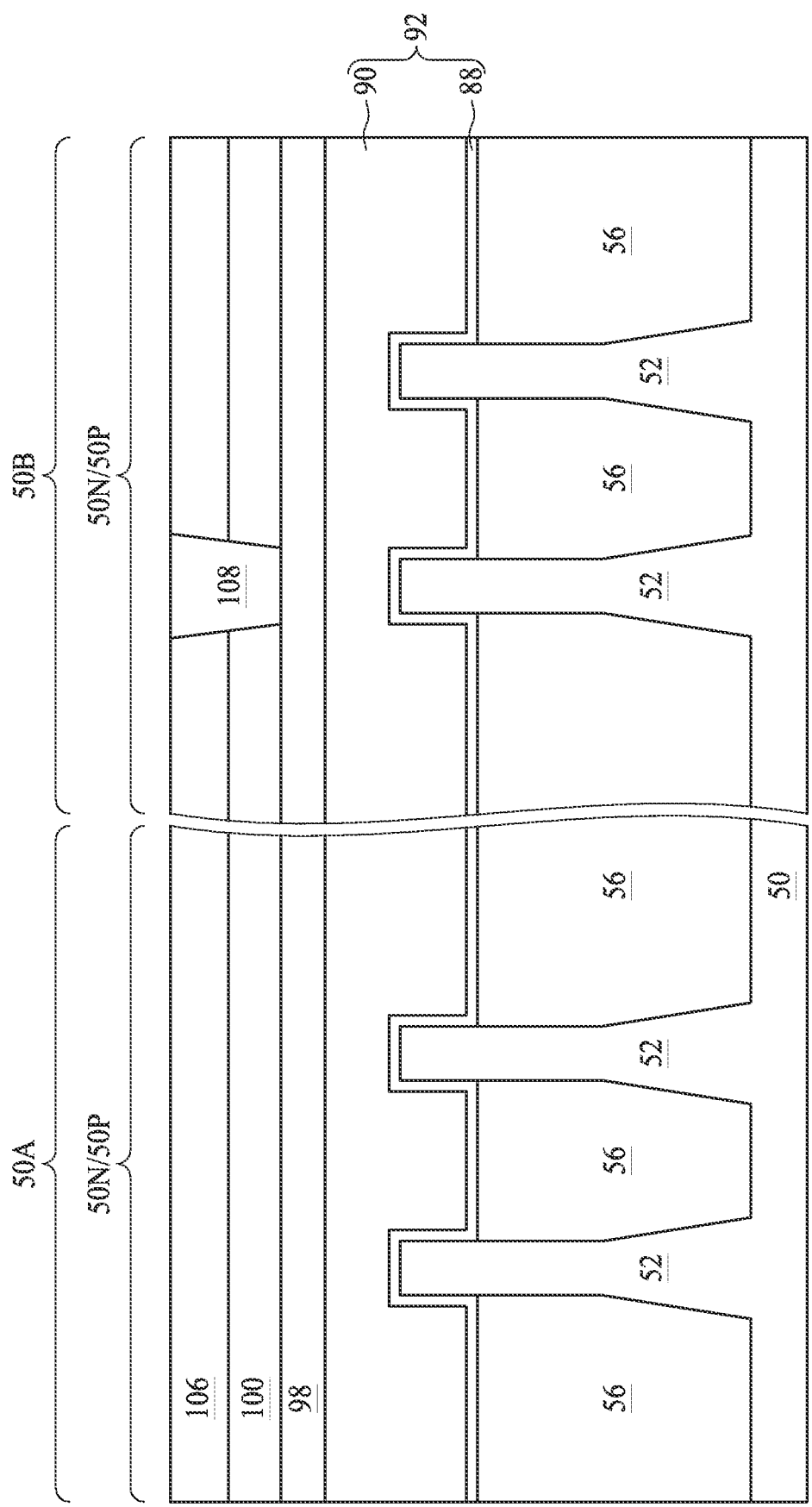
Figure 19B:
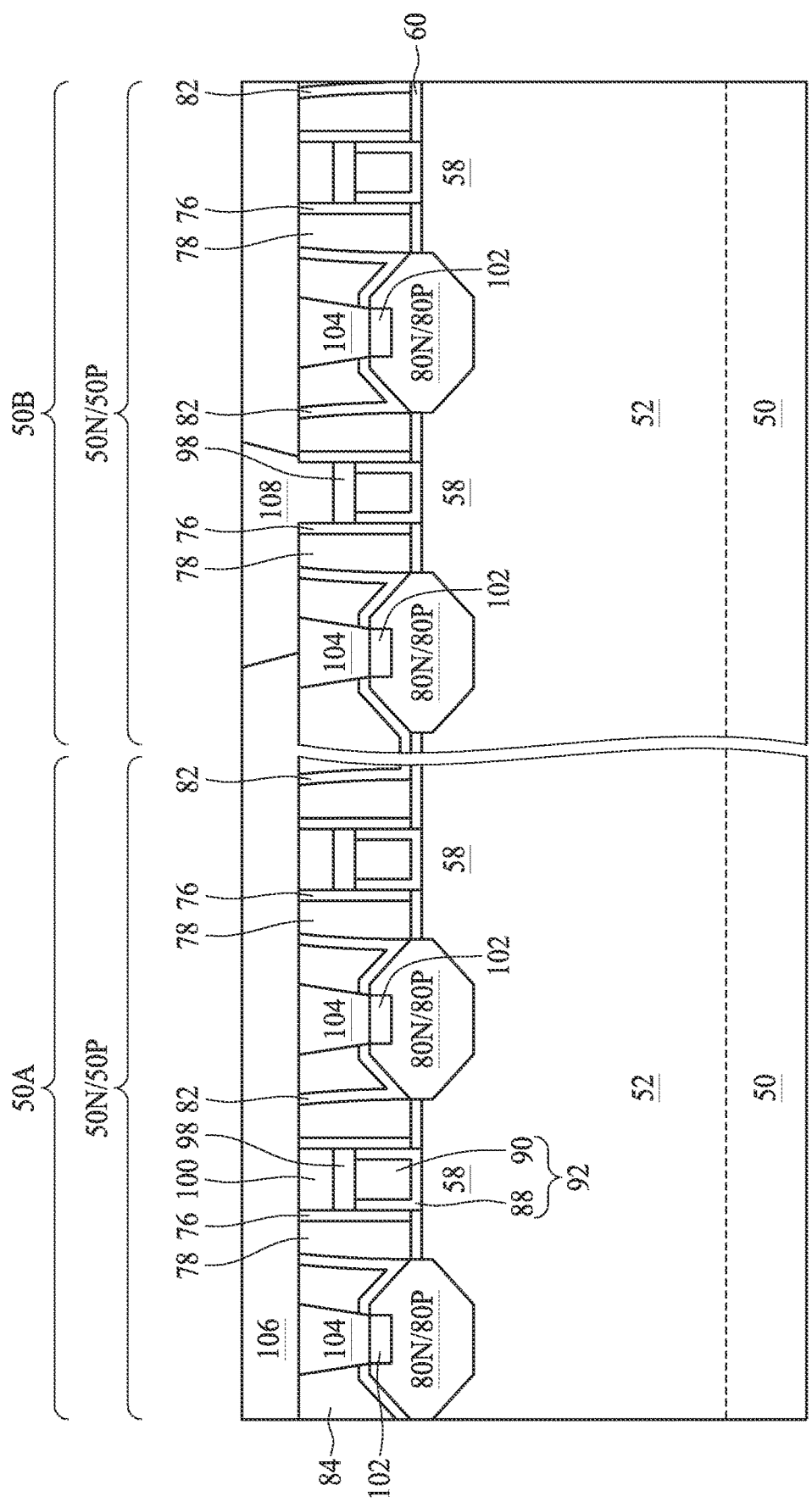
Figure 19C:
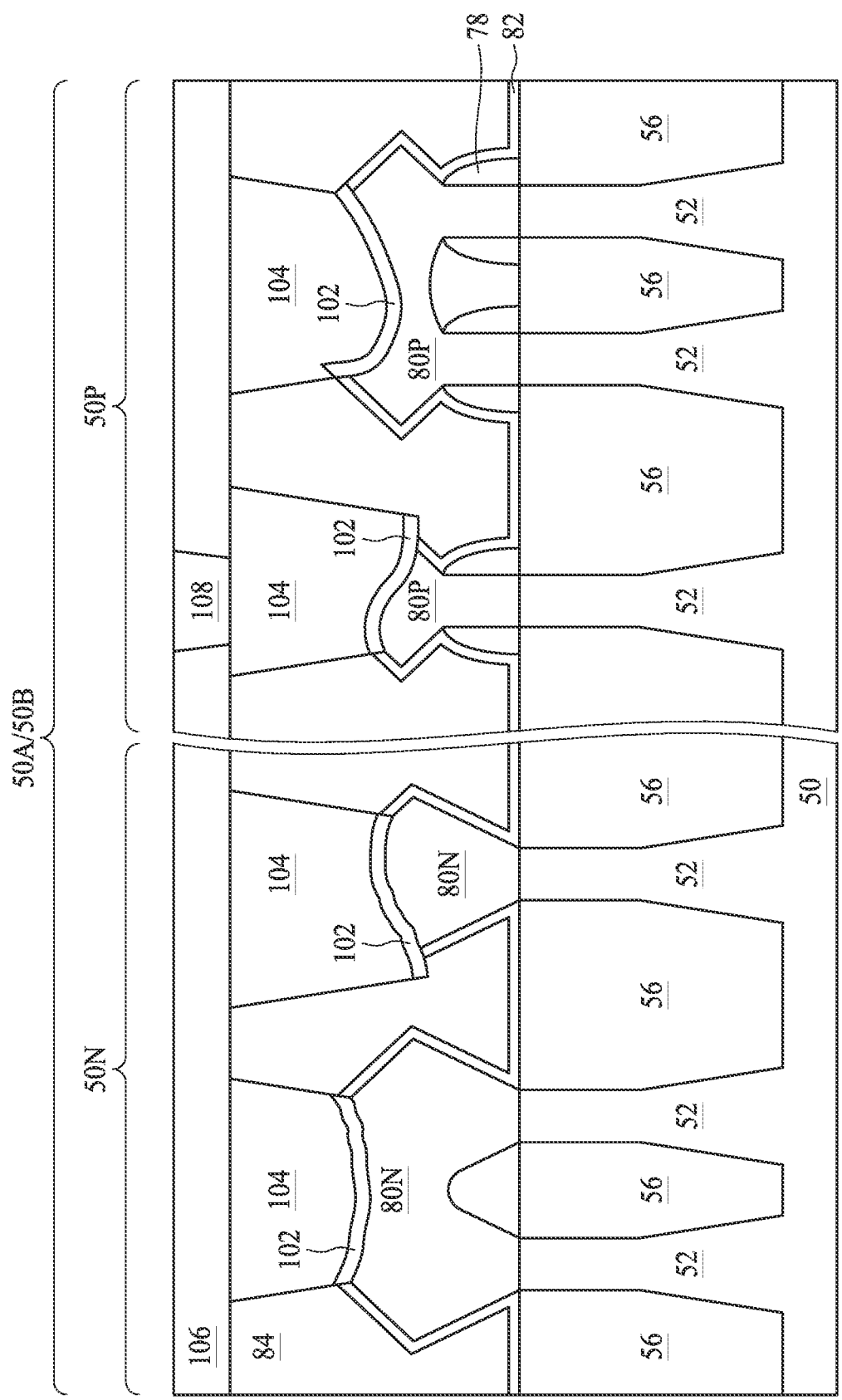

In FIGS. 19A, 19B and 19C, an etch stop layer (ESL) 106 is formed over the first ILD 84, the gate stacks 92 and the contact features 104. In some embodiments, the ESL 106 may be formed using similar materials and methods as the CESL 82 described above with reference to FIGS. 12A, 12B and 12C, and the description is not repeated herein.

After forming the ESL 106, the contact feature 108 is formed in the ESL 106 in the second region 50B and in electrical contact with a respective contact feature 104 and a respective capping layer 98. The contact feature 108 may be also referred to as a gate/drain contact or a gate/drain contact plug. In some embodiments, the contact feature 108 comprises an upper portion that extends through the ESL 106 and electrically contacts a respective contact feature 104, and a lower portion that extends between opposing portions of gate seal spacers 76/gate spacers 78 and electrically contacts a respective capping layer 98. In some embodiments, the contact feature 108 is formed as described below with reference to FIGS. 45-53, and the detailed description is provided at that time.

Figure 20A:
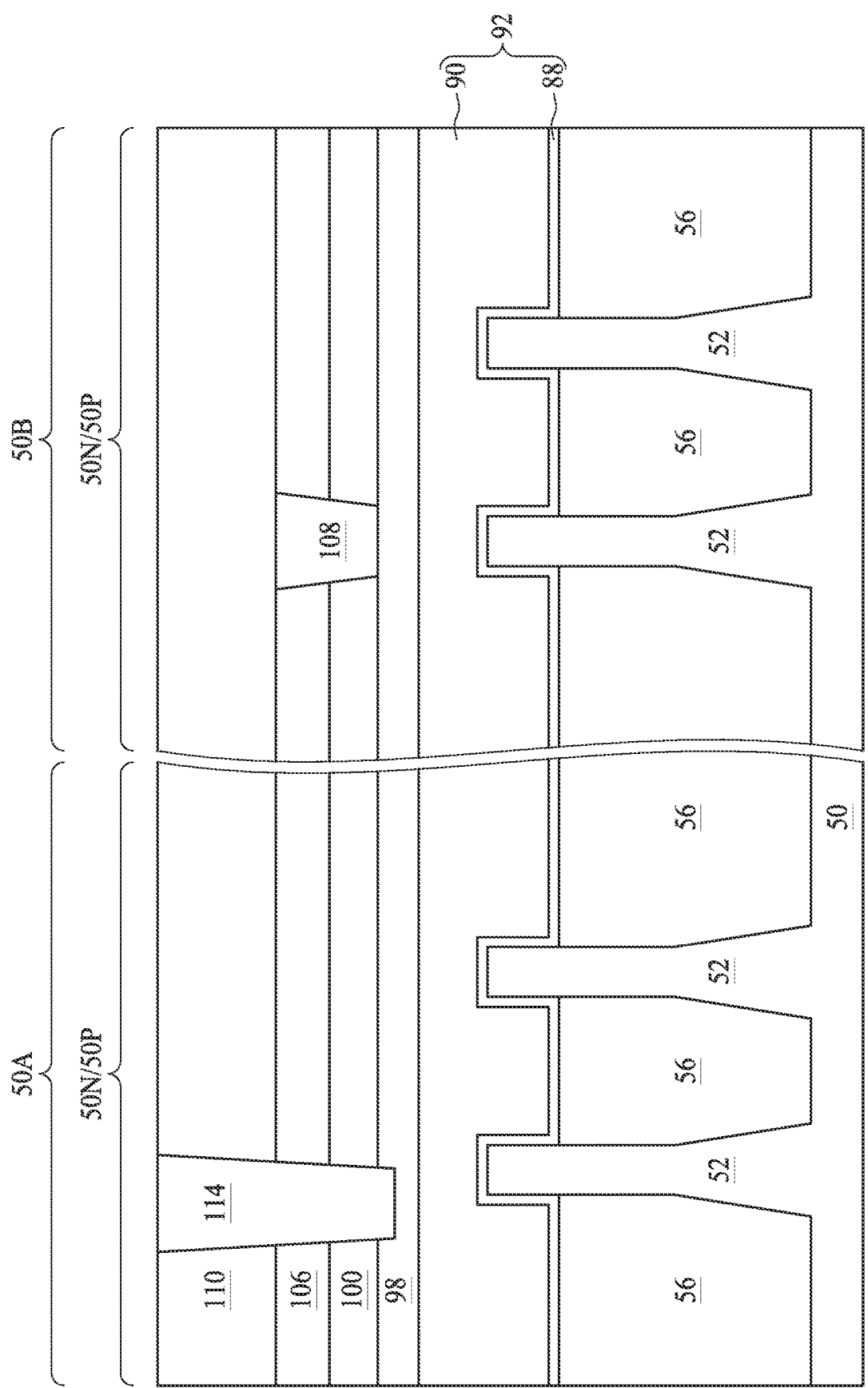
Figure 20B:
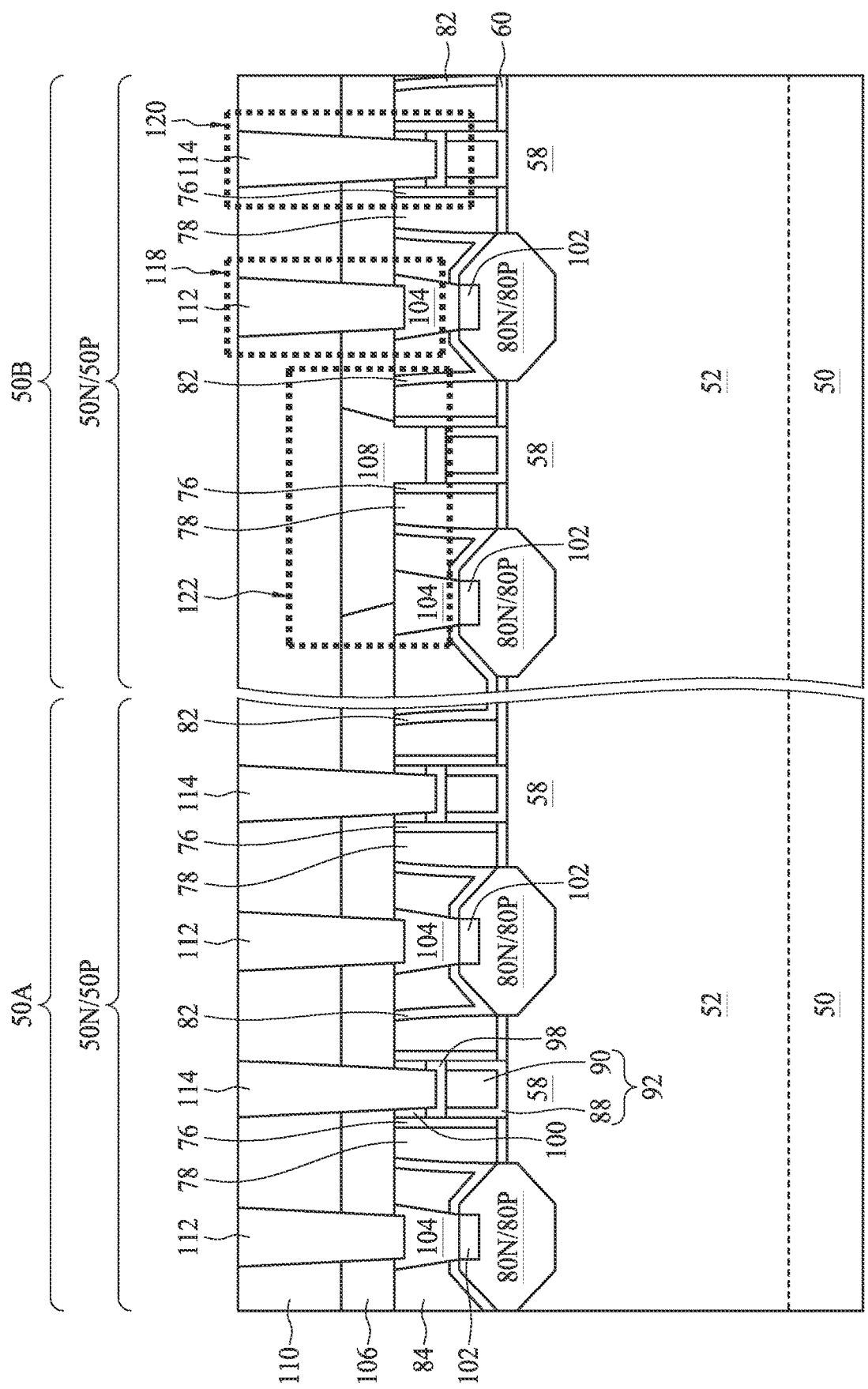
Figure 20C:
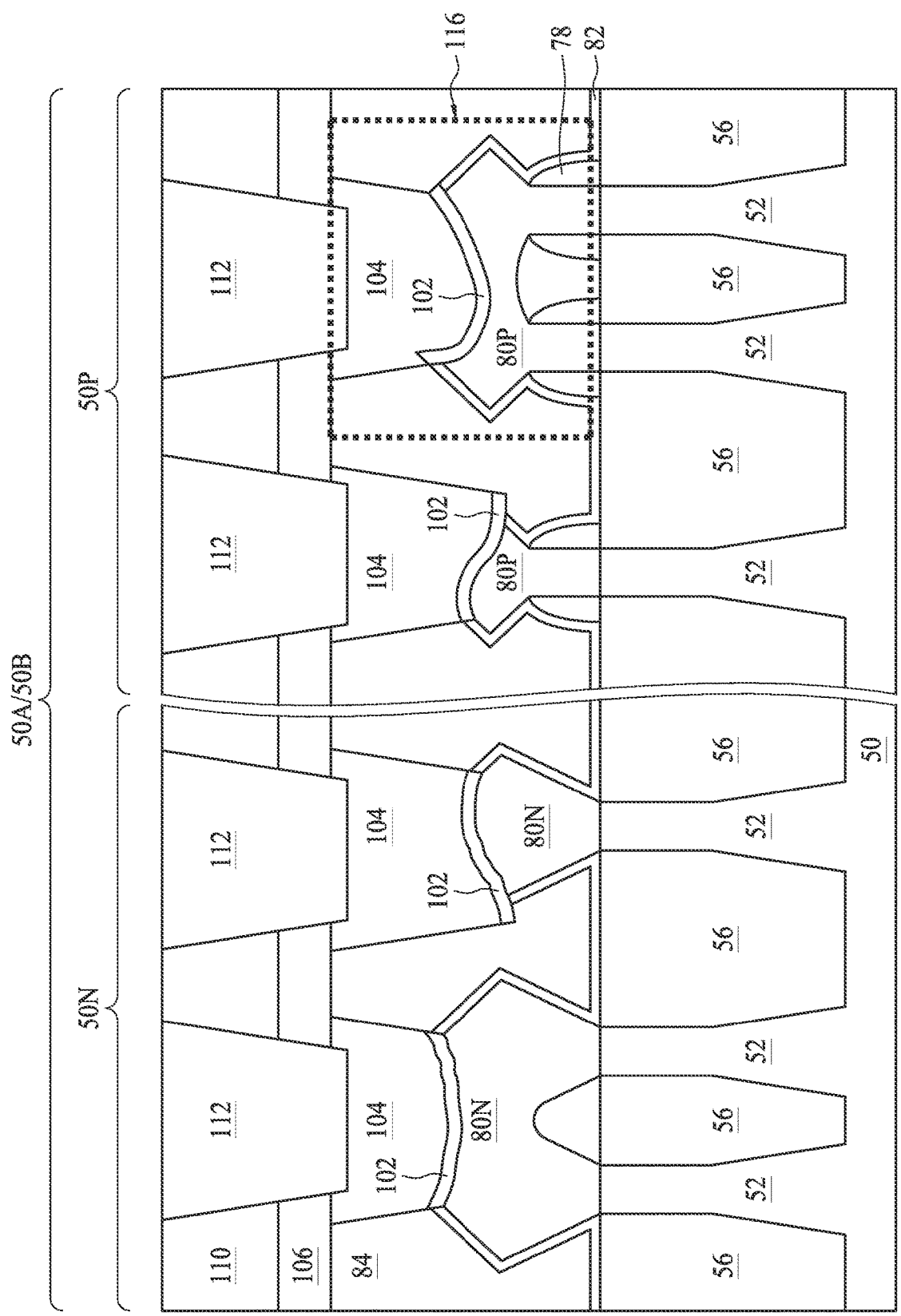

In FIGS. 20A, 20B and 20C, a second ILD 110 is formed over the ESL 106. In some embodiments, the second ILD 110 may be formed using similar materials and methods as the first ILD 84 described above with reference to FIGS. 12A, 12B and 12C, and the description is not repeated herein. In some embodiments, the first ILD 84 and the second ILD 110 comprise a same material. In other embodiments, the first ILD 84 and the second ILD 110 comprise different materials.

After forming the second ILD 110, contact features 112 and 114 are formed in both the first region 50A and the second region 50B. The contact features 112 extend through the ESL 106 and the second ILD 110, and electrically couple to respective contact features 104. The contact features 114 extend through respective gate masks 100, the ESL 106, and the second ILD 110, and electrically couple to respective capping layers 98. The contact features 112 may be also referred to as source/drain vias. The contact features 114 may be also referred to as gate contacts, gate contact plugs, or gate vias. In some embodiments, the contact features 112 extend into respective contact features 104. In some embodiments, the contact features 114 extend into respective capping layers 98.

Openings for the contact features 112 are formed in the second ILD 110 and the ESL 106, and expose respective contact features 104. Openings for the contact features 114 are formed in the second ILD 110, the ESL 106 and respective gate masks 100, and expose respective capping layers 98. The openings may be formed using acceptable photolithography and etch techniques. The etch may be anisotropic. After forming the openings, the contact features 112 and 114 are formed in respective openings. In some embodiments, the contact features 112 are formed as described below with reference to FIGS. 33-38, and the detailed description is provided at that time. In some embodiments, the contact features 114 are formed as described below with reference to FIGS. 39-44, and the detailed description is provided at that time.

FIGS. 21A-31A and 21B-31B are cross-sectional views of intermediate stages in the manufacturing of the contact feature 104 within a region 116 of FIG. 20C, in accordance with some embodiments. In particular, FIGS. 21A-31A and 21B-31B illustrate process steps performed in the region 116 of FIG. 20C. FIGS. 21A-31A are illustrated along the reference cross-section B-B illustrated in FIG. 1. FIGS. 21B-31B are illustrated along reference cross-section C-C illustrated in FIG. 1. Process steps similar to process steps described below with reference to FIGS. 21A-31A and 21B-31B may be also applied to form other contact features 104 of the FinFET device illustrated in FIGS. 20A, 20B and 20C.

In FIGS. 21A and 21B, in some embodiments, after forming the gate masks 100 as described above with FIGS. 17A, 17B and 17C, an opening 124 formed in the first ILD 84 and the CESL 82 to expose the epitaxial source/drain region 80P. In some embodiments, the opening 124 extends into the epitaxial source/drain region 80P. The opening 124 may be formed using suitable photolithography and etch techniques. The etch may be anisotropic.

In some embodiments, a silicide layer 102 is formed over the epitaxial source/drain region 80P in the opening 124. In some embodiments, a metallic material is deposited in the opening 124. The metallic material may comprise Ti, Co, Ni, NiCo, Pt, NiPt, Ir, PtIr, Er, Yb, Pd, Rh, Nb, a combination thereof, or the like, and may be formed using PVD, sputtering, a combination thereof, or the like. Subsequently, an annealing process is performed to form the silicide layer 102. In some embodiments, the annealing process causes the metallic material to react with the semiconductor material of the epitaxial source/drain region 80P and form the silicide layer 102. After forming the silicide layer 102, unreacted portions of the metallic material are removed using a suitable removal process, such as a suitable etch process, for example. In some embodiments when the metallic material comprises titanium (Ti) and the epitaxial source/drain region 80P comprises silicon (Si), the silicide layer 102 comprises titanium silicide (TiSi). In other embodiments, the material of the silicide layer 102 is deposited over the epitaxial source/drain region 80P using CVD, PECVD, or the like.

After forming the silicide layer 102, a barrier/adhesion layer 126 is formed on sidewalls and a bottom of the opening 124, and over the first ILD 84. In some embodiments, the barrier/adhesion layer 126 comprises a metallic material (such as titanium, tantalum, tungsten, cobalt, molybdenum, ruthenium, or the like), a metal nitride material (such as titanium nitride, tantalum nitride, tungsten nitride, or the like), a combination thereof, or the like. In some embodiments, the barrier/adhesion layer 126 may be formed using ALD, CVD, PECVD, or the like. In some embodiments when the barrier/adhesion layer 126 comprises titanium nitride (TiN), the barrier/adhesion layer 126 may be formed by depositing a titanium (Ti) layer on the sidewalls and the bottom of the opening 124, and performing a nitridation process on the Ti layer to form the TiN layer. The Ti layer may be deposited using CVD, ALD, PVD, or the like. The nitridation process may comprise a plasma process that exposes the deposited metallic material to a plasma of a nitrogen precursor. The nitrogen precursor may comprise $N_2$ gas, $NH_3$ gas, a combination thereof, or the like. In some embodiments, the barrier/adhesion layer 126 has a thickness between about 2 Å and about 35 Å.

In some embodiments, during the formation of the barrier/adhesion layer 126, some metal atoms diffuse from the barrier/adhesion layer 126 into the first ILD 84 and form metal-containing layers 128 in the first ILD 84 at interfaces between the first ILD 84 and the barrier/adhesion layer 126. In some embodiments when the barrier/adhesion layer 126 comprises TiN and the first ILD 84 comprises silicon nitride (SiN), the metal-containing layers 128 comprise $TiSi_xN_y$. In some embodiments, the metal-containing layers 128 have a thickness between about 2 Å and about 25 Å.

Figure 22A:
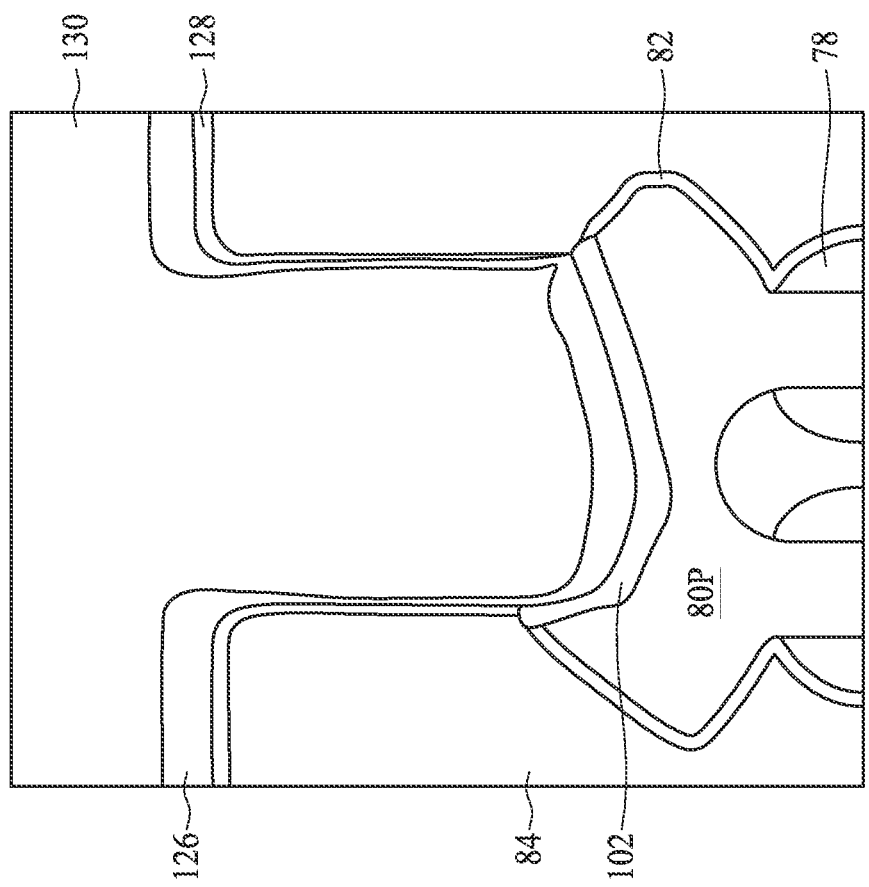
Figure 22B:
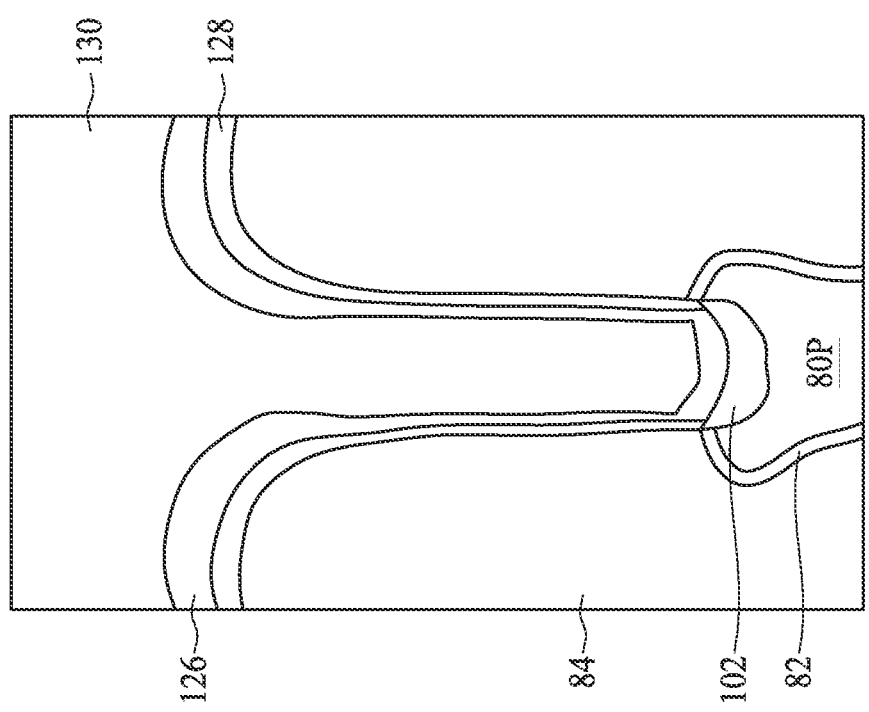

In FIGS. 22A and 22B, a coating layer 130 is formed in the opening 124 (see FIGS. 21A and 21B) and over the barrier/adhesion layer 126. The coating layer 130 may be also referred to as a bottom anti-reflective coating (BARC) layer. The coating layer 130 may comprise a polymer comprising C, H, O, or a combination thereof, and may be formed using spin coating followed by a thermal anneal.

Figures 23A, 23B:
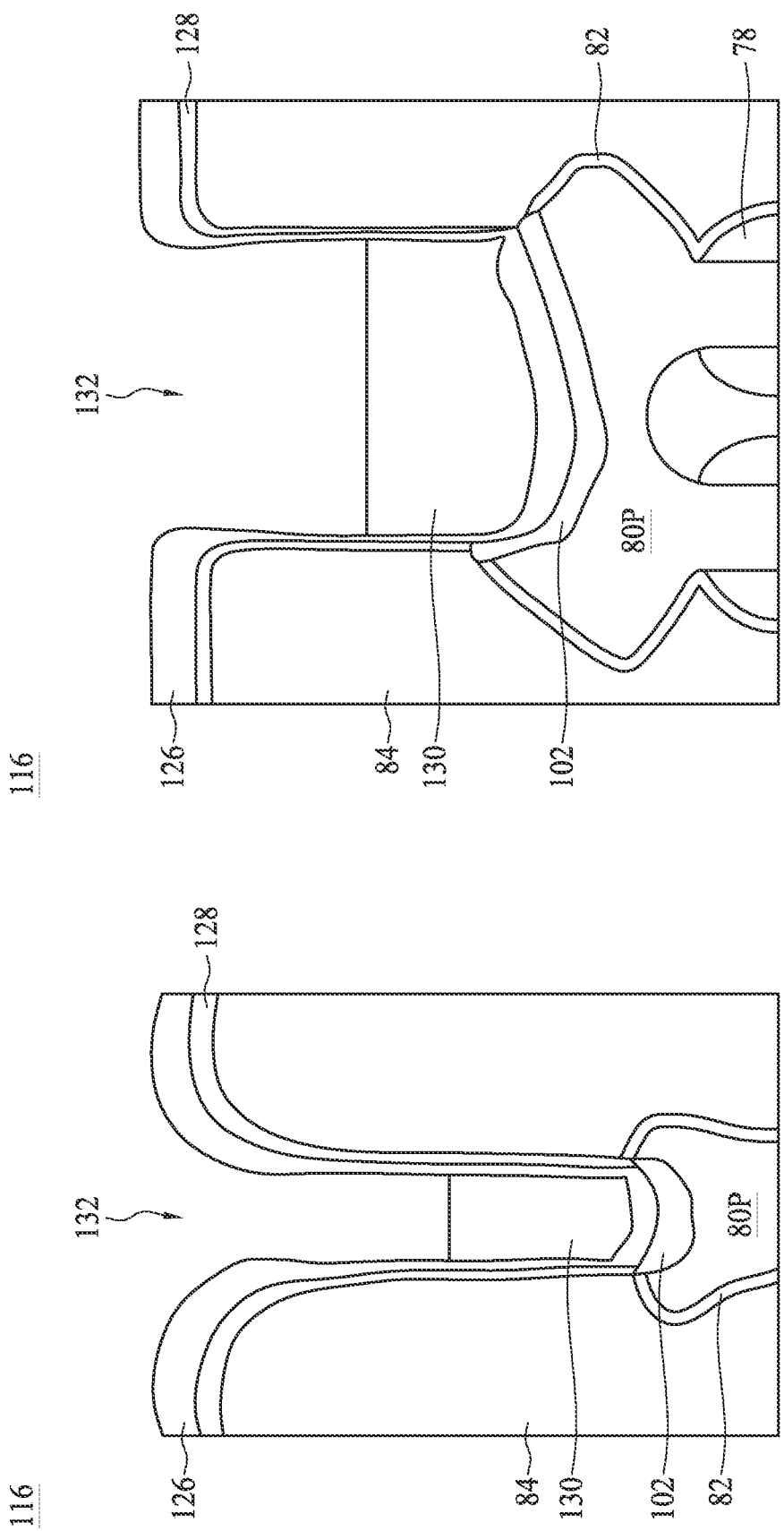

In FIGS. 23A and 23B, the coating layer 130 is recessed below the top surface of the first ILD 84 to form a recess 132. In some embodiments, the recessing processes comprises an etch process that is selective to a material of the coating layer 130. The etch process may be a dry etch process or a wet etch process. The recessing process exposes a portion of the barrier/adhesion layer 126.

In FIGS. 24A and 24B, the exposed portions of the barrier/adhesion layer 126 and portions of the metal-containing layer 128 between the exposed portions of the barrier/adhesion layer 126 and the first ILD 84 are removed to expose the first ILD 84. In some embodiments, the removal process may comprise one or more suitable etch processes. For example, the removal process may comprise a first etch process that is selective to a material of the barrier/adhesion layer 126, followed by a second etch process that is selective to a material of the metal-containing layer 128.

Figures 25A, 25B:
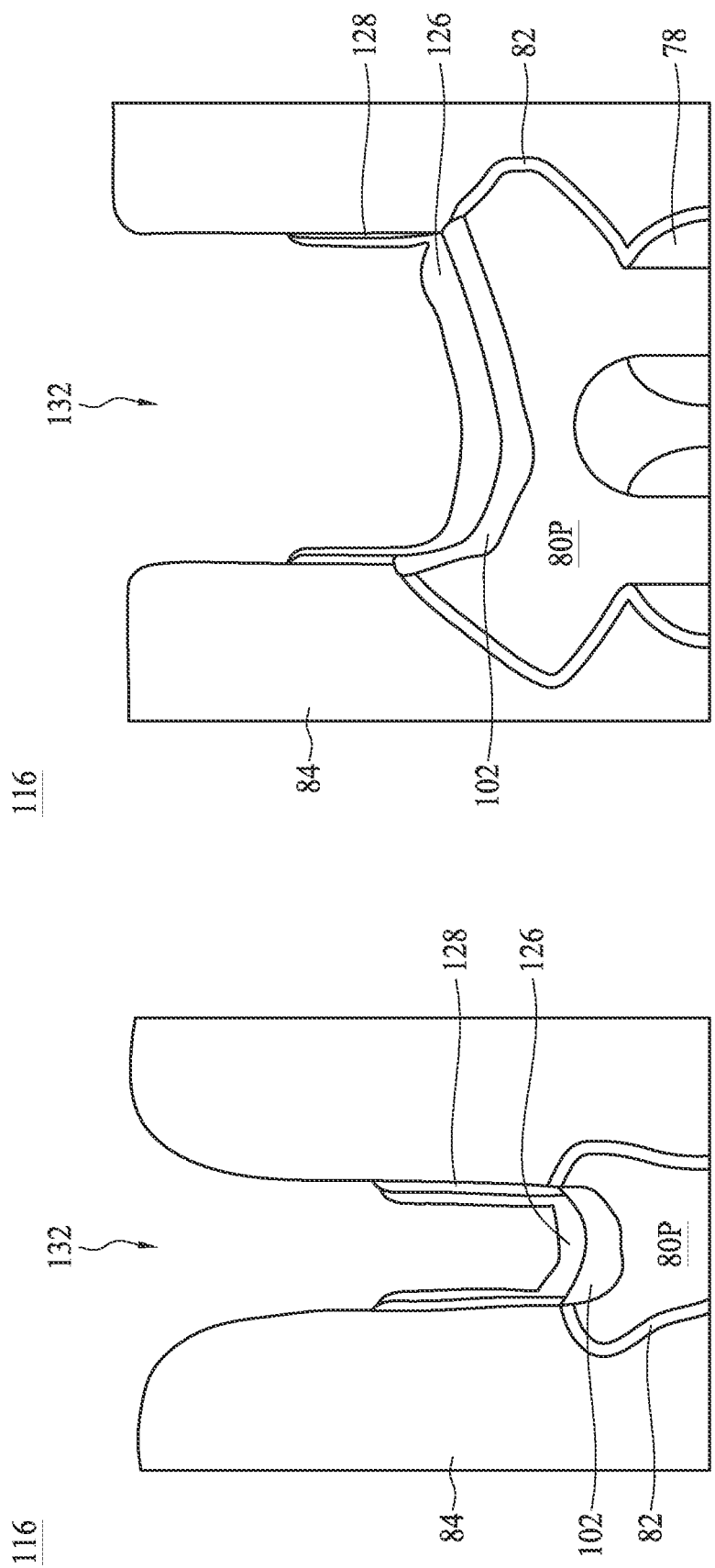

In FIGS. 25A and 25B, the coating layer 130 (see FIGS. 24A and 24B) is removed to extend the recess 132 toward the epitaxial source/drain region 80P. The removal process may comprise an acceptable ashing process followed by a wet clean process. After the removal process, remaining portion of the barrier/adhesion layer 126 is exposed in the recess 132.

Figure 26B:
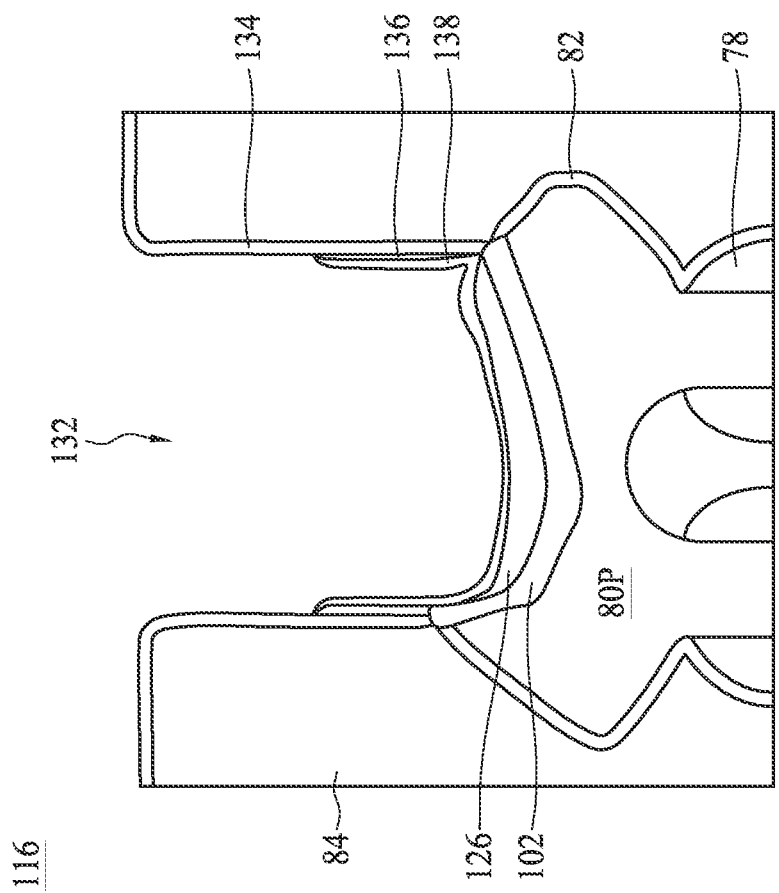
Figure 26A:
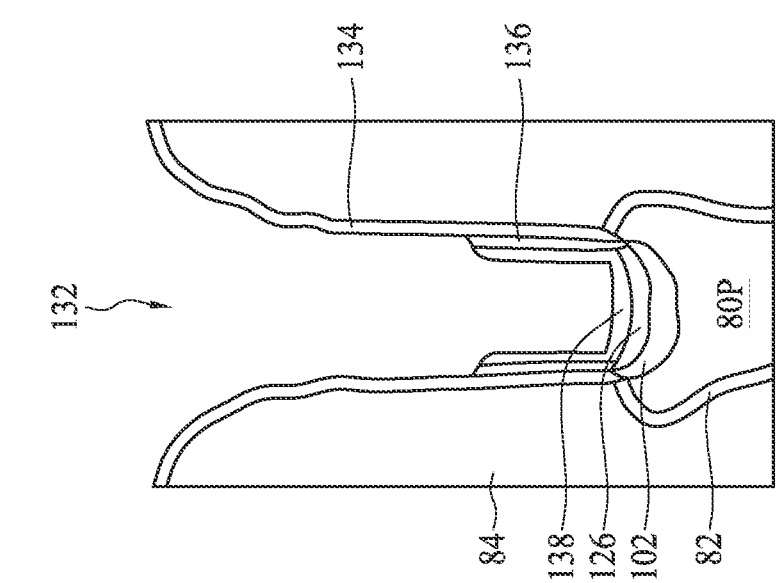

In FIGS. 26A and 26B, a surface modification process such as an oxidation process is performed on sidewalls and a bottom of the recess 132. In some embodiments, the oxidation process oxidizes the metal-containing layer 128 to form an oxidized metal-containing layer 136, and oxidizes a portion of the barrier/adhesion layer 126 to form an oxidized barrier/adhesion layer 138. In some embodiments, the oxidation process fully oxidizes portions of the barrier/adhesion layer 126 that are disposed on the sidewalls of the recess 132 and partially oxidizes portions of the barrier/adhesion layer 126 that are disposed on the bottom of the recess 132. In some embodiments, the oxidation process further oxidizes an exposed surface of the first ILD 84 and portions of the first ILD 84 at interfaces between the first ILD 84 and the oxidized metal-containing layer 136 to form liner layers 134. A material of the oxidized metal-containing layer 136 comprises an oxide of the material of the metal-containing layer 128 (see FIGS. 25A and 25B). A material of the oxidized barrier/adhesion layer 138 comprises an oxide of the material of the barrier/adhesion layer 126 (see FIGS. 25A and 25B). A material of the liner layer 134 comprises an oxide of the material of the first ILD 84. In some embodiments when the first ILD 84 comprises silicon nitride (SiN), the liner layers 134 comprise silicon oxynitride (SiON). In some embodiments when the first ILD 84 comprises silicon oxide, the liner layers 134 comprise oxygen-rich silicon oxide.

In some embodiments, the oxidation process comprises a wet process or a dry process. The oxidation process may provide blanket and isotropic surface modification of oxidized layers. The oxidation process may comprise an $O_2$ plasma process, a rapid thermal oxidation (RTO) process, an ozone-deionized ($DIO_3$) water process, or the like. Parameters of the oxidation process may be tuned to adjust properties of the liner layers 134. For example, in some embodiments when the oxidation process comprises an $O_2$ plasma process, process parameters such as a process temperature, $O_2$ flow rate, and/or plasma power may be increased to enhance the oxidation level the first ILD 84 and form continuous liner layers 134 as illustrated in FIGS. 26A and 26B. In some embodiments when the oxidation process comprises an $O_2$ plasma process, process parameters such as a process temperature, $O_2$ flow rate, and/or plasma power may be reduced to reduce the oxidation level the first ILD 84. Such an embodiment is illustrated in FIGS. 27A and 27B, where the liner layers 140 comprises disconnected oxidized portions of the first ILD 84.

In FIGS. 28A and 28B, the oxidized metal-containing layer 136 (see FIGS. 26A and 26B) and the oxidized barrier/adhesion layer 138 (see FIGS. 26A and 26B) are removed to further extend the recess 132 toward to the epitaxial source/drain region 80P. In some embodiments, the removal process comprises one or more dry etch processes. The one or more dry etch process may be performed using etchants, such as $WCl_5$, $WF_6$, $Cl_2$, $F_2$, a combination thereof, or the like. In some embodiments, the removal process comprises a first dry etch process that is selective to a material of the oxidized barrier/adhesion layer 138 that is followed by a second dry etch process that is selective to a material of the oxidized metal-containing layer 136. In some embodiments when the oxidized barrier/adhesion layer 138 comprises oxidized TiN, the first dry etch process is performed with an etchant, such as $WCl_5$, $WF_6$, $Cl_2$, $F_2$, a combination thereof, or the like. In some embodiments when the oxidized metal-containing layer 136 comprises oxidized $TiSi_xN_y$, the second dry etch process is performed with an etchant, such as $WCl_5$, $WF_6$, $Cl_2$, $F_2$, a combination thereof, or the like.

FIGS. 29A, 29B, 30A and 30B illustrate a process of filling the recess 132 (see FIGS. 28A and 28B) with a conductive material 142. In some embodiments, the conductive material 142 may comprise copper, a copper alloy, silver, gold, tungsten, cobalt, aluminum, nickel, an allow thereof, a combination thereof, or the like, and may be formed using a deposition process such as ALD, CVD, PECVD, or the like. In some embodiments, a rate of deposition of the conductive material 142 on a material of the liner layers 134 is reduced, suppressed, or inhibited. Accordingly, by removing the barrier/adhesion layer 126 (see FIGS. 26A and 26B) and the metal-containing layer 128 (see FIGS. 26A and 26B) from the sidewalls of the recess 132 (see FIGS. 26A and 26B) and forming the liner layers 134 as described above with reference to FIGS. 22A-28A and 22B-28B, a rate of deposition of the conductive material 142 on the sidewalls of the recess 132 is reduced, suppressed, or inhibited. In such embodiments, the deposition process for forming the conductive material 142 is a deposition process that selectively deposits the conductive material 142 on the barrier/adhesion layer 126 and fills the recess 132 in a bottom-up manner. By filling the recess 132 in a bottom-up manner, formation of seams or voids in the conductive material 142 is reduced or avoided. Accordingly, a resistance of the resulting contact feature 104 is reduced.

FIGS. 29A and 29B illustrate an intermediate structure during the deposition process. In the illustrated embodiment, the recess 132 is partially filled by the conductive material 142 in a bottom-up manner, such that no significant amount of the conductive material 142 is deposited on the sidewalls of an un-filled portion of the recess 132.

Figure 30B:
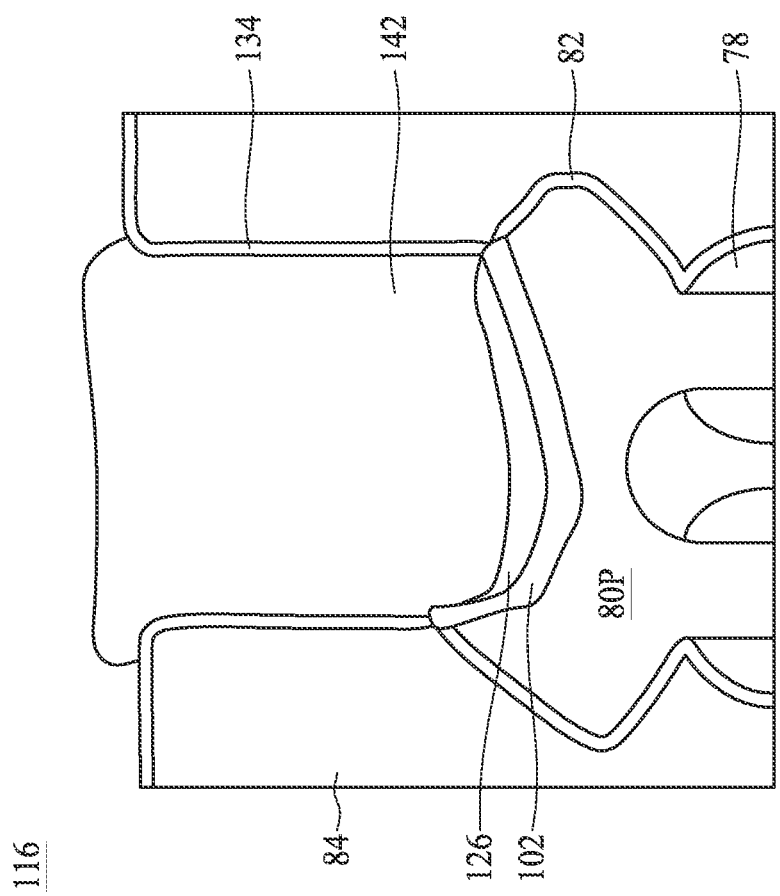
Figure 30A:
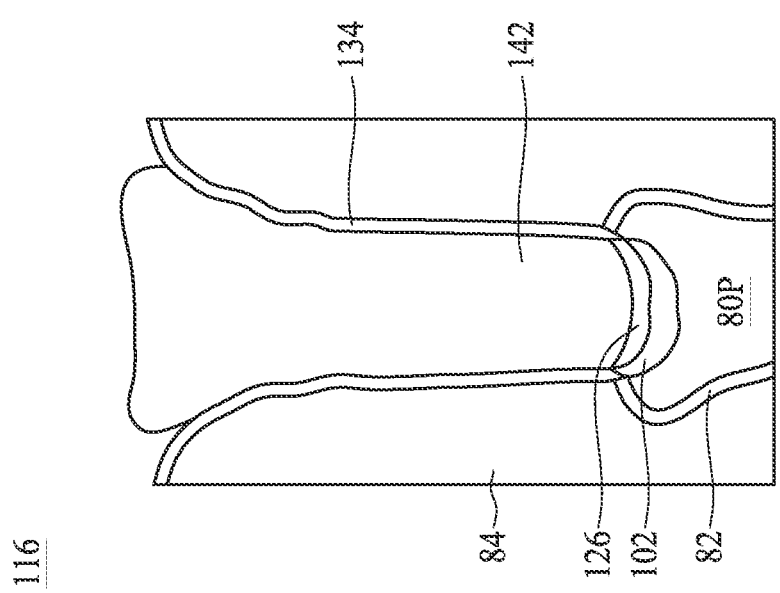

FIGS. 30A and 30B illustrate a structure after completing the deposition process. In some embodiments, the deposition process is continued until the conductive material 142 fully fills the recess 132 (see FIGS. 29A and 29B).

Figure 31B:
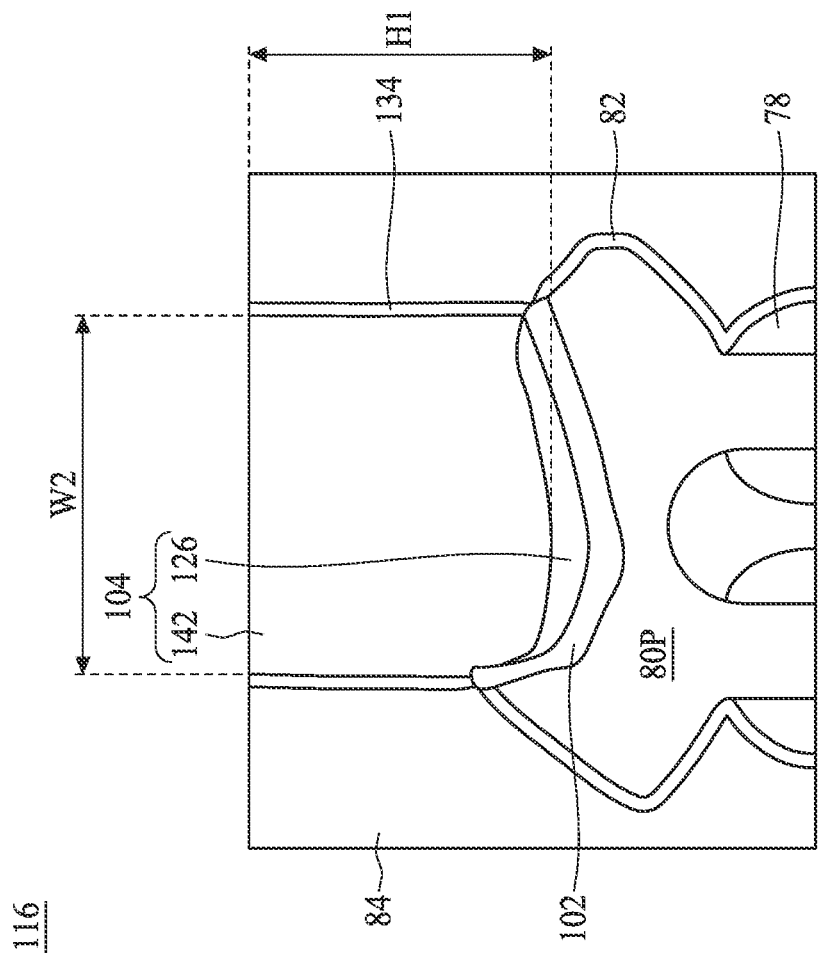
Figure 31A:
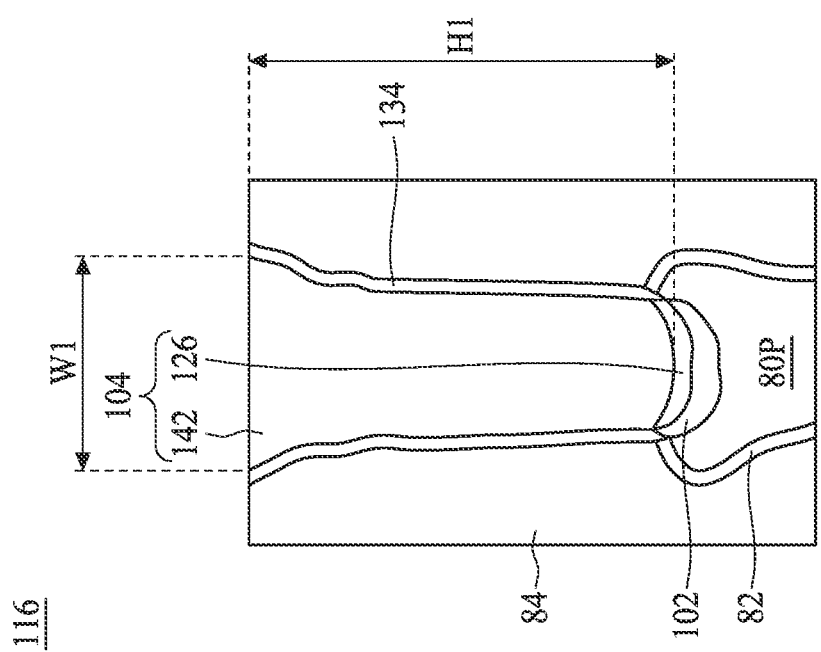

In FIGS. 31A and 31B, a planarization process is performed to remove portions of the conductive material 142 that extent above the top surface of the first ILD 84. The planarization process may comprise a CMP process, an etch process, a combination thereof, or the like. After performing the planarization process, a top surface of the conductive material 142 is substantially level or coplanar with the top surface of the first ILD 84 within process variations of the planarization process. Portions of the barrier/adhesion layer 126 and the conductive material 142 remaining in the recess 132 (see FIGS. 28A and 28B) form the contact feature 104. In some embodiments, a portion of the conductive material 142 extends below a topmost portion of the epitaxial source/drain region 80P. In some embodiments, the conductive material 142 has a height H1 between about 30 nm and 150 nm. In some embodiments, the conductive material 142 has a first width W1 (in the cross-section illustrated in FIG. 31A) between about 10 nm and about 40 nm. In some embodiments, the conductive material 142 has a second width W2 (in the cross-section illustrated in FIG. 31B) between about 20 nm and about 300 nm. In other embodiments, the second width W2 is between about 500 nm and about 1500 nm.

Figures 32A, 32B:
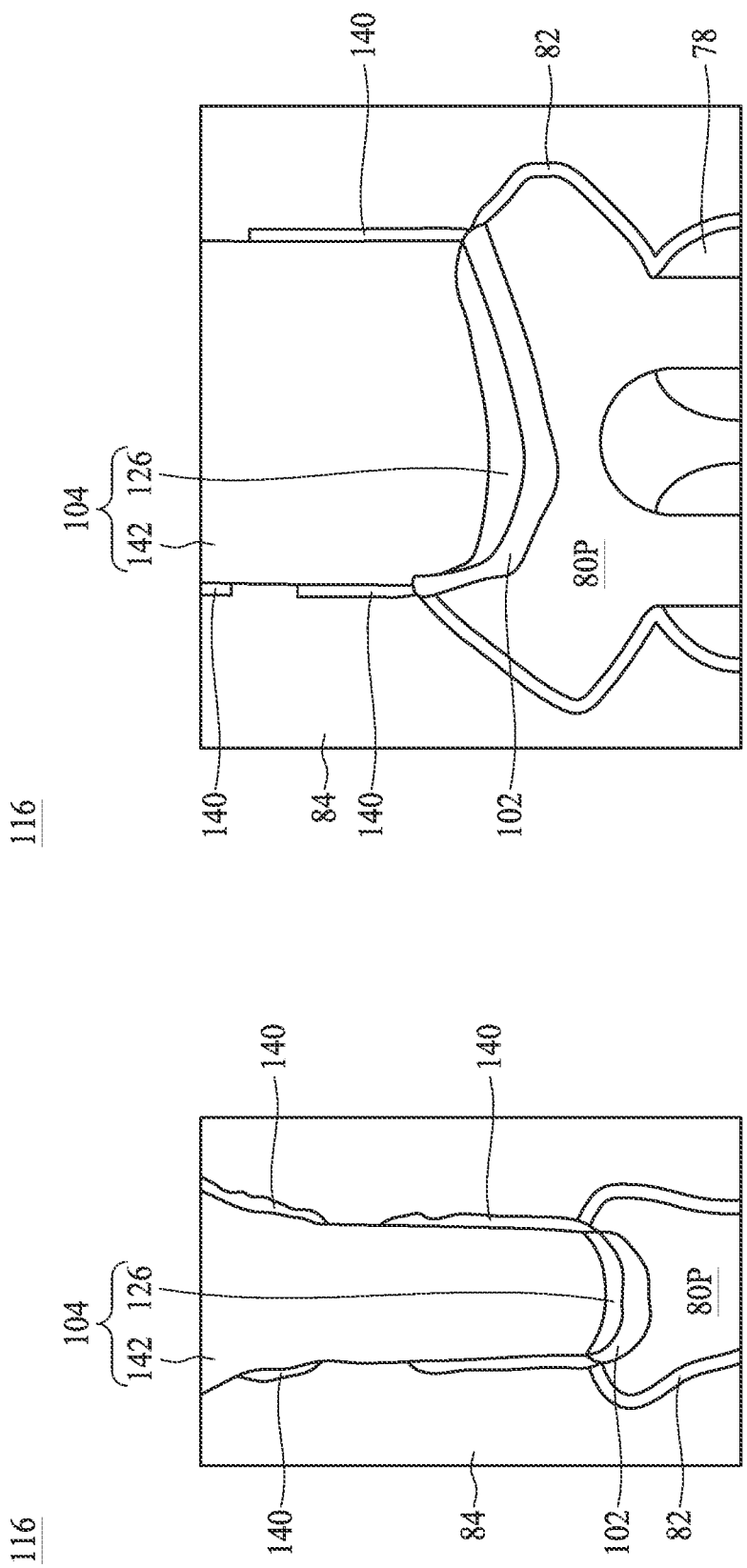
FIGS. 32A and 32B are cross-sectional views of a contact feature, in accordance with some embodiments.

FIGS. 32A and 32B are cross-sectional views of the contact feature 104 within the region 116 of FIG. 20C, in accordance with some embodiments. FIG. 32A is illustrated along the reference cross-section B-B illustrated in FIG. 1. FIG. 32B is illustrated along the reference cross-section C-C illustrated in FIG. 1. The structure of FIGS. 32A and 32B is similar to the structure of FIGS. 31A and 31B, with similar features being labeled by similar numerical references, and descriptions of the similar features are not repeated herein. In some embodiments, the structure of FIGS. 32A and 32B may be formed in a similar manner as the structure of FIGS. 31A and 31B, and the description is not repeated herein. In contrast with the structure of FIGS. 31A and 31B, the structure of FIGS. 32A and 32B comprises discontinuous liner layers 140 instead of the continuous liner layers 134.

Figure 33B:
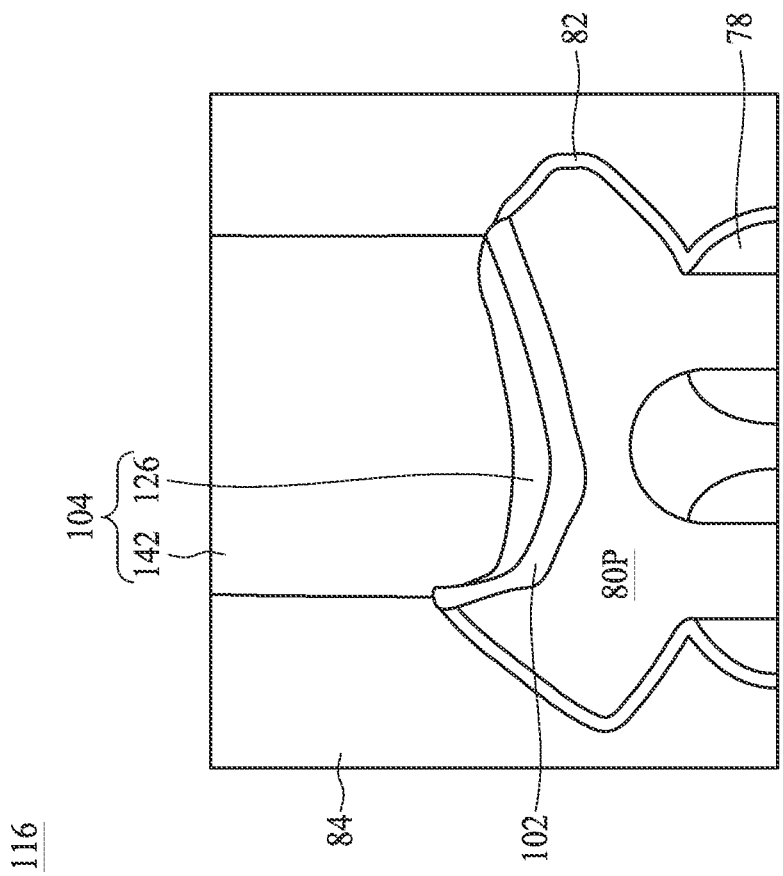
FIGS. 33A and 33B are cross-sectional views of a contact feature, in accordance with some embodiments.
Figure 33A:
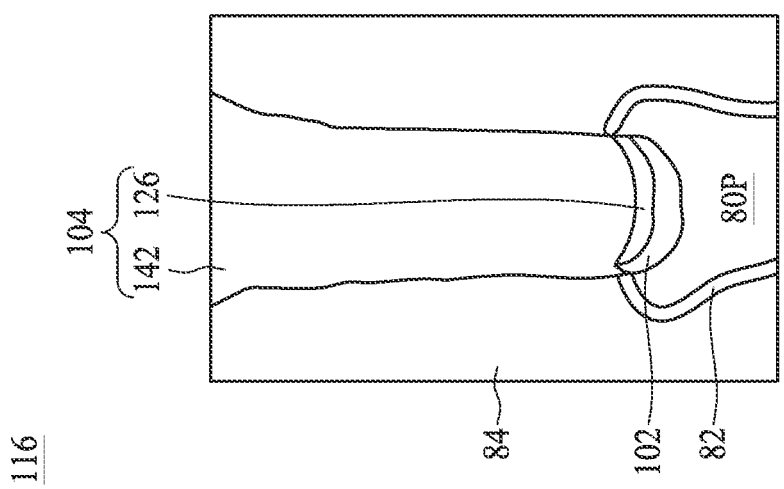

FIGS. 33A and 33B are cross-sectional views of the contact feature 104 within the region 116 of FIG. 20C, in accordance with some embodiments. FIG. 33A is illustrated along the reference cross-section B-B illustrated in FIG. 1. FIG. 33B is illustrated along the reference cross-section C-C illustrated in FIG. 1. The structure of FIGS. 33A and 33B is similar to the structure of FIGS. 31A and 31B, with similar features being labeled by similar numerical references, and descriptions of the similar features are not repeated herein. In some embodiments, the structure of FIGS. 33A and 33B may be formed in a similar manner as the structure of FIGS. 31A and 31B, and the description is not repeated herein. In some embodiments, before filling the recess 132 with the conductive material 142 as described above with reference to FIGS. 29A, 29B, 30A, and 30B, the liner layers 134 are fully removed. In some embodiments, the removal process may comprise an etch process that is selective to a material of the liner layers 134. The etch process may be a wet etch process or a dry etch process. In the illustrated embodiment, the conductive material 142 is in physical contact with the first ILD 84.

FIGS. 34-38 are cross-sectional views of intermediate stages in the manufacturing of the contact feature 112 within a region 118 of FIG. 20B, in accordance with some embodiments. In particular, FIGS. 34-38 illustrate process steps performed in the region 118 of FIG. 20B. FIGS. 34-38 are illustrated along the reference cross-section B-B illustrated in FIG. 1. Process steps similar to process steps described below with reference to FIGS. 34-38 may be also applied to form other contact features 112 of the FinFET device illustrated in FIGS. 20A, 20B and 20C.

Figure 34:
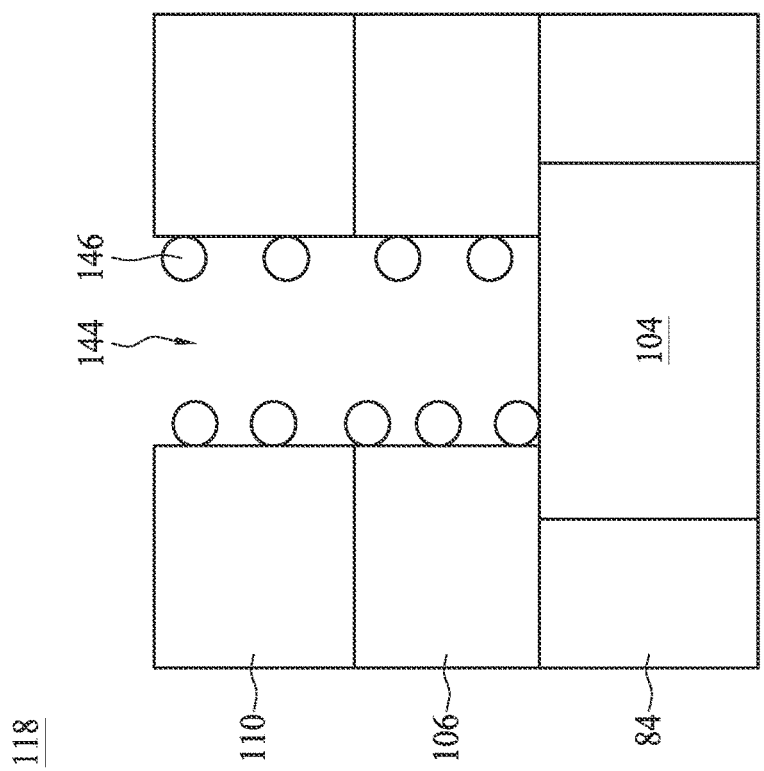

In FIG. 34, in some embodiments, after forming the second ILD 110 as described above with FIGS. 20A, 20B and 20C, an opening 144 is formed in the second ILD 110 and the ESL 106 to expose the contact feature 104. The opening 144 may be formed using suitable photolithography and etch techniques. The etch may be anisotropic. In some embodiments, during the etch process for forming of the opening 144, portions of the material of the contact feature 104 are removed and are deposited on sidewalls of the opening 144 as residues 146.

Figure 35:
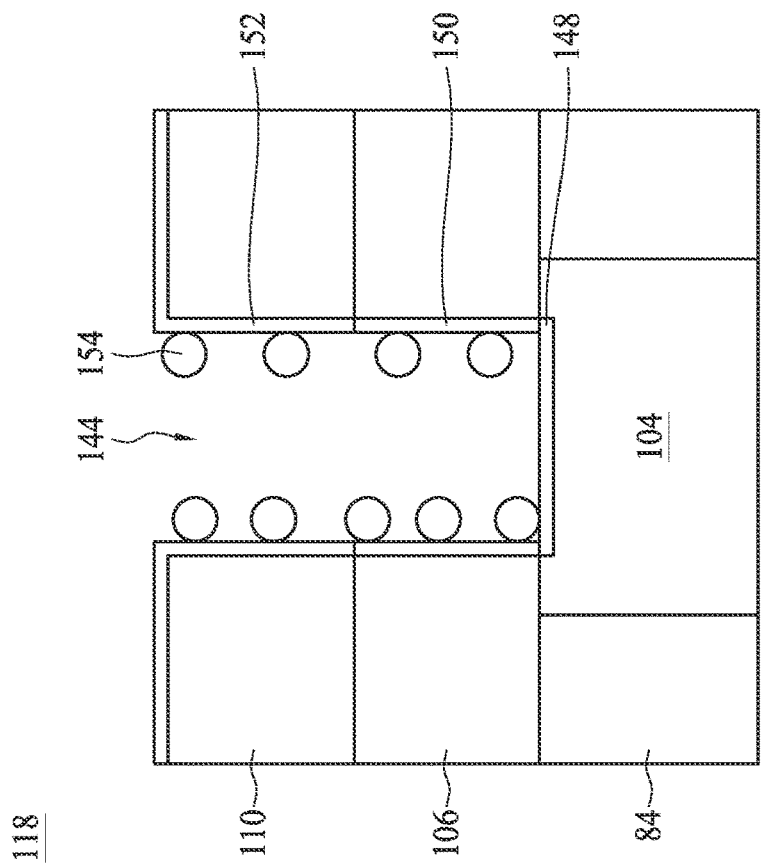

In FIG. 35, a surface modification process such as an oxidation process is performed on sidewalls and a bottom of the opening 144. In some embodiments, the oxidation process oxidizes the residues 146 (see FIG. 34) to form oxidized residues 154 and a portion of the contact feature 104 to form an oxidized layer 148. The oxidation process further oxidizes exposed surfaces of the ESL 106, and portions of the ESL 106 at interfaces between the ESL 106 and the oxidized residues 154 to form liner layers 150. The oxidation process further oxidizes exposed surfaces of the second ILD 110, and portions of the second ILD 110 at interfaces between the second ILD 110 and the oxidized residues 154 to form liner layers 152.

A material of the oxidized residues 154 comprises an oxide of the material of the residues 146. A material of the oxidized layer 148 comprises an oxide of the contact feature 104. A material of the liner layers 150 comprises an oxide of the material of the ESL 106. A material of the liner layers 152 comprises an oxide of the material of the second ILD 110. In some embodiments when the ESL 106 and the second ILD 110 comprise silicon nitride (SiN), the liner layers 150 and 152 comprise silicon oxynitride (SiON). In some embodiments when the ESL 106 and the second ILD 110 comprise silicon oxide, the liner layers 150 and 152 comprise oxygen-rich silicon oxide.

In some embodiments, the liner layers 150 have a thickness between about 5 Å and about 20 Å. In some embodiments, the liner layer 152 have a thickness between about 1 Å and about 25 Å. In some embodiments, a difference between the thickness of the liner layer 152 and thickness of the liner layer 150 is between about 1 Å and about 10 Å.

In some embodiments, the oxidation process performed on the sidewalls and the bottom of the opening 144 may be similar to the oxidation process of the sidewalls and the bottom of the recess 132 as described above with reference to FIGS. 26A and 26B, and the description is not repeated herein. Parameters of the oxidation process may be tuned to adjust properties of the liner layers 150 and 152. For example, in some embodiments when the oxidation process comprises an $O_2$ plasma process, process parameters such as a process temperature, $O_2$ flow rate, and/or plasma power may be increased to enhance the oxidation level of the ESL 106 and the second ILD 110, and form continuous liner layers 150 and 152 as illustrated in FIG. 35. In some embodiments when the oxidation process comprises an $O_2$ plasma process, process parameters such as a process temperature, $O_2$ flow rate, and/or plasma power may be reduced to reduce the oxidation level of the ESL 106 and the second ILD 110. Such an embodiment is illustrated in FIG. 36, where the liner layers 156 comprise disconnected oxidized portions of the ESL 106, and the liner layers 158 comprise disconnected oxidized portions of the second ILD 110.

In FIG. 37, the oxidized residues 154 (see FIG. 35) and the oxidized layer 148 (see FIG. 35) are removed. After the removal process, the opening 144 extends into the contact feature 104, such that a bottom of the opening 144 is below the top surface of the contact feature 104 and the top surface of the first ILD 84. In some embodiments, the removal process comprises one or more dry etch processes. The one or more dry etch process may be performed using etchants, such as $WCl_5$, $WF_6$, $Cl_2$, $F_2$, a combination thereof, or the like. In some embodiments when the oxidized residues 154 and the oxidized layer 148 comprise tungsten oxide, the removal process comprises a dry etch process that is performed with an etchant, such as $WCl_5$, $WF_6$, or the like.

In FIG. 38, the opening 144 (see FIG. 37) is filled with a conductive material 160. In some embodiments, the conductive material 160 may be formed using similar materials and methods as the conductive material 142 described above with reference to FIGS. 29A, 29B, 30A and 30B, and the description is not repeated herein. In some embodiments, a rate of deposition of the conductive material 160 on materials of the liner layers 150 and 152 are reduced, suppressed, or inhibited. Accordingly, by removing the residues 146 (see FIG. 34) from the sidewalls of the opening 144 and forming the liner layers 150 and 152 as described above with reference to FIGS. 35-37, a rate of deposition of the conductive material 160 on the sidewalls of the opening 144 is reduced, suppressed, or inhibited. In such embodiments, the deposition process for forming the conductive material 160 is a deposition process that selectively deposits the conductive material 160 on the contact feature 104 and fills the opening 144 in a bottom-up manner. By filling the opening 144 in a bottom-up manner, formation of seams or voids in the conductive material 160 is reduced or avoided. Accordingly, a resistance of the resulting contact feature 112 is reduced.

Further in FIG. 38, after filling the opening 144 (see FIG. 37) with the conductive material 160, a planarization process is performed to remove portions of the conductive material 160 that extent above the top surface of the second ILD 110. The planarization process may comprise a CMP process, an etch process, a combination thereof, or the like. After performing the planarization process, a top surface of the conductive material 160 is substantially level or coplanar with the top surface of the second ILD 110 within process variations of the planarization process. A portion of the conductive material 160 remaining in the opening 144 forms the contact feature 112. In some embodiments, the conductive material 160 has a height H2 between about 30 nm and about 150 nm. In some embodiments, the conductive material 160 has a first width W3 (in the cross-section illustrated in FIG. 38) between about 10 nm and about 25 nm. In some embodiments, the conductive material 160 has a second width (in a cross-section that is perpendicular to the cross-section illustrated in FIG. 38) between about 10 nm and about 75 nm. In some embodiments, a bottom surface of the conductive material 160 extends into the contact feature 104 to a depth D1 as measure from the top surface of the contact features 104. The depth D1 may be between about 5 nm and about 25 nm.

FIG. 39 is a cross-sectional view of the contact features 112 within the region 118 of FIG. 20B, in accordance with some embodiments. FIG. 39 is illustrated along the reference cross-section B-B illustrated in FIG. 1. The structure of FIG. 39 is similar to the structure of FIG. 38, with similar features being labeled by similar numerical references, and descriptions of the similar features are not repeated herein. In some embodiments, the structure of FIG. 39 may be formed in a similar manner as the structure of FIG. 38, and the description is not repeated herein. In contrast with the structure of FIG. 38, the structure of FIG. 39 comprises discontinuous liner layers 156 and 158 instead of the continuous liner layers 150 and 152.

FIGS. 40-44 are cross-sectional views of intermediate stages in the manufacturing of the contact feature 114 within a region 120 of FIG. 20B, in accordance with some embodiments. In particular, FIGS. 40-44 illustrate process steps performed in the region 120 of FIG. 20B. FIGS. 40-44 are illustrated along the reference cross-section B-B illustrated in FIG. 1. Process steps similar to process steps described below with reference to FIGS. 40-44 may be also applied to form other contact features 114 of the FinFET device illustrated in FIGS. 20A, 20B and 20C.

In FIG. 40, in some embodiments, after forming the second ILD 110 as described above with FIGS. 20A, 20B and 20C, an opening 162 is formed in the second ILD 110, the ESL 106 and the gate mask 100 to expose the capping layer 98. The opening 162 may be formed using suitable photolithography and etch techniques. The etch may be anisotropic. In some embodiments, during the etch process for forming of the opening 162, portions of the material of the capping layer 98 are removed and are deposited on sidewalls of the opening 162 as residues 164.

In FIG. 41, a surface modification process such as an oxidation process is performed on sidewalls and a bottom of the opening 162. In some embodiments, the oxidation process oxidizes the residues 164 (see FIG. 40) to form oxidized residues 174 and a portion of the capping layer 98 to form an oxidized layer 166. The oxidation process further oxidizes exposed surfaces of the gate mask 100 and portions of the gate mask 100 at interfaces between the gate mask 100 and the oxidized residues 174 to form liner layers 168. The oxidation process further oxidizes exposed surfaces of the ESL 106 and portions of the ESL 106 at interfaces between the ESL 106 and the oxidized residues 174 to form liner layers 170. The oxidation process further oxidizes exposed surfaces of the second ILD 110, and portions of the second ILD 110 at interfaces between the second ILD 110 and the oxidized residues 174 to form liner layers 172.

A material of the oxidized residues 174 comprises an oxide of the material of the residues 164 (see FIG. 40). A material of the oxidized layer 166 comprises an oxide of the capping layer 98. A material of the liner layers 168 comprises an oxide of the material of the gate mask 100. A material of the liner layers 170 comprises an oxide of the material of the ESL 106. A material of the liner layers 172 comprises an oxide of the material of the second ILD 110. In some embodiments when the gate mask 100, the ESL 106 and the second ILD 110 comprise silicon nitride (SiN), the liner layers 168, 170 and 172 comprise silicon oxynitride (SiON). In some embodiments when the gate mask 100, the ESL 106 and the second ILD 110 comprise silicon oxide, the liner layers 168, 170 and 172 comprise oxygen-rich silicon oxide.

In some embodiments, the liner layers 168 have a thickness between about 5 Å and about 20 Å. In some embodiments, the liner layers 170 have a thickness between about 5 Å and about 20 Å. In some embodiments, the liner layers 172 have a thickness between about 1 Å and about 25 Å.

In some embodiments, the oxidation process performed on the sidewalls and the bottom of the opening 162 may be similar to the oxidation process of the sidewalls and the bottom of the recess 132 as described above with reference to FIGS. 26A and 26B, and the description is not repeated herein. Parameters of the oxidation process may be tuned to adjust properties of the liner layers 168, 170 and 172. For example, in some embodiments when the oxidation process comprises an $O_2$ plasma process, process parameters such as a process temperature, $O_2$ flow rate, and/or plasma power may be increased to enhance the oxidation level of the gate mask 100, the ESL 106 and the second ILD 110, and form continuous liner layers 168, 170 and 172 as illustrated in FIG. 41. In some embodiments when the oxidation process comprises an $O_2$ plasma process, process parameters such as a process temperature, $O_2$ flow rate, and/or plasma power may be reduced to reduce the oxidation level of the gate mask 100, the ESL 106 and the second ILD 110. Such an embodiment is illustrated in FIG. 42, where the liner layers 176 comprise disconnected oxidized portions of the gate mask 100, the liner layers 178 comprise disconnected oxidized portions of the ESL 106, and the liner layers 180 comprise disconnected oxidized portions of the second ILD 110.

In FIG. 43, the oxidized residues 174 (see FIG. 41) and the oxidized layer 166 (see FIG. 41) are removed. After the removal process, the opening 162 extends into the capping layer 98, such that a bottom of the opening 162 is below the top surface of the capping layer 98. In some embodiments, the removal process comprises one or more dry etch processes. The one or more dry etch process may be performed using etchants, such as $WCl_5$, $WF_6$, $Cl_2$, $F_2$, a combination thereof, or the like. In some embodiments when the oxidized residues 174 and the oxidized layer 166 comprise tungsten oxide, the removal process comprises a dry etch process that is performed with an etchant, such as $WCl_5$, $WF_6$, or the like.

Figures 44, 45:
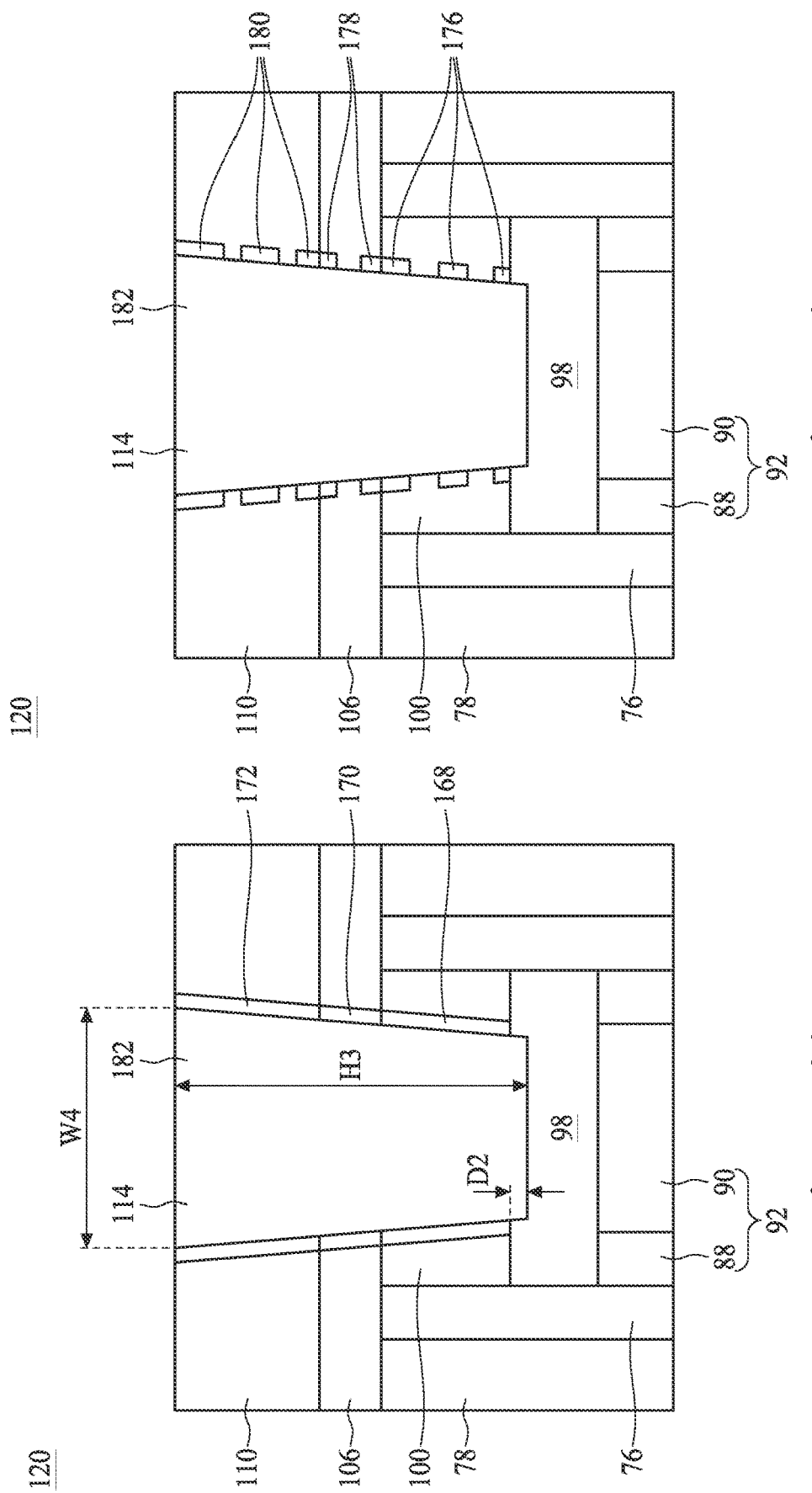

In FIG. 44, the opening 162 (see FIG. 43) is filled with a conductive material 182. In some embodiments, the conductive material 182 may be formed using similar materials and methods as the conductive material 142 described above with reference to FIGS. 29A, 29B, 30A and 30B, and the description is not repeated herein. In some embodiments, a rate of deposition of the conductive material 182 on materials of the liner layers 168, 170 and 172 are reduced, suppressed, or inhibited. Accordingly, by removing the residues 164 (see FIG. 40) from the sidewalls of the opening 162 and forming the liner layers 168, 170 and 172 as described above with reference to FIGS. 41-43, a rate of deposition of the conductive material 182 on the sidewalls of the opening 162 is reduced, suppressed, or inhibited. In such embodiments, the deposition process for forming the conductive material 182 is a deposition process that selectively deposits the conductive material 182 on the capping layer 98 and fills the opening 162 in a bottom-up manner. By filling the opening 162 in a bottom-up manner, formation of seams or voids in the conductive material 182 is reduced or avoided. Accordingly, a resistance of the resulting contact feature 112 is reduced.

Further in FIG. 44, after filling the opening 162 (see FIG. 43) with the conductive material 182, a planarization process is performed to remove portions of the conductive material 182 that extent above the top surface of the second ILD 110. The planarization process may comprise a CMP process, an etch process, a combination thereof, or the like. After performing the planarization process, a top surface of the conductive material 182 is substantially level or coplanar with the top surface of the second ILD 110 within process variations of the planarization process. A portion of the conductive material 182 remaining in the opening 162 forms the contact feature 114. In some embodiments, the conductive material 182 has a height H3 between about 30 nm and about 150 nm. In some embodiments, the conductive material 182 has a first width W4 (in the cross-section illustrated in FIG. 44) between about 10 nm and about 25 nm. In some embodiments, the conductive material 182 has a second width (in a cross-section that is perpendicular to the cross-section illustrated in FIG. 44) between about 10 nm and about 75 nm. In some embodiments, a bottom surface of the conductive material 182 extends into the capping layer 98 to a depth D2 as measure from the top surface of the capping layer 98. The depth D2 may be between about 5 nm and about 25 nm.

FIG. 45 is a cross-sectional view of the contact feature 114 within the region 120 of FIG. 20B, in accordance with some embodiments. FIG. 45 is illustrated along the reference cross-section B-B illustrated in FIG. 1. The structure of FIG. 45 is similar to the structure of FIG. 44, with similar features being labeled by similar numerical references, and descriptions of the similar features are not repeated herein. In some embodiments, the structure of FIG. 45 may be formed in a similar manner as the structure of FIG. 44, and the description is not repeated herein. In contrast with the structure of FIG. 44, the structure of FIG. 45 comprises discontinuous liner layers 176, 178 and 180 instead of the continuous liner layers 168, 170 and 172.

FIGS. 46-53 are cross-sectional views of intermediate stages in the manufacturing of the contact feature 108 within a region 122 of FIG. 20B, in accordance with some embodiments. In particular, FIGS. 46-53 illustrate process steps performed in the region 122 of FIG. 20B. FIGS. 46-53 are illustrated along the reference cross-section B-B illustrated in FIG. 1.

In FIG. 46, in some embodiments, after forming the ESL 106 as described above with FIGS. 19A, 19B and 19C, a third ILD 184 is formed over the ESL 106. The third ILD 184 may be formed using similar materials and methods as the first ILD 84 described above with reference to FIGS. 12A, 12B and 12C, and the description is not repeated herein. In some embodiments, the ILDs 84 and 184 comprise a same material. In other embodiments, the ILDs 84 and 184 comprise different materials.

In FIG. 47, after forming the third ILD 184, an opening 186 is formed in the third ILD 184, the ESL 106 and the gate mask 100 to expose the contact feature 104 and the capping layer 98. The opening 186 comprises an upper portion 186A and a lower portion 186B. The upper portion 186A extends through the third ILD 184 and the ESL 106, and exposes the contact feature 104. The lower portion 186B extends through the gate mask 100 and between the gate seal spacers 76, and exposes the capping layer 98. The opening 186 may be formed using suitable photolithography and etch techniques. The etch may be anisotropic.

Figures 48, 49:
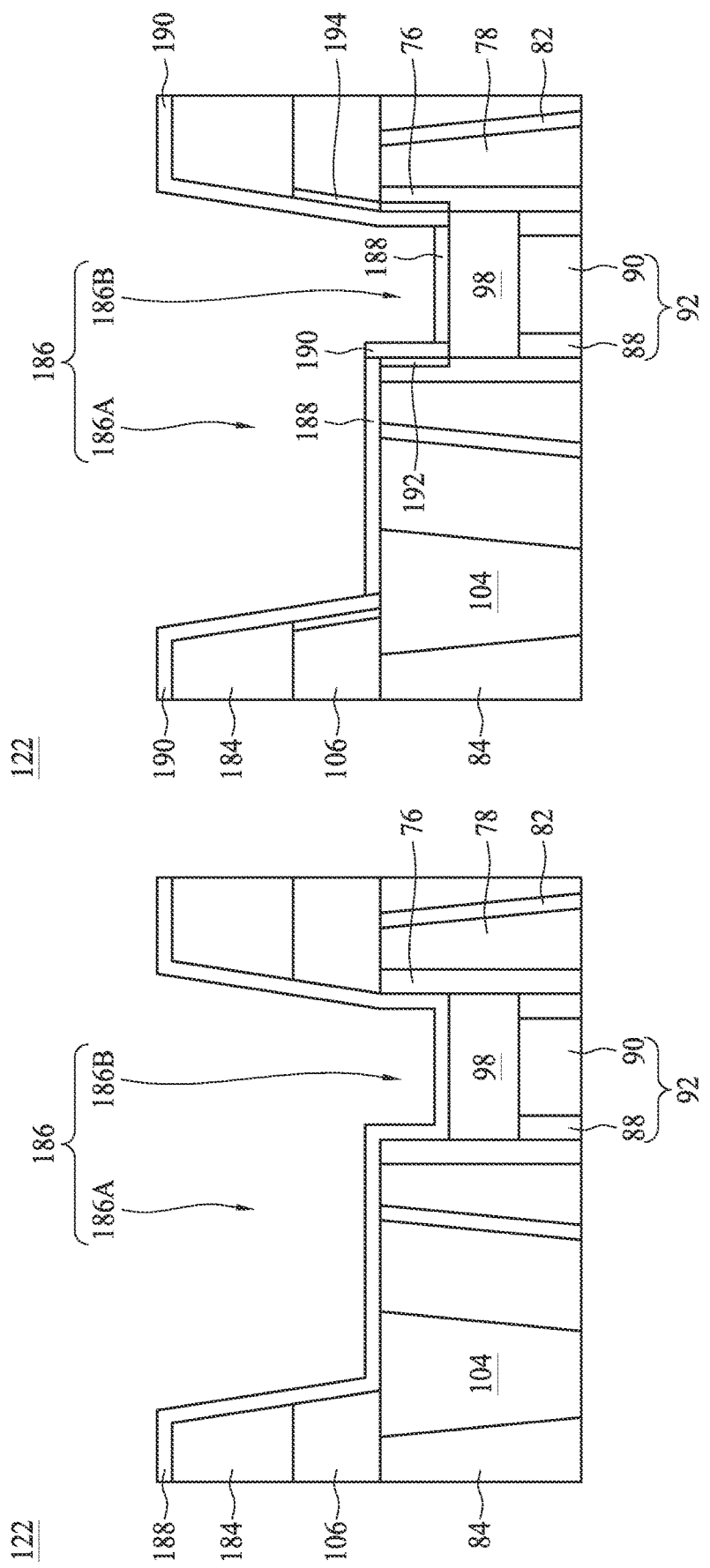

In FIG. 48, a barrier/adhesion layer 188 is formed on sidewalls and bottoms of the opening 186, and over the third ILD 184. In some embodiments, the barrier/adhesion layer 188 may be formed using similar materials and methods as the barrier/adhesion layer 126 described above with reference to FIGS. 21A and 21B, and the description is not repeated herein.

In FIG. 49, a surface modification process such as an oxidation process is performed on an exposed surface of the barrier/adhesion layer 188. In some embodiments, the oxidation process oxidizes portions of the barrier/adhesion layer 188 disposed on the sidewalls of the opening 186 and over the third ILD 184, and forms an oxidized barrier/adhesion layer 190. The oxidation process further oxidizes portions of the gate seal spacers 76 at interfaces between the gate seal spacers 76 and the oxidized barrier/adhesion layer 190 to form liner layers 192. The oxidation process further oxidizes portions of the ESL 106 at interfaces between the ESL 106 and the oxidized barrier/adhesion layer 190 to form liner layers 194. The oxidation process further oxidizes portions of the third ILD 184 at interfaces between the third ILD 184 and the oxidized barrier/adhesion layer 190 to form liner layers (not shown).

A material of the liner layers 192 comprises an oxide of the material of the gate seal spacers 76. A material of the liner layers 194 comprises an oxide of the material of the ESL 106. In some embodiments when the gate seal spacers 76 and the ESL 106 comprise silicon nitride (SiN), the liner layers 192 and 194 comprise silicon oxynitride (SiON). In some embodiments when the gate seal spacers 76 and the ESL 106 comprise silicon oxide, the liner layers 192 and 194 comprise oxygen-rich silicon oxide. In some embodiments, the liner layers 192 have a thickness between about 5 Å and about 20 Å. In some embodiments, the liner layers 194 have a thickness between about 5 Å and about 20 Å.

In some embodiments, the oxidation process performed on the exposed surface of the barrier/adhesion layer 188 may be similar to the oxidation process performed on the exposed surface of the barrier/adhesion layer 126 as described above with reference to FIGS. 26A and 26B, and the description is not repeated herein. In some embodiments, the oxidation process is performed in a non-directional or an isotropic manner outside of the opening 186 and in a directional manner within the opening 186. By performing the oxidation process in the directional manner within the opening 186, portions of the barrier/adhesion layer 188 disposed on the sidewalls of the opening 186 are oxidized, while portions of the barrier/adhesion layer 188 disposed on the bottoms of the opening 186 are not oxidized.

In some embodiments, parameters of the oxidation process may be tuned to adjust properties of the liner layers 192 and 194. For example, in some embodiments when the oxidation process comprises an $O_2$ plasma process, process parameters such as a process temperature, $O_2$ flow rate, and/or plasma power may be increased to enhance the oxidation level of the gate seal spacers 76 and the ESL 106 and form continuous liner layers 192 and 194 as illustrated in FIG. 49. In some embodiments when the oxidation process comprises an $O_2$ plasma process, process parameters such as a process temperature, $O_2$ flow rate, and/or plasma power may be reduced to reduce the oxidation level of the gate seal spacers 76 and the ESL 106. Such an embodiment is illustrated in FIG. 50, where the liner layers 196 comprise disconnected oxidized portions of the gate seal spacers 76 and the liner layers 198 comprise disconnected oxidized portions of the ESL 106.

Figures 50, 51:
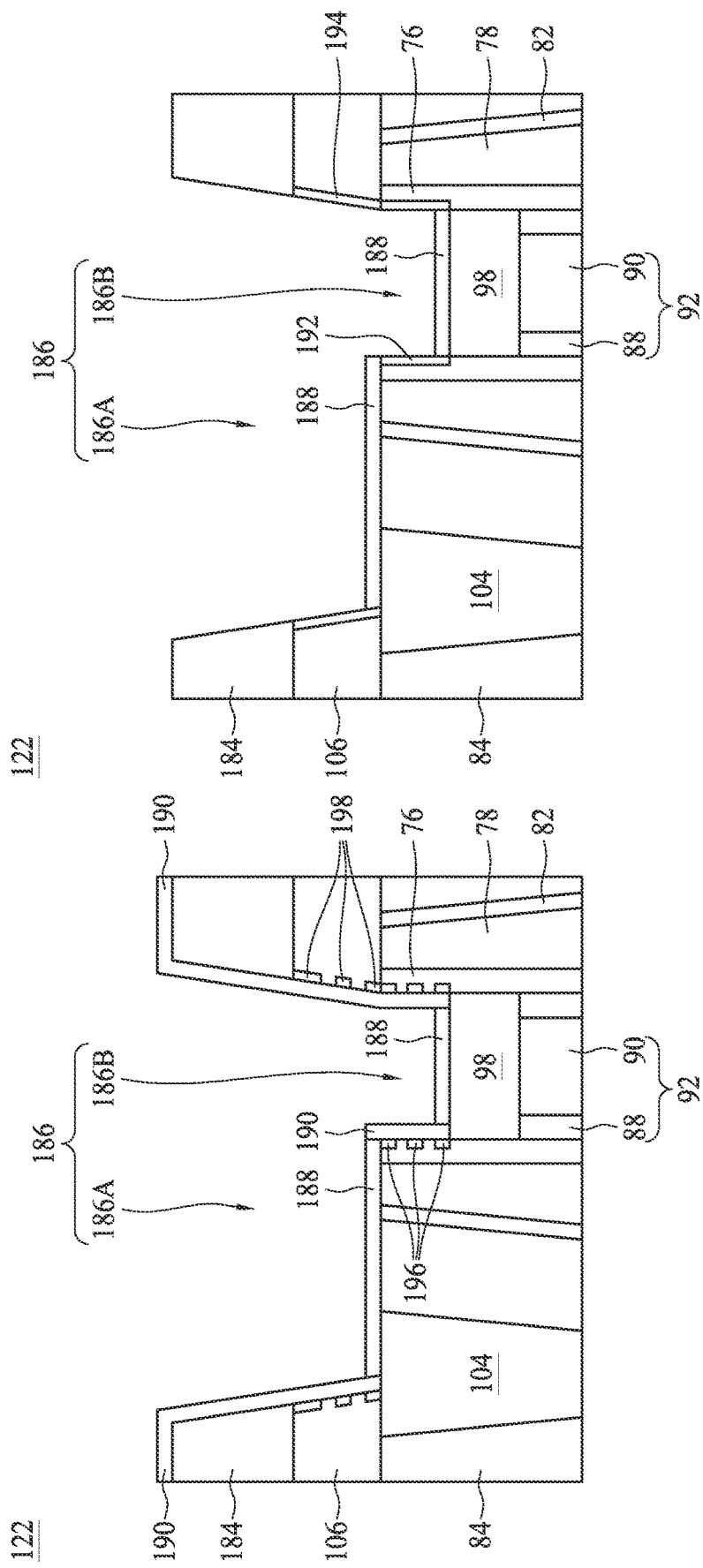

In FIG. 51, the oxidized barrier/adhesion layer 190 (see FIG. 49) is removed. In some embodiments, the removal process comprises one or more dry etch processes. The one or more dry etch process may be performed using etchants, such as $WCl_5$, $WF_6$, $Cl_2$, $F_2$, a combination thereof, or the like.

Figures 52, 53:
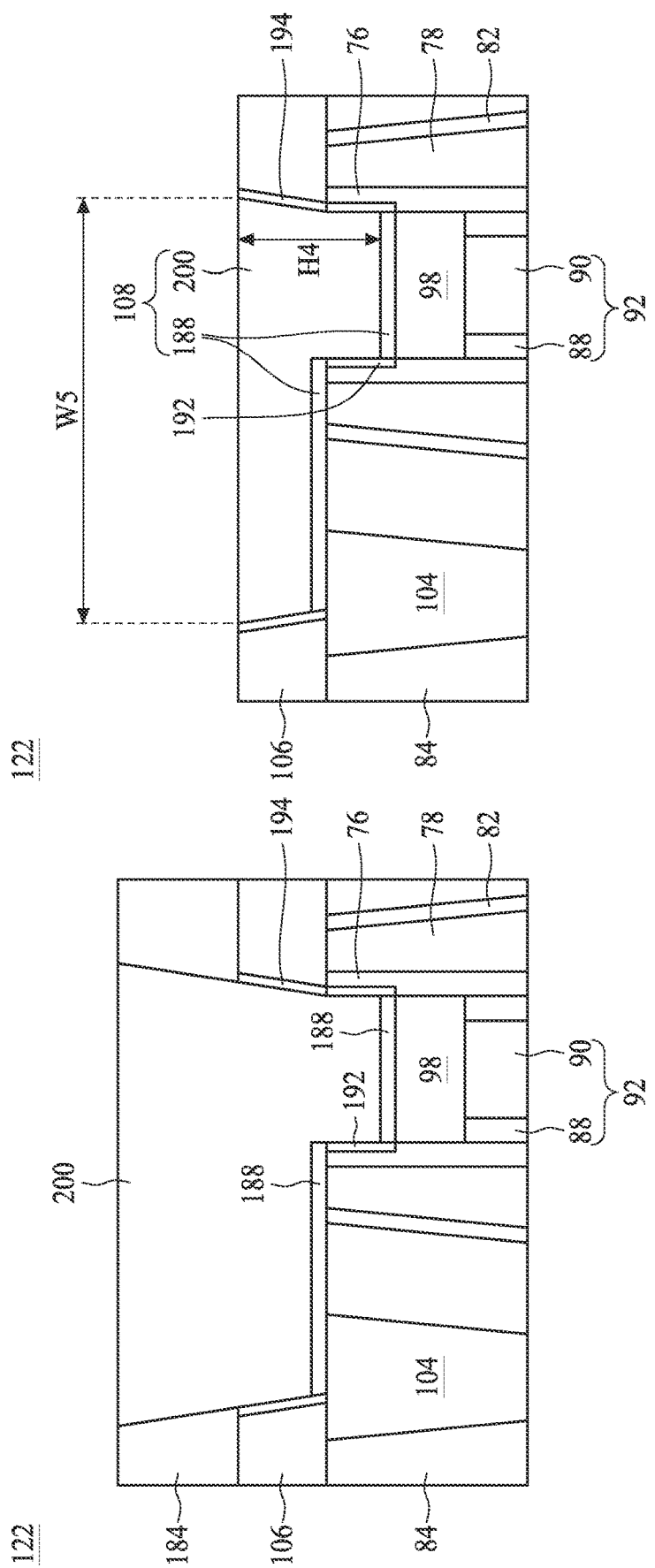

In FIG. 52, the opening 186 (see FIG. 51) is filled with a conductive material 200. In some embodiments, the conductive material 200 may be formed using similar materials and methods as the conductive material 142 described above with reference to FIGS. 29A, 29B, 30A and 30B, and the description is not repeated herein. In some embodiments, a rate of deposition of the conductive material 200 on materials of the liner layers 192 and 194 are reduced, suppressed, or inhibited. Accordingly, by removing portions of the barrier/adhesion layer 188 from the sidewalls of the opening 186 and forming the liner layer 192 and 194 as described above with reference to FIGS. 49-51, a rate of deposition of the conductive material 200 on the sidewalls of the opening 186 is reduced, suppressed, or inhibited. In such embodiments, the deposition process for forming the conductive material 200 is a deposition process that selectively deposits the conductive material 200 on the barrier/adhesion layer 188 and fills the opening 186 in a bottom-up manner. By filling the opening 186 in a bottom-up manner, formation of seams or voids in the conductive material 200 is reduced or avoided. Accordingly, a resistance of the resulting contact feature 108 is reduced.

In FIG. 53, after filling the opening 186 (see FIG. 51) with the conductive material 200, a planarization process is performed to remove portions of the conductive material 200 that extent above the top surface of the ESL 106. The planarization process also removes the third ILD 184. The planarization process may comprise a CMP process, an etch process, a combination thereof, or the like. After performing the planarization process, a top surface of the conductive material 200 is substantially level or coplanar with the top surface of the ESL 106 within process variations of the planarization process. Portions of the conductive material 200 and the barrier/adhesion layer 188 remaining in the opening 186 form the contact feature 108. In some embodiments, the conductive material 200 has a height H4 between about 30 nm and about 70 nm. In some embodiments, the conductive material 200 has a first width W5 (in the cross-section illustrated in FIG. 53) between about 20 nm and about 60 nm. In some embodiments, the conductive material 200 has a second width (in a cross-section that is perpendicular to the cross-section illustrated in FIG. 53) between about 10 nm and about 25 nm.

Figure 54:
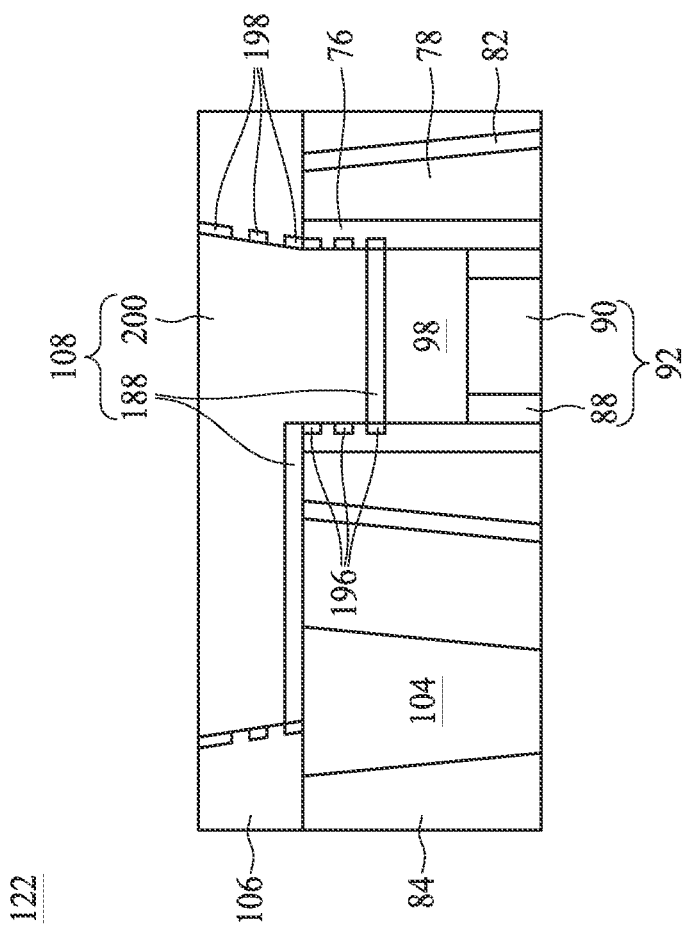
FIG. 54 is a cross-sectional view of a contact feature, in accordance with some embodiments.

FIG. 54 is a cross-sectional view of the contact feature 108 within the region 122 of FIG. 20B, in accordance with some embodiments. FIG. 54 is illustrated along the reference cross-section B-B illustrated in FIG. 1. The structure of FIG. 54 is similar to the structure of FIG. 53, with similar features being labeled by similar numerical references, and descriptions of the similar features are not repeated herein. In some embodiments, the structure of FIG. 54 may be formed in a similar manner as the structure of FIG. 53, and the description is not repeated herein. In contrast with the structure of FIG. 53, the structure of FIG. 54 comprises discontinuous liner layers 196 and 198 instead of the continuous liner layers 192 and 194.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Pat. No. 9,647,071, which is incorporated herein by reference in its entirety.

Embodiments may achieve advantages. By performing the surface modification (such as an oxidation process) and etch processes on sidewalls of contact openings as described herein, a selectivity loss of a selective metal deposition/growth process that forms contact features in the contact openings is reduced or avoided. Various embodiments discussed herein allow for selective bottom-up deposition/growth of contact features in contact openings to achieve low-resistance contact features, reducing or avoiding seam or void formation, increasing grain size of contact features, and improve yield.

In accordance with an embodiment, a method includes forming a dielectric layer over an epitaxial source/drain region. An opening is formed in the dielectric layer. The opening exposes a portion of the epitaxial source/drain region. A barrier layer is formed on a sidewall and a bottom of the opening. An oxidation process is performing on the sidewall and the bottom of the opening. The oxidation process transforms a portion of the barrier layer into an oxidized barrier layer and transforms a portion of the dielectric layer adjacent to the oxidized barrier layer into a liner layer. The oxidized barrier layer is removed. The opening is filled with a conductive material in a bottom-up manner. The conductive material is in physical contact with the liner layer. In an embodiment, the method further includes, before forming the barrier layer, forming a silicide layer on the bottom of the opening. In an embodiment, the method further includes, before performing the oxidation process, forming a metal-containing layer at an interface between the barrier layer and the dielectric layer. In an embodiment, the oxidation process further transforms the metal-containing layer into an oxidized metal-containing layer. In an embodiment, the method further includes, before filling the opening with the conductive material, removing the oxidized metal-containing layer to expose the liner layer. In an embodiment, the liner layer is a continuous layer. In an embodiment, the liner layer is a discontinuous layer.

In accordance with another embodiment, a method includes forming a dielectric layer over a conductive feature. An opening is etched in the dielectric layer. The opening exposes the conductive feature. The etching forms a residue on a sidewall of the opening. The residue includes a portion of the conductive feature. An oxidation process is performed on the sidewall and a bottom of the opening. The oxidation process transforms a portion of the conductive feature at the bottom of the opening into an oxidized layer, transforms the residue into an oxidized residue, and transforms a portion of the dielectric layer at the sidewall of the opening into a liner layer. The oxidized layer is removed to expose the conductive feature. The oxidized residue is removed to expose the liner layer. The opening is bottom-up filled with a conductive material. The conductive material is in physical contact with the liner layer. In an embodiment, removing the oxidized layer and removing the oxidized residue comprise performing a dry etch process. In an embodiment, a portion of the conductive material extends below a top surface of the conductive feature. In an embodiment, the conductive feature is a source/drain contact. In an embodiment, the conductive feature is a capping layer over a gate stack. In an embodiment, the liner layer is a continuous layer. In an embodiment, the liner layer is a discontinuous layer.

In accordance with yet another embodiment, a device includes a dielectric layer over an epitaxial source/drain region and a contact feature in the dielectric layer and electrically coupled to the epitaxial source/drain region. The contact feature includes a conductive material, and a barrier layer extending along and in physical contact with a bottom surface of the conductive material. The device further includes a liner layer extending along and in physical contact with a sidewall of the conductive material and a sidewall of the dielectric layer. In an embodiment, the liner layer is a continuous layer. In an embodiment, the liner layer includes discontinuous oxidized portions of the dielectric layer. In an embodiment, the device further includes a silicide layer between the barrier layer and the epitaxial source/drain region. In an embodiment, a portion of the conductive material extends below a topmost portion of the epitaxial source/drain region. In an embodiment, the conductive material is in physical contact with the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a dielectric layer over an epitaxial source/drain region;
   forming an opening in the dielectric layer, the opening exposing a portion of the epitaxial source/drain region;
   forming a barrier layer on a sidewall and a bottom of the opening;
   performing an oxidation process on the sidewall and the bottom of the opening, the oxidation process transforming a portion of the barrier layer into an oxidized barrier layer and transforming a portion of the dielectric layer adjacent to the oxidized barrier layer into a liner layer;
   removing the oxidized barrier layer; and
   filling the opening with a conductive material in a bottom-up manner, the conductive material being in physical contact with the liner layer.

2. The method of claim 1, further comprising, before forming the barrier layer, forming a silicide layer on the bottom of the opening.

3. The method of claim 1, further comprising, before performing the oxidation process, forming a metal-containing layer at an interface between the barrier layer and the dielectric layer.

4. The method of claim 3, wherein the oxidation process further transforms the metal-containing layer into an oxidized metal-containing layer.

5. The method of claim 4, further comprising, before filling the opening with the conductive material, removing the oxidized metal-containing layer to expose the liner layer.

6. The method of claim 1, wherein the liner layer is a continuous layer.

7. The method of claim 1, wherein the liner layer is a discontinuous layer.

8. A method comprising:
   forming a dielectric layer over a conductive feature;
   forming an opening in the dielectric layer, the opening exposing a portion of the conductive feature;
   forming a barrier layer on a sidewall and a bottom of the opening;
   transforming a first portion of the barrier layer into an oxidized barrier layer and transforming a portion of the dielectric layer into a liner layer;
   removing the oxidized barrier layer; and
   filling the opening with a conductive material.

9. The method of claim 8, wherein transforming is performed using an oxygen plasma process.

10. The method of claim 8, wherein forming the barrier layer comprises transforming a portion of the dielectric layer into a metal-containing layer.

11. The method of claim 8, wherein after removing the oxidized barrier layer, a second portion of the barrier layer remains over the conductive feature.

12. The method of claim 11, wherein filling the opening comprises forming the conductive material over the second portion of the barrier layer.

13. The method of claim 8, wherein the conductive material physically contacts the liner layer and the dielectric layer.

14. The method of claim 8, wherein the liner layer is a continuous layer.

15. A method comprising:
    forming a dielectric layer over a conductive feature; and forming a contact feature in the dielectric layer and electrically coupled to the conductive feature, wherein forming the contact feature comprises:
 forming a barrier layer on an upper surface of the conductive feature;
 recessing the barrier layer below an upper surface of the dielectric layer; and
 forming a liner layer extending along and in physical contact with a sidewall of the dielectric layer, the liner layer being an oxidized layer of the dielectric layer; and
 forming a conductive material over the barrier layer and the liner layer.

16. The method of claim 15, further comprising forming a metal-containing layer from a portion of the dielectric layer.

17. The method of claim 16, further comprising:
oxidizing the metal-containing layer to form an oxidized metal-containing layer; and
removing the oxidized metal-containing layer.

18. The method of claim 15, wherein the conductive material contacts the liner layer and the dielectric layer.

19. The method of claim 15, further comprising prior to forming the barrier layer, forming a silicide layer over the conductive feature.

20. The method of claim 15, wherein the barrier layer contacts the dielectric layer.

* * * * *